US009541945B2

(12) United States Patent
Taylor

(10) Patent No.: US 9,541,945 B2
(45) Date of Patent: Jan. 10, 2017

(54) THYRISTOR BASED OPTICAL AND GATE AND THYRISTOR-BASED ELECTRICAL AND GATE

(71) Applicants: Opel Solar, Inc., Storrs Mansfield, CT (US); The University of Connecticut, Farmington, CT (US)

(72) Inventor: Geoff W. Taylor, Mansfield, CT (US)

(73) Assignees: Opel Solar, Inc., Storrs Mansfield, CT (US); THE UNIVERSITY OF CONNECTICUT, Farmington, CT (US)

( * ) Notice: Subject to any disclaimer, the term of this patent is extended or adjusted under 35 U.S.C. 154(b) by 0 days.

(21) Appl. No.: 14/578,950

(22) Filed: Dec. 22, 2014

(65) Prior Publication Data
US 2016/0178988 A1   Jun. 23, 2016

(51) Int. Cl.
*G06E 1/00* (2006.01)
*G02F 3/00* (2006.01)
(Continued)

(52) U.S. Cl.
CPC . *G06E 1/00* (2013.01); *G02F 3/00* (2013.01); *G11C 13/04* (2013.01); *H03K 3/42* (2013.01); *H03K 19/14* (2013.01)

(58) Field of Classification Search
CPC ............. G02F 3/00; H03K 3/42; H03K 19/14; G11C 13/04
See application file for complete search history.

(56) References Cited

U.S. PATENT DOCUMENTS 5,355,243 A   10/1994 King
6,031,243 A    2/2000 Taylor
(Continued)

FOREIGN PATENT DOCUMENTS

WO   WO 02/071490   9/2002
WO   WO 2013/025964   2/2013

OTHER PUBLICATIONS

Charge-Pump Phase-Locked Loop—A Tutorial—Part 1, Jeffrey S. Pattavina, EE Times, Jun. 30, 2011. Integrated-Optics Directional Couplers for Optical Coherence Tomography (Chapter 4), D.V. Nguyen, Dissertation, UVA-DARE, 2013.
(Continued)

*Primary Examiner* — Jennifer L. Doak
(74) *Attorney, Agent, or Firm* — Sughrue Mion, PLLC

(57) ABSTRACT

An optical AND gate is provided that includes an optical thyristor configured to receive first and second digital optical signal inputs. The optical AND gate further includes control circuitry operably coupled to terminals of said optical thyristor. The control circuitry is configured to control switching operation of said optical thyristor in response to the ON/OFF states of the first and second digital optical signal inputs such that the optical thyristor produces a digital output signal that represents the AND function of the first and second digital optical signal inputs.

In another aspect, an AND gate is provided that includes a thyristor and control circuitry operably coupled to terminals of the thyristor. The control circuitry is configured to receive first and second digital electrical signal inputs and control switching operation of the thyristor in response to the levels of the first and second digital electrical signal inputs such that the thyristor produces a digital output signal that represents the AND function of the first and second digital electrical signal inputs.

12 Claims, 43 Drawing Sheets

(51) Int. Cl.
*G11C 13/04* (2006.01)
*H03K 3/42* (2006.01)
*H03K 19/14* (2006.01)

(56) References Cited

U.S. PATENT DOCUMENTS

| | | | |
|---|---|---|---|
| 6,479,844 B2 | 11/2002 | Taylor | |
| 6,841,795 B2 | 1/2005 | Taylor et al. | |
| 6,841,806 B1 | 1/2005 | Taylor et al. | |
| 6,849,866 B2 | 2/2005 | Taylor | |
| 6,853,014 B2 | 2/2005 | Taylor et al. | |
| 6,870,207 B2 | 3/2005 | Taylor | |
| 6,873,273 B2 | 3/2005 | Taylor et al. | |
| 6,954,473 B2 | 10/2005 | Dehmubed et al. | |
| 6,995,407 B2 | 2/2006 | Taylor et al. | |
| 7,332,752 B2 | 2/2008 | Taylor et al. | |
| 7,333,731 B2 | 2/2008 | Taylor et al. | |
| 9,209,815 B1* | 12/2015 | Taylor | H03L 7/06 |
| 2005/0018730 A1* | 1/2005 | Taylor | B82Y 20/00 372/50.1 |
| 2014/0050242 A1 | 2/2014 | Taylor | |

OTHER PUBLICATIONS

1 Gbit/s PSK Homodyne Transmission System Using Phase-Locked Semiconductor Lasers, J.M. Kahn, IEEE Photonics Technology Letters, vol. 1, No. 10, Oct. 1989.

GaAs-based long-wavelength InAs quantum dots on multi-step-graded InGaAs metamorphic buffer grown by molecular beam epitaxy, He Ji-Fang et al., Journal of Physics D: Applied Physics, J.Phyus. D: Appl.Phys. 44(2011) 335102 (5pp).

"Tunable Bragg reflectors on silicon-on-insulator rib waveguides", Ivano Giutoni et al., Oct. 12, 2009 / vol. 17, No. 21, Optics Express 18518-18524.

U.S. Appl. No. 08/949,504, Geoff W. Taylor, filed Oct. 19, 1997.

U.S. Appl. No. 09/710,217, Geoff W. Taylor, filed Nov. 11, 2000.

Hands, M. A., et al. "A case study for the implementation of a stochastic bit stream neuron; the choice between electrical and optical interconnects."Massively Parallel Processing Using Optical Interconnections, 1995., Proceedings of the Second International Conference on. IEEE, 1995.

K. Hara et al., 'Optical flip-flop based on parallel-connected AlGaAs/GaAs pnpn structures', In: Optics letters, Jul. 1, 1990, vol. 15, Issue 13, pp. 749-751.

International Search Report dated Apr. 15, 2016.

* cited by examiner

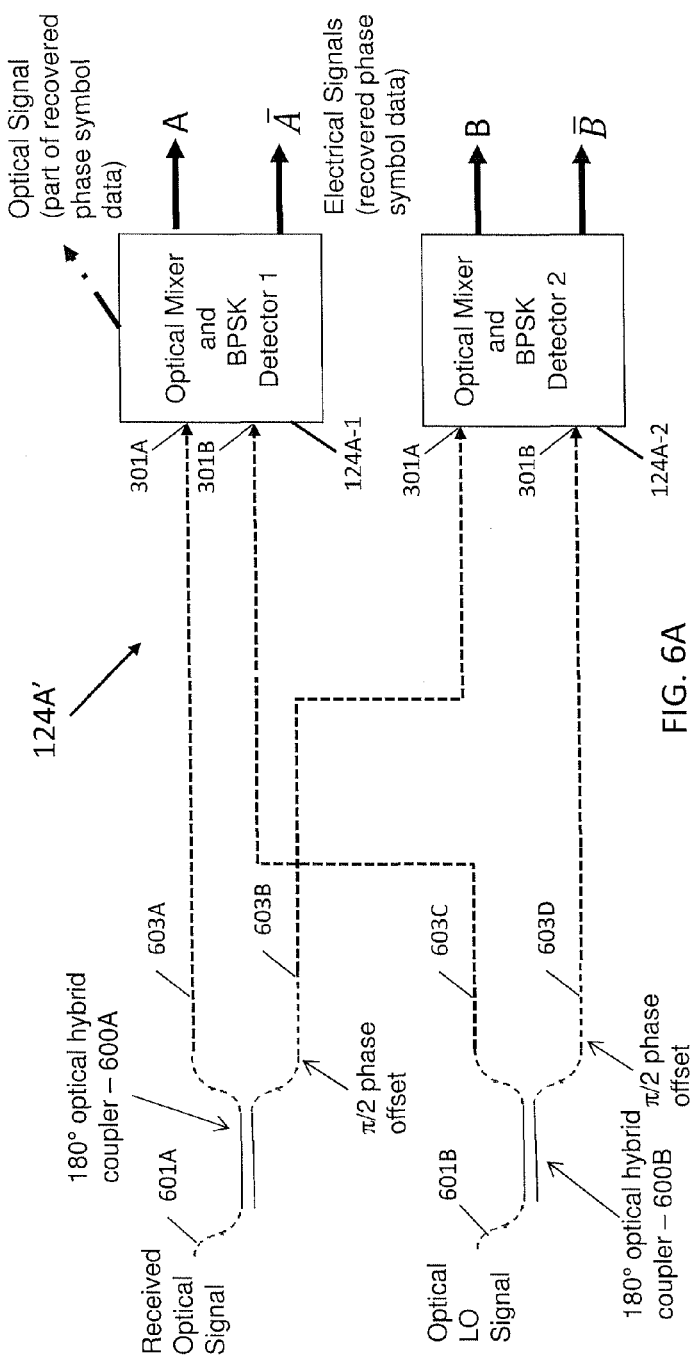
FIG. 6A
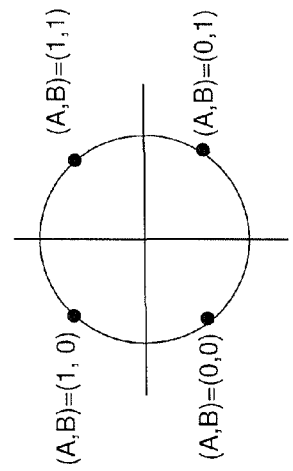
FIG. 6C
| $\varphi_s$ | A | B |
|---|---|---|
| π/4 | 1 | 1 |
| 3π/4 | 1 | 0 |
| 5π/4 | 0 | 0 |
| 7π/4 | 0 | 1 |
FIG. 6B

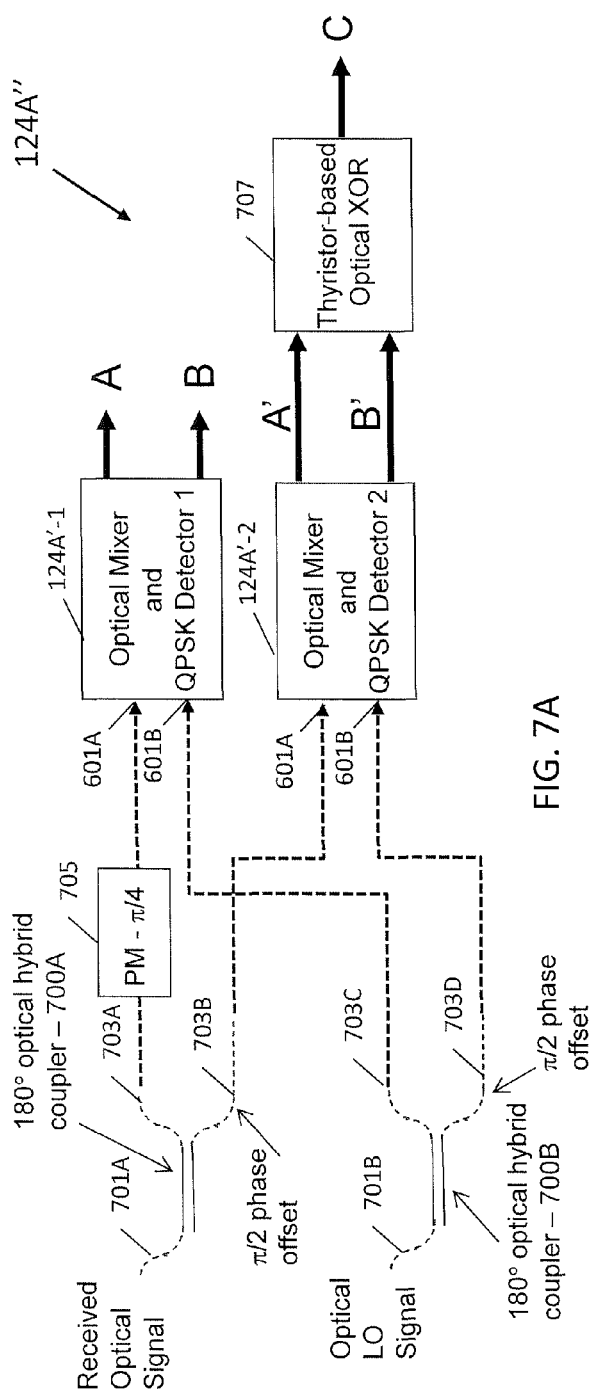
FIG. 7A
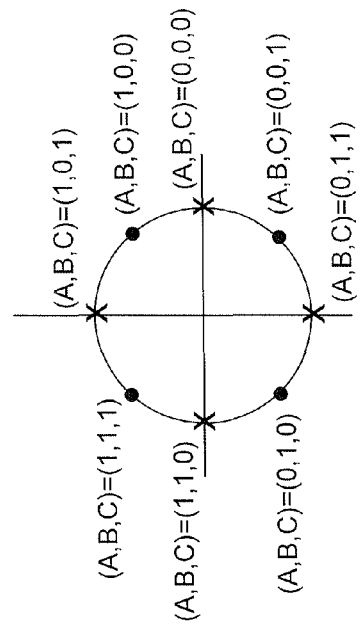
FIG. 7C
| $\varphi_s$ | A | B | A' | B' | C |
|---|---|---|---|---|---|
| 0 | 0 | 0 | 0 | 0 | 0 |
| π/4 | 1 | 0 | 0 | 0 | 0 |
| π/2 | 1 | 0 | 1 | 0 | 1 |
| 3π/4 | 1 | 1 | 1 | 0 | 1 |
| π | 1 | 1 | 1 | 1 | 0 |
| 5π/4 | 0 | 1 | 1 | 1 | 1 |
| 3π/2 | 0 | 1 | 0 | 1 | 0 |
| 7π/4 | 0 | 0 | 0 | 1 | 1 |
FIG. 7B

| $\varphi_s$ | A | B | A' | B' | C | a | b | c | a' | b' | c' | D |
|---|---|---|---|---|---|---|---|---|---|---|---|---|
| 0 | 0 | 1 | 0 | 1 | 1 | 0 | 1 | 1 | 0 | 1 | 1 | 0 |
| π/8 | 0 | 0 | 0 | 0 | 1 | 0 | 1 | 1 | 0 | 1 | 1 | 0 |
| π/4 | 0 | 0 | 0 | 0 | 1 | 0 | 0 | 0 | 0 | 1 | 1 | 1 |
| 3π/8 | 0 | 0 | 0 | 0 | 0 | 0 | 0 | 0 | 0 | 1 | 1 | 1 |
| π/2 | 0 | 0 | 0 | 0 | 0 | 0 | 0 | 0 | 0 | 0 | 0 | 0 |
| 5π/8 | 1 | 0 | 0 | 0 | 0 | 0 | 0 | 0 | 0 | 0 | 0 | 0 |
| 3π/4 | 1 | 0 | 0 | 0 | 0 | 1 | 0 | 1 | 0 | 0 | 0 | 1 |
| 7π/8 | 1 | 0 | 1 | 0 | 1 | 1 | 0 | 1 | 0 | 0 | 0 | 1 |
| π | 1 | 0 | 1 | 0 | 1 | 1 | 1 | 1 | 1 | 0 | 1 | 0 |
| 9π/8 | 1 | 1 | 1 | 0 | 1 | 1 | 1 | 1 | 1 | 0 | 1 | 0 |
| 5π/4 | 1 | 1 | 1 | 1 | 1 | 1 | 1 | 1 | 1 | 1 | 1 | 1 |
| 11π/8 | 1 | 1 | 1 | 1 | 0 | 1 | 1 | 1 | 1 | 1 | 1 | 1 |
| 3π/2 | 1 | 1 | 1 | 1 | 0 | 1 | 1 | 0 | 1 | 0 | 0 | 0 |
| 13π/8 | 0 | 1 | 1 | 1 | 0 | 0 | 1 | 0 | 1 | 0 | 0 | 0 |
| 7π/4 | 0 | 1 | 1 | 1 | 0 | 0 | 1 | 1 | 1 | 1 | 0 | 1 |
| 15π/8 | 0 | 1 | 0 | 1 | 1 | 0 | 1 | 1 | 1 | 1 | 0 | 1 |

| $\Phi_s$ (T) | A1 | B1 | A2 | B2 |
|---|---|---|---|---|
| 0 (T1) | 1 | 0 | | |
| π/4 (T2) | | | 1 | 1 |
| π/2 (T1) | 1 | 1 | | |
| 3π/4 (T2) | | | 0 | 1 |
| π (T1) | 0 | 1 | | |
| 5π/4 (T2) | | | 0 | 0 |
| 3π/2(T1) | 0 | 0 | | |
| 7π/4(T2) | | | 1 | 0 |

| $\Phi_s$ (T) | A3 | B3 | A4 | B4 |
|---|---|---|---|---|
| 0 (T3) | 1 | 0 | | |
| π/4 (T4) | | | 1 | 1 |
| π/2 (T3) | 1 | 1 | | |
| 3π/4 (T4) | | | 0 | 1 |
| π (T3) | 0 | 1 | | |
| 5π/4 (T4) | | | 0 | 0 |
| 3π/2(T3) | 0 | 0 | | |
| 7π/4(T4) | | | 1 | 0 |

FIG. 12B

| Reset (input) | $\overline{Reset}$ (input) | Recovered Optical Signal $D_A$ (input) | $Q_A$ (output) | $\overline{Q_A}$ (output) |
|---|---|---|---|---|
| 1 | 0 | x | 0 | 1 |
| 0 | 1 | 0 | 0 | 1 |
| 0 | 1 | 1 | 1 | 0 |

FIG. 12C

| Reset (input) | $\overline{Reset}$ (input) | Optical Clock Signal $D_B$ (input) | $Q_B$ (output) | $\overline{Q_B}$ (output) |
|---|---|---|---|---|
| 1 | 0 | x | 0 | 1 |
| 0 | 1 | 0 | 0 | 1 |
| 0 | 1 | 1 | 1 | 0 |

FIG. 12D

| $Q_A$ (input) | $Q_B$ (input) | Reset (output) | $\overline{Reset}$ (output) |
|---|---|---|---|
| 0 | 0 | 0 | 1 |
| 0 | 1 | 0 | 1 |
| 1 | 0 | 0 | 1 |
| 1 | 1 | 1 | 0 |

| P-type Ohmic Contact 1721 |
| P-type layer(s) 1719 |
| Undoped Spacer Layer 1717 |
| N-type Modulation Doped QW Structure 1715 |
| Spacer Layer(s) 1713 |
| P-type Modulation Doped QW Structure 1711 |
| Undoped spacer layer 1709 |
| N-type layer(s) 1707 |
| N-type Ohmic Contact 1705 |
| Optional Bottom DBR Mirror 1703 |
| Substrate 1701 |

FIG. 17

THYRISTOR BASED OPTICAL AND GATE AND THYRISTOR-BASED ELECTRICAL AND GATE

BACKGROUND

1. Field

The present disclosure relates to optical communication systems and, in particular, to receivers of optical communication signals as well as optical and electro-optical components thereof.

2. State of the Art

Phase-shift keying (PSK) is a digital modulation scheme used in optical communication that conveys data by changing, or modulating, the phase of a reference optical signal (the optical carrier wave). PSK uses a finite number of phases, each assigned a unique pattern of binary digits. Usually, each phase encodes an equal number of bits. Each pattern of bits forms the symbol that is represented by the particular phase. The demodulator (or receiver), which is designed specifically for the symbol-set used by the modulator (or transmitter), determines the phase of the received optical signal and maps it back to the symbol it represents, thus recovering the original data. One form of demodulation requires that the receiver be able to compare the phase of the received optical signal to an optical local oscillating signal whose phase tracks the phase of the reference optical signal. Such a receiver is commonly referred to as a coherent PSK optical receiver. The coherent PSK optical receiver typically employs an optical phase lock loop to synchronize the phase of the optical local oscillating signal to the phase of the reference optical signal used by the transmitter.

Constellation diagrams are commonly used to represent PSK schemes. The constellation diagram shows points in the complex plane where, in this context, the real and imaginary axes are termed the in-phase and quadrature axes respectively due to their 90° separation. Such a representation on perpendicular axes lends itself to straightforward implementation. Specifically, the constellation points are typically selected with uniform angular spacing around a circle. This gives maximum phase-separation between adjacent points and thus the best immunity to corruption. They are positioned on a circle so that they can all be transmitted with the same energy. In this way, the moduli of the complex numbers they represent will be the same and the amplitude of the phase-modulated carrier wave does not change.

Two common PSK schemes are binary phase-shift keying (BPSK or 2-PSK) which uses two phases separated by 180 degrees, and quadrature phase-shift keying (QPSK or 4-PSK) or which uses four phases separated by 90 degrees, although any number of phases may be used. Since the data to be conveyed are usually binary (or digital) in nature, the PSK scheme is usually designed with the number of constellation points being a power of 2. The higher-order PSK schemes are typically labeled with the number of phases used for the respective scheme. Thus, a PSK scheme employing 8 phases separated by 45 degrees is commonly referred to as 8-PSK, a PSK scheme employing 16 phases separated by 22.5 degrees is commonly referred to 16-PSK, and a generic PSK employing M phases separated by (360/M) degrees is commonly referred to as M-PSK or M-ary PSK.

For the coherent BPSK optical receiver, the phase-aligned local oscillating signal can be split and mixed in the optical domain by a network of 3-dB fiber couplers for supply to corresponding photodetectors as shown in FIG. 1. This configuration converts the received optical signal to baseband electrical signals that represents the in-phase component and quadrature component of the received optical signal. These two component signals can be processed in the electrical domain by a signal processor in order to determine the phase of the received optical signal and map it back to the symbol it represents, thus recovering the original data.

SUMMARY

The present disclosure relates to an optical AND gate that includes an optical thyristor configured to receive first and second digital optical signal inputs. The optical AND gate further includes control circuitry operably coupled to terminals of the optical thyristor. The control circuitry is configured to control switching operation of the optical thyristor in response to the ON/OFF states of the first and second digital optical signal inputs such that the optical thyristor produces a digital output signal that represents the AND function of the first and second digital optical signal inputs.

In one embodiment, the optical thyristor can be configured to produce a digital electrical signal that represents the AND function of the first and second digital optical signal inputs.

In another embodiment, the optical thyristor can be configured to produce a digital optical signal that represents the AND function of the first and second digital optical signal inputs.

In one embodiment, the optical thyristor can be defined by an epitaxial layer structure that includes a bottom n-type cathode region, an intermediate p-type region formed above the bottom n-type region, an intermediate n-type region formed above the intermediate p-type region, and a top p-type anode region formed above the intermediate n-type region. The optical thyristor can include an anode terminal electrically coupled to the top p-type anode region, an n-type injector terminal electrically coupled to the intermediate n-type region, a p-type injector terminal electrically coupled to the intermediate p-type region, and a cathode terminal electrically coupled to the n-type cathode region. The control circuitry can include a first field-effect transistor whose source-drain current path is electrically coupled between a positive voltage supply and the n-type injector terminal of the optical thyristor. The first field-effect transistor can be a p-channel HFET transistor having a gate terminal and source terminal that are coupled together to the positive voltage supply. The control circuitry can further include a second field-effect transistor whose source-drain current path is electrically coupled between a negative or ground voltage supply and the p-type injector terminal of said optical thyristor. The second field-effect transistor can be an n-channel HFET transistor having a gate terminal and source terminal that are coupled together to the negative or ground voltage supply.

In one embodiment, the intermediate n-type and p-type regions of the epitaxial layer structure of the optical thyristor can include an n-type modulation doped QW structure and a p-type modulation doped QW structure, respectively. The control circuitry can include at last one field effect transistor that includes an n-type QW channel formed by the n-type modulation doped QW structure of the epitaxial layer structure. The epitaxial layer structure can be formed from group III-V materials.

In another aspect, the present disclosure relates to an AND gate that includes a thyristor and control circuitry operably coupled to terminals of the thyristor. The control circuitry can be configured to receive first and second digital electrical signal inputs and control switching operation of the thyristor in response to the levels of the first and second digital electrical signal inputs such that the thyristor produces a digital output signal that represents the AND function of the first and second digital electrical signal inputs.

In one embodiment, the thyristor can be configured to produce a digital electrical signal that represents the AND function of the first and second digital optical signal inputs.

In another embodiment, the thyristor can be configured to produce a digital optical signal that represents the AND function of the first and second digital optical signal inputs.

In one embodiment, the thyristor can be defined by an epitaxial layer structure that includes a bottom n-type cathode region, an intermediate p-type region formed above the bottom n-type region, an intermediate n-type region formed above the intermediate p-type region, and a top p-type anode region formed above the intermediate n-type region. The thyristor can include an anode terminal electrically coupled to the top p-type anode region, an n-type injector terminal electrically coupled to the intermediate n-type region, a p-type injector terminal electrically coupled to the intermediate p-type region, and a cathode terminal electrically coupled to the n-type cathode region. The control circuitry can include a first pair of field-effect transistors whose source-drain current paths are electrically coupled between a positive voltage supply and a negative or ground voltage supply with a first intermediate node coupled to the n-type injector terminal of the thyristor. The first digital electrical signal input can be supplied to the first pair of field-effect transistors in order to control switching operation of the thyristor. The control circuitry can further include a second pair of field-effect transistors whose source-drain current paths are electrically coupled between a positive voltage supply and a negative or ground voltage supply with a second intermediate node coupled to the p-type injector terminal of the thyristor. The second digital electrical signal input can be supplied to the second pair of field-effect transistors in order to control switching operation of the thyristor. The first pair of field-effect transistors can include a p-channel HFET transistor whose source-drain current path is electrically coupled between the positive voltage supply and the first intermediate node (wherein the p-channel HFET transistor has a gate terminal that receives the first digital electrical signal single input) as well as an re-channel HFET transistor whose source-drain current path is electrically coupled between the first intermediate node and the negative or ground power supply (wherein the re-channel HFET transistor has a gate terminal that receives the first digital electrical signal single input). The second pair of field-effect transistors can include a p-channel HFET transistor whose source-drain current path is electrically coupled between the positive voltage supply and the second intermediate node (wherein the p-channel HFET transistor has a gate terminal that receives the second digital electrical signal single input) was well as an n-channel HFET transistor whose source-drain current path is electrically coupled between the second intermediate node and the negative or ground power supply (wherein the n-channel HFET transistor has a gate terminal that receives the second digital electrical signal single input).

In one embodiment, the intermediate n-type and p-type regions of the epitaxial layer structure of the thyristor can include an n-type modulation doped QW structure and a p-type modulation doped QW structure, respectively. The control circuitry can include at last one field effect transistor that includes an n-type QW channel formed by the n-type modulation doped QW structure of the epitaxial layer structure. The epitaxial layer structure can be formed from group III-V materials.

BRIEF DESCRIPTION OF THE DRAWINGS

FIG. 6A is a schematic diagram of an optical mixer and thyristor-based optical QPSK detector, suitable for use in the coherent PSK optical receiver of FIG. 5 that receives optical QPSK-modulated signals.

FIG. 6B is a table of an exemplary mapping of phases to four symbols represented by the digital output signals produced by the optical QPSK detector of FIG. 6A.

FIG. 6C is a constellation diagram of the exemplary mapping of phases to symbols as shown in the table of FIG. 6B.

FIG. 7A is a schematic diagram of an optical mixer and thyristor-based optical 8-PSK detector, suitable for use in the coherent PSK optical receiver of FIG. 5 that receives optical 8-PSK-modulated signals.

FIG. 7B is a table of an exemplary mapping of phases to eight symbols represented by the digital output signals produced by the optical 8-PSK detector of FIG. 7A.

FIG. 7C is a constellation diagram of the exemplary mapping of phases to symbols as shown in the table of FIG. 7B.

FIG. 12B is a table illustrating the logic function of the optical flip-flop A of FIG. 12A.

FIG. 12C is a table illustrating the logic function of the optical flip-flop B of FIG. 12A.

FIG. 12D is a table illustrating the logic function of the AND gate of FIG. 12A.

FIG. 17 is a schematic illustration of an exemplary epitaxial layer structure that can be used to realize the electrical devices, optoelectronic devices and optical devices of the various circuit arrangements described herein.

DETAILED DESCRIPTION OF THE PREFERRED EMBODIMENTS

Figure 1:
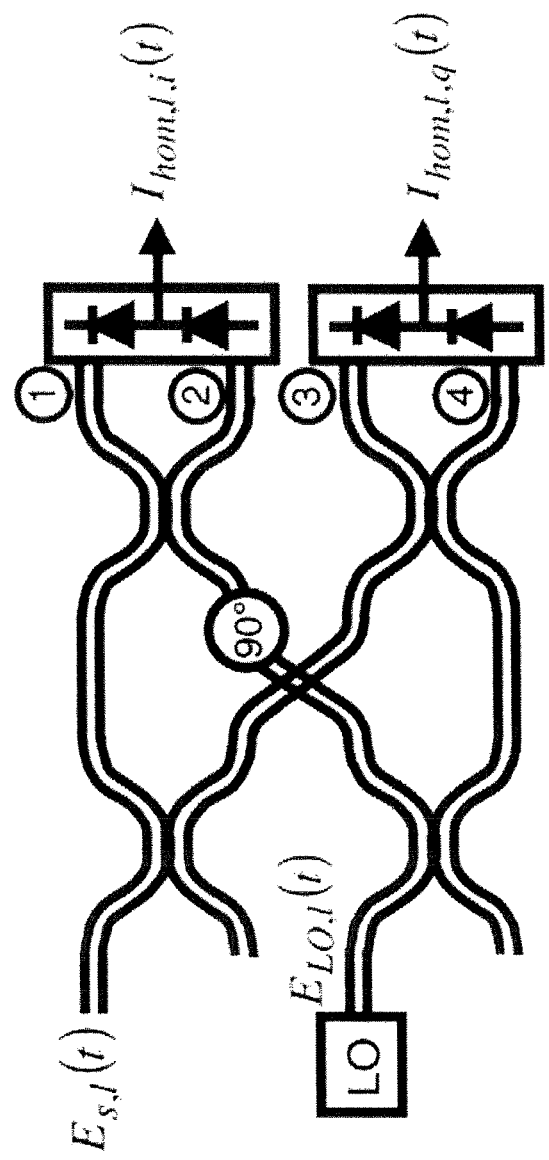
FIG. 1 is a schematic diagram of a prior art coherent BPSK optical receiver.
Figure 2A:
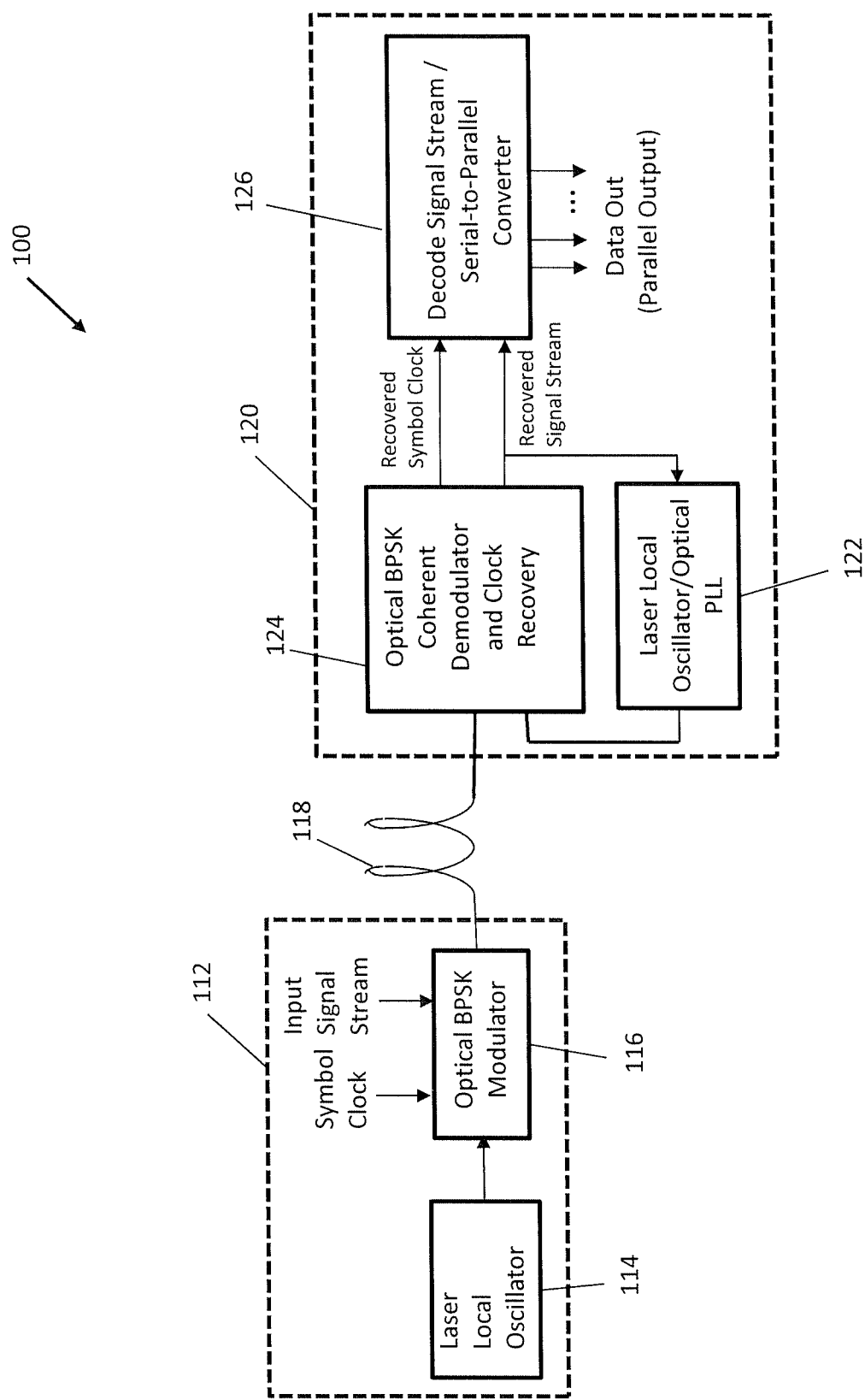
FIG. 2A is a schematic block diagram of coherent BPSK optical communication system that can embody aspects of the present disclosure.

FIG. 2A shows an optical communication system 100 employing optical binary phase shift keying (BPSK) signals. The system 100 includes a transmitter 112 having a laser local oscillator 114 that generates an optical carrier signal at a predetermined wavelength. The intensity of the optical carrier signal output by the laser local oscillator 114 oscillates at a predefined frequency. The laser local oscillator 114 can be a distributed feedback (DFB) laser or other suitable laser emitter. The optical carrier signal output by the laser local oscillator 114 is supplied to an optical BPSK modulator 116 that modulates the phase of the optical carrier signal according to a supplied signal stream of binary bit values and a symbol clock. The symbol clock defines the timing of the boundaries for the individual bit values of the signal stream. For a binary bit value of "1" in the signal stream, the optical BPSK modulator 116 produces a phase-shifted optical carrier signal that has a predefined corresponding phase offset (such as 0 degrees phase offset) relative to the carrier optical signal output by the laser local oscillator 114. For a binary bit value of "0" in the signal stream, the optical BPSK modulator 116 produces a phase-shifted optical carrier signal that has a predefined corresponding phase offset (such as a 180 degree or π phase offset) relative to the carrier optical signal output by the laser local oscillator 114. The optical BPSK modulator 116 can function to incorporate time delay into the optical signal path corresponding to the required phase change (as $\Delta\phi=\omega\Delta t$). This can be realized by a ring resonator where the effective optical velocity through the ring resonator is controlled in some manner (such as in response to one or more electrical signals supplied to the ring resonator). The phase-shifted optical carrier signal produced by the optical BPSK modulator 116 is carried by a communication medium 118 (such as an optical fiber) to a receiver 120.

The receiver 120 receives the phase-shifted optical carrier signal carried over the communication medium 118. The receiver 120 includes a laser local oscillator that is part of an optical phase lock loop (OPPL) 122 that functions to recover the optical carrier signal from the received optical phase-shifted carrier signal. In this manner, the laser local oscillator of the OPPL 122 of the receiver 120 generates an optical signal (referred to as an "optical local oscillating signal") that oscillates at a frequency and phase that matches the optical carrier signal output by the laser local oscillator 114 of the transmitter 112. The OPPL 122 estimates and compensates for differences in oscillation frequency between the receiver's laser local oscillator and the optical carrier signal of the transmitter 112. It also aligns the phase of the receiver's laser local oscillator to the phase of the optical carrier signal of the transmitter 112. The optical local oscillating signal generated by the OPPL 122 along with the received optical phase-shifted carrier signal are processed by an optical BPSK coherent demodulator 124 to identify the phase offset of the received optical phased-shifted carrier signal relative to the optical local oscillating signal. This is a form of coherent homodyne detection of the phase information carried in the received phased-shifted optical carrier signal. The optical BPSK coherent demodulator 124 generates an electrical signal that encodes the binary bit values corresponding to the phase offset information of the received phased-shifted optical carrier signal. The correspondence between the phase offset information and the binary bit values is dictated by the BPSK modulation scheme employed by the optical BPSK modulator 116 of the transmitter 112. In this manner, the optical BPSK coherent demodulator 124 recovers the signal stream of binary bit values carried by the received phase-shifted optical carrier signal. The optical BPSK coherent demodulator 124 also operates to generate an electrical clock signal (timing information) corresponding to the symbol clock of the transmitter 112. The recovered signal stream and the clock signal are supplied to circuitry 126 that decodes the signal stream (if necessary) and performs serial-to-parallel data conversion. The parallel data (typically, byte-sizes chunks) can be output to a data processing circuit as needed.

Figure 2B:
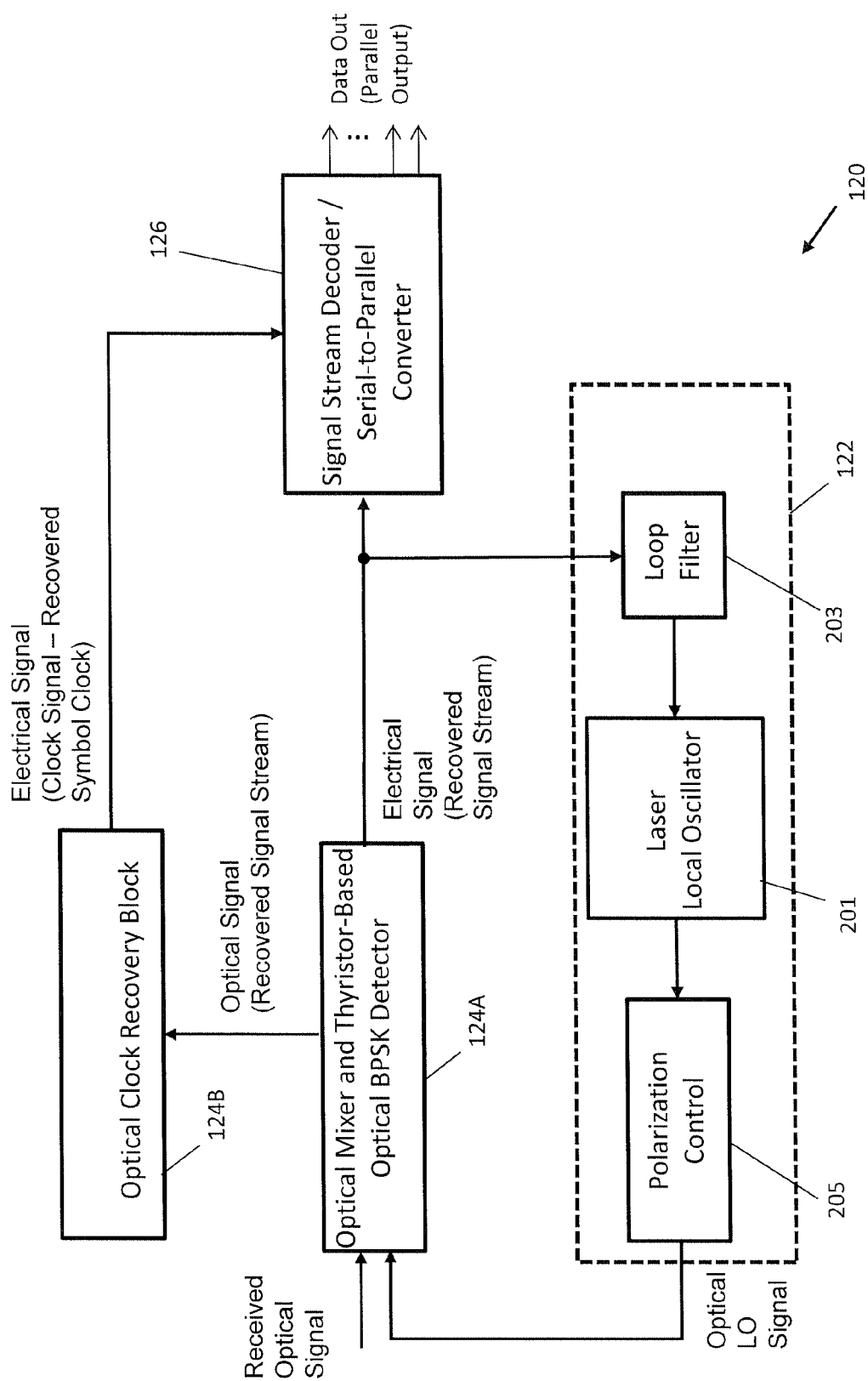
FIG. 2B is a schematic block diagram of an illustrative embodiment of coherent BPSK optical receiver according to the present disclosure.

FIG. 2B is a block diagram illustrating an embodiment of the receiver 120 of FIG. 2A, which includes an OPPL 122, an optical mixer and thyristor-based optical BPSK detector 124A, an optical clock recover block 124B, and signal decode circuitry 126. The OPPL 122 includes a laser local oscillator 201 and a loop filter 203. The loop filter 203 functions to estimate and compensate for differences in oscillation frequency between the optical local oscillating signal generated by the laser local oscillator 201 and the optical carrier signal of the transmitter 112. The loop filter 203 also functions to align the phase of the optical local oscillating signal to the phase of the optical carrier signal of the transmitter 112. The output of the laser local oscillator is supplied to a polarization control module 205 that fixes the polarization state of the optical local oscillating signal to match the polarization of the received optical signal. This may be necessary as the laser local oscillator 201 may produce an optical polarization state that differs from the received optical signal.

The optical mixer and thyristor-based optical BPSK detector 124A is configured to identify the phase offset of the received optical phased-shifted carrier signal relative to the optical local oscillating signal. This is form of coherent homodyne detection of the phase information carried in the received phased-shifted optical carrier signal. The optical mixer and thyristor-based optical BPSK detector 124A generates an electrical signal that encodes the binary bit values corresponding to the phase offset information of the received phased-shifted optical carrier signal. The correspondence between the phase offset information and the binary bit values is dictated by the BPSK modulation scheme employed by the optical BPSK modulator 116 of the transmitter 112. In this manner, the optical mixer and thyristor-based optical BPSK detector 124A recovers the signal stream of binary bit values carried by the received phase-shifted optical carrier signal.

The optical clock recovery block 124B operates to generate an electrical clock signal whose ON/OFF transitions are synchronized to the symbol clock of the transmitter. This symbol clock is embedded in the optical signal generated by the optical mixer and thyristor-based optical BPSK detector 124A, which represents the recovered signal stream of binary bit values carried by the received phase-shifted optical carrier signal and detected by the optical mixer and thyristor-based optical BPSK detector 124A.

The signal decode circuitry 126 utilizes the electrical clock signal (recovered symbol clock) generated by the clock recovery block 124B to sample the pulses of the electrical signal generated by the optical mixer and thyristor-based optical BPSK detector 124A. This electrical signal represents the recovered signal stream of binary bit values carried by the received phase-shifted optical carrier signal and detected by the optical mixer and thyristor-based optical BPSK detector 124A. This sampling is performed at the timing that corresponds recovered symbol clock and thus is aligned to the binary bit values carried by the received phase-shifted optical carrier signal. The signal decode circuitry 126 also performs signal decoding operations that map each recovered phase sample back to the binary symbol it represents and thus recovers the original data.

Figure 3A:
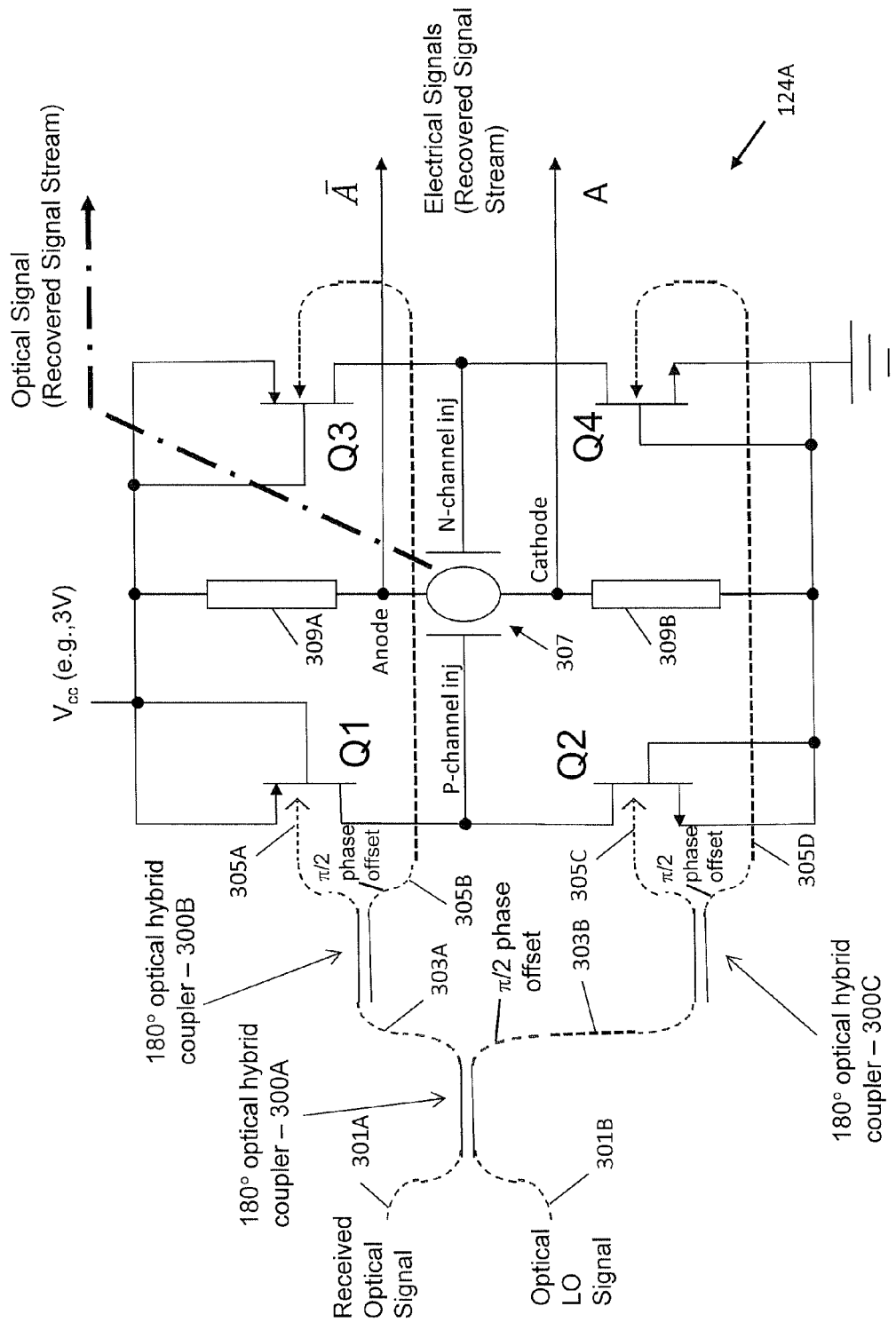
FIG. 3A is a schematic circuit diagram of the optical mixer and thyristor-based optical BPSK detector of FIG. 2B.

An embodiment of the optical mixer and thyristor-based optical BPSK detector 124A is shown in FIG. 3A. It employs a network of three 180-degree optical hybrid couplers 300A, 300B, 300C for optical mixing of the received phase-shifted carrier signal and the optical local oscillating signal output by the OPPL 122.

Each 180-degree optical hybrid coupler includes two input waveguides (In0/In1) and two output waveguides (Out0/Out1). The two input waveguides In0, In1 receive two separate input optical signals S0 and S1. The 180-degree optical hybrid coupler mixes the two input optical signals S0 and S1 to produce two output signals that propagate out from the Out0 and Out1 waveguides where the power of the two input optical signals S0, S1 is split evenly (50:50 split for each input signal) in each one of two output signals. Specifically, the intensity I0 of the optical signal propagating out from the output waveguide Out0 is given as:

$$I0 = E_{S1}^2 \cos^2(\kappa L_{\mathit{eff}}) + E_{S0}^2 \sin^2(\kappa L_{\mathit{eff}}) + E_{S1}E_{S0}\sin(2\kappa L_{\mathit{eff}})\sin\phi \quad (1)$$

where $E_{S1}$ is the field amplitude of the input optical signal S1 supplied to the In1 input waveguide, $E_{S0}$ is the field amplitude of the input optical signal S0 supplied to the In0 input waveguide, $\kappa$ and $L_{\mathit{eff}}$ is the coupling constant and the effective coupling length of the 180-degree optical hybrid coupler, and $\phi$ is the phase difference in the optical signals produced in the Out0 and Out1 output waveguides.

Similarly, the intensity I1 of the optical signal propagating out from the output waveguide Out2 is given as:

$$I1 = E_{S1}^2 \sin^2(\kappa L_{\mathit{eff}}) + E_{S0}^2 \cos^2(\kappa L_{\mathit{eff}}) + E_{S1}E_{S0}\sin(2\kappa L_{\mathit{eff}})\sin\phi. \quad (2)$$

In the case of the 50:50 split ratio, $\kappa L_{\mathit{eff}}$ is $\pi/4$ and Eqn. (1) and Eqn. (2) becomes:

$$I0 = \tfrac{1}{2}E_{S1}^2 + \tfrac{1}{2}E_{S0}^2 + E_{S1}E_{S0}\sin\phi, \text{ and} \quad (3)$$

$$I1 = \tfrac{1}{2}E_{S1}^2 + \tfrac{1}{2}E_{S0}^2 - E_{S1}E_{S0}\sin\phi. \quad (4)$$

These equations show that the maximum intensity of the two output signals have a phase difference of 180 degrees or $\pi$ radians. Moreover, there is a phase delay (lag) of 90 degrees of $\pi/2$ radians with respect to the S0 optical signal component that is part of the output signal propagating from the output waveguide Out1 relative to the S0 optical signal component that is part of the output signal propagating from the output waveguide Out0.

As shown in FIG. 3A, the three 180-degree optical hybrid couplers (300A, 300B, 300C) provide mixing of the received phase-shifted optical carrier signal and the optical LO signal output from the OPPL 122. Two waveguides 301A, 301B supply the received phased-shifted optical carrier signal and the optical LO signal to the In0 and the In1 input waveguides, respectively, of the first 180-degree optical hybrid coupler 300A. In this configuration, the first 180-degree optical hybrid coupler 300A mixes the received phase-shifted optical carrier signal and the optical LO signal to produce two output signals that propagate out from the Out0 and Out1 waveguides of the 180-degree optical hybrid coupler 300A. The intensity of the two input optical signals is split evenly (50:50 split) in each one of two output signals with the maximum intensity of the two output signals having a phase difference of 180 degrees Or radians).

A waveguide 303A supplies the output signal from the Out0 output waveguide of the 180-degree optical hybrid coupler 300A to the In0 input waveguide of the 180-degree optical hybrid coupler 300B. In this configuration, the 180-degree optical hybrid coupler 300B produces two output signals that propagate out from the Out0 and the Out1 output waveguides of the 180-degree optical hybrid coupler 300B. The intensity of the input signal is split evenly (50:50 split) in each one of two output signals with the maximum intensity of the two output signals having a phase difference of 180 degrees ($\pi$ radians).

A waveguide 303B supplies the output signal output from the Out1 output waveguide of the 180-degree optical hybrid coupler 300A to the In0 input waveguide of 180-degree optical hybrid coupler 300C. In this configuration, the 180-degree optical hybrid coupler 300C produces two output signals that propagate out from the Out0 and Out1 output waveguides of the 180-degree hybrid coupler 300C. The intensity of the input signal is split evenly (50:50 split) in each one of two output signals with the maximum intensity of the two output signals having a phase difference of 180 degrees Or radians).

Waveguides 305A, 305B, 305C, 305D supply the optical signals output from the Out0 and Out1 output waveguides of the 180-degree hybrid coupler 300B as well as the optical signals output from the Out0 and Out1 output waveguides of the 180-degree hybrid coupler 300C to corresponding phototransistors Q1, Q2, Q3, Q4 of the thyristor-based optical phase detector as described below.

The thyristor-based optical phase detector includes a four terminal vertical thyristor (N region-P region-N region-P region) 307 with a split load. A first load element 309A is coupled between the positive voltage supply ($V_{cc}$) and the anode terminal of the thyristor 307. A second load element 309B is coupled between the cathode terminal of the thyristor 307 and the negative voltage supply (ground). The thyristor 307 also has a p-channel injector terminal and an n-channel injector terminal.

A p-channel HFET phototransistor Q1 and an n-channel HFET phototransistor Q2 are coupled in series between the positive voltage supply ($V_{cc}$) and the negative voltage supply (ground). The p-channel HFET phototransistor Q1 has a source and gate terminal both connected to the positive voltage supply ($V_{cc}$). The n-channel HFET phototransistor Q2 has a source and gate terminal both connected to the negative voltage supply (ground). The drain of the p-channel HFET phototransistor Q1 and the drain of the n-channel HFET phototransistor Q2 are coupled together and to the p-channel injector terminal of the thyristor 307.

A p-channel HFET phototransistor Q3 and an n-channel HFET phototransistor Q4 are coupled in series between the positive voltage supply ($V_{cc}$) and the negative voltage supply (ground). The p-channel HFET phototransistor Q3 has a source and gate terminal both connected to the positive voltage supply ($V_{cc}$). The n-channel HFET phototransistor Q4 has a source and gate terminal both connected to the negative voltage supply (ground). The drain of the p-channel HFET phototransistor Q3 and the drain of the n-channel HFET phototransistor Q4 are coupled together and to the n-channel injector terminal of the thyristor 307.

The optical signal output from the Out0 output waveguide of the 180-degree optical hybrid coupler 300B is guided into the waveguide region of the p-channel HFET phototransistor Q1 and the optical signal output from the Out1 output waveguide of the 180-degree optical hybrid coupler is guided into the waveguide region of the p-channel HFET phototransistor Q3. The optical signal output from the Out0 output waveguide of the 180-degree optical hybrid coupler 300C is guided into the waveguide region of the n-channel HFET phototransistor Q2 and the optical signal output from the Out1 output waveguide of the 180-degree optical hybrid coupler 300C is guided into the waveguide region of the n-channel HFET phototransistor Q4.

In this configuration, the phase of the optical carrier signal component that is part of the output signal propagating from the Out0 output waveguide of the 180-degree optical hybrid coupler 300B (and supplied to the waveguide region of the p-channel HFET phototransistor Q1) is aligned (lag near 0 degrees or radians) to the phase of the received phase-shifted optical carrier signal. The optical carrier signal component that is part of the output signal propagating from the Out1 output waveguide of the 180-degree optical hybrid coupler 300B (and supplied to the waveguide region of the p-channel HFET phototransistor Q3) lags in phase by 90 degrees ($\pi/2$ radians) the phase of the received phase-shifted optical carrier signal. The phase of the optical carrier signal component that is part of the output signal propagating from the Out0 output waveguide of the 180-degree optical hybrid coupler 300C (and supplied to the waveguide region of the n-channel HFET phototransistor Q2) lags in phase by 90 degrees ($\pi/2$ radians) the phase of the received phase-shifted optical carrier signal. The phase of the optical carrier signal component that is part of the output signal propagating from the Out1 output waveguide of the 180-degree optical hybrid coupler 300C (and supplied to the waveguide region of the n-channel HFET phototransistor Q4) lags in phase by 180 degrees Or radians) the phase of the received phase-shifted optical carrier signal.

Furthermore, in this configuration, the p-channel HFET phototransistor Q1 and the n-channel HFET phototransistor Q4 are activated and operate as turn-n phototransistors for the thyristor 307 when the phase of the received phase-shifted optical carrier signal corresponds to a first predefined phase offset (such as 0 degrees or radians). When activated, the p-channel HFET phototransistor Q1 supplies hole current to the p-channel injector and the n-channel HFET phototransistor supplies electron current to the n-channel injector such that the thyristor 307 operates in its ON state where it conducts current vertically between the anode and the cathode terminal of the thyristor 307. The p-channel HFET phototransistor Q3 and the n-channel HFET phototransistor Q2 are activated and operate as turn-off F phototransistors when the phase of the received phase-shifted optical carrier signal corresponds to a second predefined phase offset (such as 180 degrees or π radians). When activated, the p-channel HFET phototransistor Q3 draws electron current from the n-channel injector and the n-channel HFET phototransistor Q2 draws hole current from the p-channel injector such that the thyristor 307 operates in its OFF state where there is minimal conduction vertically between the anode and the cathode terminal of the thyristor 307.

Figure 3C:
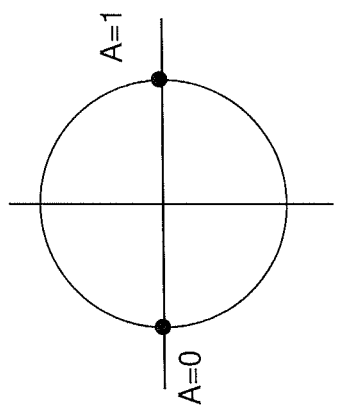
FIG. 3C is a constellation diagram of the exemplary mapping of phases to binary symbols as shown in the table of FIG. 3B.
Figure 3B:
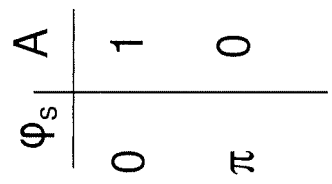
FIG. 3B is a table of an exemplary mapping of phases to binary symbols represented by the digital output signal produced by the optical BPSK detector of FIG. 3A.

The ON and OFF states of the thyristor 307 generates digital (binary) electrical signals A, $\overline{A}$ at the cathode terminal and the anode terminal, respectively. Note that the digital electrical signal A generated at the cathode terminal is complementary to the digital electrical signal $\overline{A}$ generated at the anode terminal. The ON state of the thyristor 307 can also be configured above the lasing threshold such that the thyristor 307 emits a digital (ON/OFF) optical signal corresponding to the digital electrical signal A generated at the cathode terminal of the thyristor 307. In this configuration, the binary levels of the digital electrical signals A, $\overline{A}$ (and possibly the ON/OFF state of the digital optical signal emitted from the thyristor) for the ON and OFF states of the thyristor 307 correspond to the two possible phase offsets of the received phase-shifted optical carrier signal. An example of correspondence between the binary levels of the digital electrical signals A, $\overline{A}$ (and possibly the digital optical signal emitted by the thyristor) and two phase offsets of the received phase-shifted optical carrier signal is shown in the chart of FIG. 3B and the phase constellation diagram of FIG. 3C. Note that these two possible phase offsets are 180 degrees (or π radians) apart from one another.

QPSK and Higher Communication Systems

Figure 4:
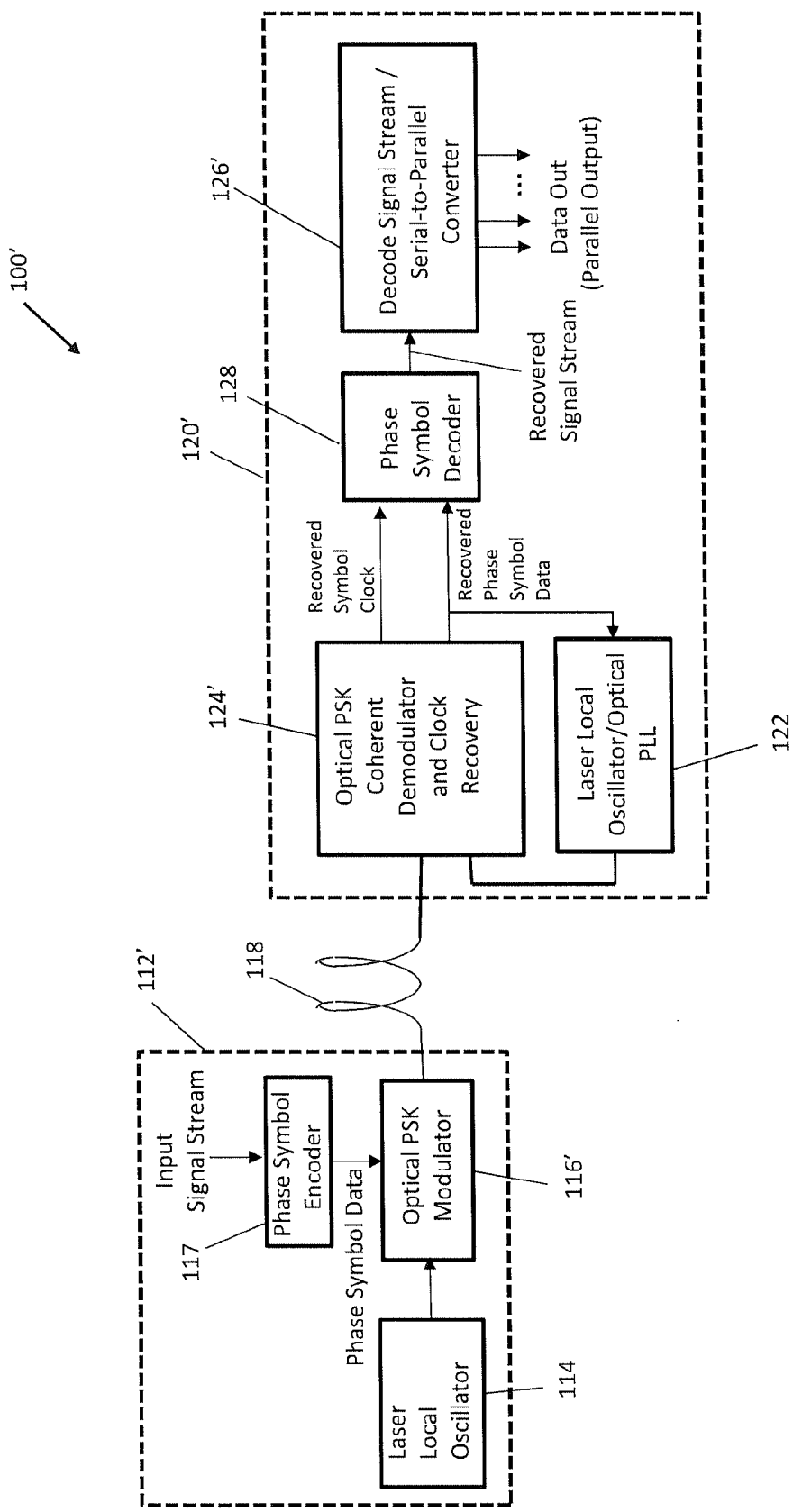
FIG. 4 is a schematic block diagram of coherent PSK optical communication system that can embody aspects of the present disclosure.

FIG. 4 shows an optical communication system 100' employing optical QPSK (or higher order) phase shift keying signals. The transmitter 112' is similar to the transmitter 112 for the BPSK system with the addition of a symbol encoder 117 that maps two sequential bits of the signal stream into a corresponding symbol phase. The optical PSK phase modulator 116' modulates the phase of the optical carrier signal generated by the laser local oscillator 116 according to the symbol phase generated by the symbol encoder 117. The optical PSK modulator 116' can function to incorporate time delay into the optical signal path corresponding to the required phase change (as $\Delta\phi=\omega\Delta t$). This can be realized by a ring resonator where the effective optical velocity through the ring resonator is controlled in some manner (such as in response to one or more electrical signals supplied to the ring resonator). The phase-shifted optical carrier signal produced by the optical PSK modulator 116' is carried by the communication medium (such as an optical fiber) to the receiver 120'.

The receiver 120' of the optical communication system 100' is similar to the receiver 120 of the BPSK system including an OPPL 122 that functions to estimate and compensate for differences in oscillation frequency between the receiver's laser local oscillator and the optical carrier signal of the transmitter 112'. It also aligns the phase of the receiver's laser local oscillator to the phase of the optical carrier signal of the transmitter 112'. The optical local oscillating signal generated by the OPPL 122 along with the received optical phase-shifted carrier signal are processed by the optical PSK coherent demodulator 124' to identify the phase offset of the received optical phased-shifted carrier signal relative to the optical local oscillating signal. This is a form of coherent homodyne detection of the phase information carried in the received phased-shifted optical carrier signal. The optical PSK coherent demodulator 124' generates an electrical signal that encodes the symbol phase data corresponding to the phase offset information of the received phased-shifted optical carrier signal. The correspondence between the phase offset information and the symbol data values is dictated by the PSK modulation scheme employed by the optical PSK modulator 116' of the transmitter 112'. The optical PSK coherent demodulator 124' also operates to generate an electrical clock signal (timing information) corresponding to the symbol clock of the transmitter 112'. In this manner, the optical PSK coherent demodulator 124' recovers the symbol phase data carried by the received phase-shifted optical carrier signal. The recovered phase data and the clock signal are supplied to a phase symbol decoder 128 that decodes the recovered phase symbol data to generate the binary signal stream represented by the symbol data. The binary signal stream is output by the symbol decoder 128 to circuitry 126' that decodes the signal stream (if necessary) and performs serial-to-parallel data conversion. The parallel data (typically, byte-sizes chunks) can be output to a data processing circuit as needed.

Figure 5:
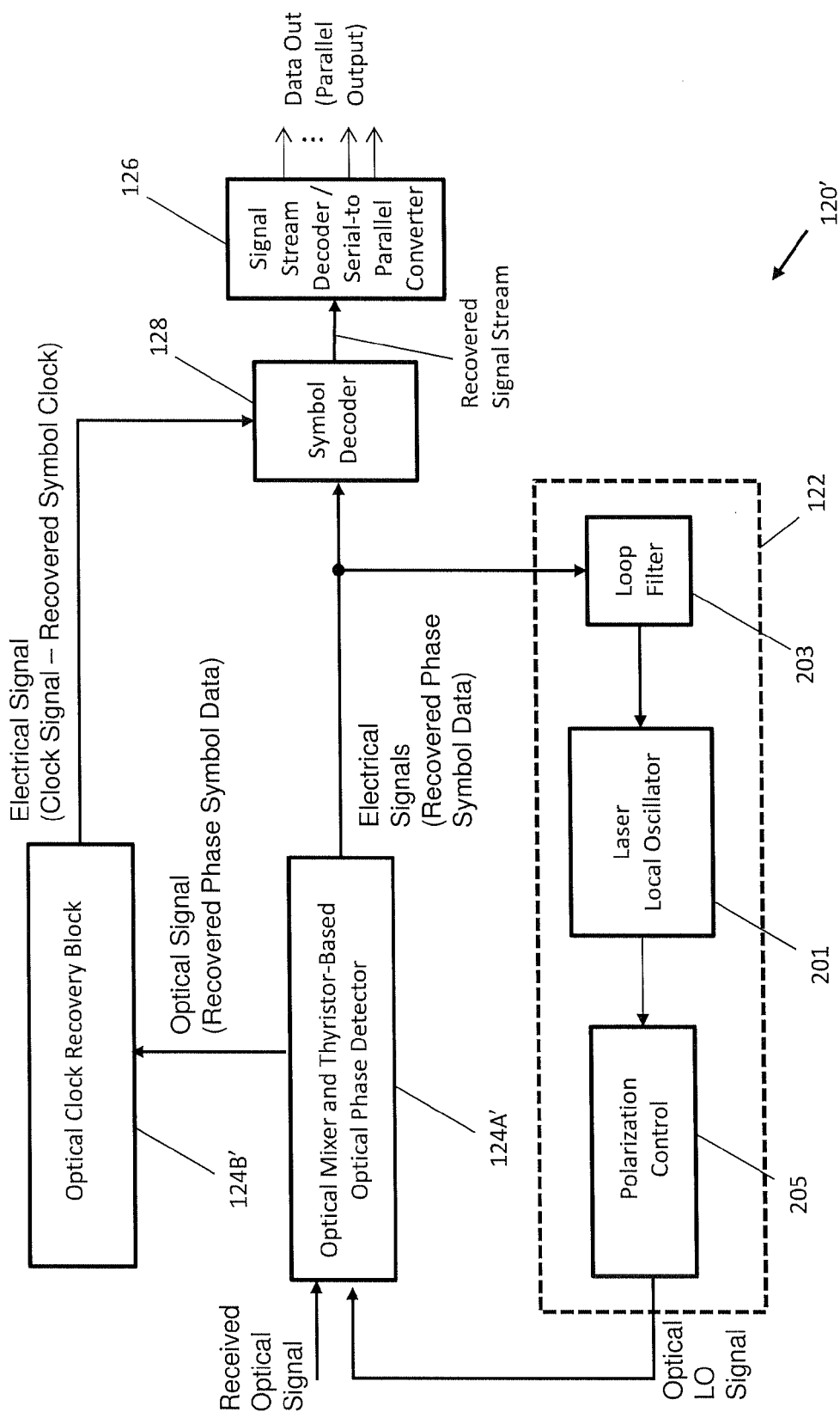
FIG. 5 is a schematic block diagram of an illustrative embodiment of coherent PSK optical receiver according to the present disclosure.

FIG. 5 is a block diagram illustrating an embodiment of the receiver 120' of FIG. 4, which includes an OPPL 122, an optical mixer and thyristor-based optical PSK detector 124A', an optical clock recover block 124B', a symbol decoder 128 and signal decode circuitry 126. The OPPL 122 includes a laser local oscillator 201 and a loop filter 203. The loop filter 203 functions to estimate and compensate for differences in oscillation frequency between the optical local oscillating signal generated by the laser local oscillator 201 and the optical carrier signal of the transmitter 112'. The loop filter 203 also functions to align the phase of the optical local oscillating signal to the phase of the optical carrier signal of the transmitter 10. The output of the laser local oscillator is supplied to a polarization control module 205 that is supplied to a polarization control module 205 that fixes the polarization state of the optical local oscillating signal to match the polarization of the received optical signal. This may be necessary as the laser local oscillator 201 may produce an optical polarization state that differs from the received optical signal.

The optical mixer and thyristor-based optical PSK detector 124A' is configured to identify the phase offset of the received optical phased-shifted carrier signal relative to the optical local oscillating signal. This is form of coherent homodyne detection of the phase information carried in the received phased-shifted optical carrier signal. The optical mixer and thyristor-based optical PSK detector 124A' generates an electrical signal that encodes the symbol data corresponding to the phase offset information of the received phased-shifted optical carrier signal. The correspondence between the phase offset information and the symbol data is dictated by the QPSK (or higher order) modulation scheme employed by the optical PSK modulator 116' of the transmitter 112'. In this manner, the optical mixer and thyristor-based optical PSK detector 124A' recovers the signal stream of symbols carried by the received phase-shifted optical carrier signal.

The optical clock recovery block 124B' operates to generate an electrical clock signal whose ON/OFF transitions are synchronized to the symbol clock of the transmitter 112'. This symbol clock is embedded in the optical signal generated by the optical mixer and thyristor-based optical PSK detector 124A', which represents the recovered signal stream of symbols carried by the received phase-shifted optical carrier signal and detected by the optical mixer and thyristor-based optical PSK detector 124A'.

The signal decode circuitry 126 utilizes the electrical clock signal (recovered symbol clock) generated by the clock recovery block 124B' to sample the symbol data generated by the optical mixer and thyristor-based optical PSK detector 124A'. This symbol data represents the recovered signal stream of symbols carried by the received phase-shifted optical carrier signal and detected by the optical mixer and thyristor-based optical PSK detector 124A'. This sampling is performed at the timing that corresponds recovered symbol clock and thus is aligned to the binary bit values carried by the received phase-shifted optical carrier signal. The signal decode circuitry 126 also performs signal decoding operations that map each recovered phase sample back to the binary symbol it represents and thus recovers the original data.

Optical QPSK Detector

An embodiment of the optical mixer and optical PSK detector 124A' for detecting and demodulating optical QPSK signals is shown in FIG. 6A. It employs a network of two 180-degree optical hybrid couplers 600A and 600B and two optical BPSK detectors 124A-1 and 124A-2 as described above with respect to FIG. 3A for optical mixing and demodulation of the received phase-shifted carrier signal and the optical local oscillating signal output by the OPPL 122. As shown in FIG. 6A, one 180-degree optical hybrid coupler 600A is used to split the received phase-shifted carrier signal for supply to the two optical BPSK detectors 124A-1 and 124A-2. The other 180-degree optical hybrid coupler 600B is used to split the optical local oscillating signal output by the OPPL 122 for supply to the two optical BPSK detectors 124A-1 and 124A-2.

Waveguide 601A supplies the received phased-shifted optical carrier signal to the In0 input waveguide of the 180-degree optical hybrid coupler 600A. In this configuration, the 180-degree optical hybrid coupler 600A produces two output signals that propagate out from the Out0 and Out1 waveguides of the 180-degree optical hybrid coupler 600A. The intensity of the received phased-shifted optical carrier signal is split evenly (50:50 split) in each one of two output signals with a phase delay (lag) of 90 degrees ($\pi/2$ radians) for the output signal that propagates out from the Out1 waveguide relative the output signal that propagates out from the Out0 waveguide.

Waveguide 601B supplies the optical LO signal to the In0 input waveguide of the 180-degree optical hybrid coupler 600B. In this configuration, the 180-degree optical hybrid coupler 600B produces two output signals that propagate out from the Out0 and Out1 waveguides of the 180-degree optical hybrid coupler 600B. The intensity of the optical LO signal is split evenly (50:50 split) in each one of two output signals with a phase delay (lag) of 90 degrees ($\pi/2$ radians) for the output signal that propagates out from the Out1 waveguide relative the output signal that propagates out from the Out0 waveguide.

Waveguides 603A and 603C supply the optical signals output from the Out0 output waveguides of the 180-degree hybrid couplers 600A and 600B to the input waveguides 301A and 301B of the optical BPSK detector 124A-1 as shown. Waveguides 603B and 603D supply the optical signals output from the Out1 output waveguides of the 180-degree hybrid couplers 600A and 600B to the input waveguides 301A and 301B of optical BPSK detector 124A-2 as shown. In this configuration, the phase of the received phase-shifted optical carrier signal that is supplied via the waveguide 603A to the input waveguide 301A of the optical BPSK detector 124A-1 is aligned in phase (lag near 0 degrees or radians) with the phase of the received phase-shifted optical carrier signal.

The phase of the received phase-shifted optical carrier signal that is supplied via the waveguide 603B to the input waveguide 301A of the optical BPSK detector 124A-2 lags by 90 degrees ($\pi/2$ radians) the phase of the received phase-shifted optical carrier signal. The phase of the optical LO signal that is supplied via the waveguide 603C to the input waveguide 301B of the optical BPSK detector 124A-1 is aligned in phase (lag near zero degrees or radians) the phase of the optical LO signal produced by the OPPL 122. The phase of the optical LO signal that is supplied via the waveguide 603D to the input waveguide 301B of the optical BPSK detector 124A-2 lags by 90 degrees ($\pi/2$ radians) the phase of the optical LO signal produced by the OPPL 122.

The ON and OFF states of the thyristor 307 of the optical BPSK detector 124-1 generates digital electrical signals A, $\overline{A}$ at the cathode terminal and the anode terminal, respectively. Note that the digital electrical signal A generated at the cathode terminal is complementary to the digital electrical signal $\overline{A}$ generated at the anode terminal. The ON state of such thyristor 307 can also be configured above the lasing threshold such that the thyristor 307 emits a digital (ON/OFF) optical signal corresponding to the binary levels of the digital electrical signal A generated at the cathode terminal of the thyristor 307 of the optical BPSK detector 124-1. The ON and OFF states of the thyristor 307 of the thyristor-based optical BPSK detector 124-2 generates digital electrical signals B, $\overline{B}$ at the cathode terminal and the anode terminal, respectively. Note that the digital electrical signal B generated at the cathode terminal is complementary to the digital electrical signal $\overline{B}$ generated at the anode terminal. The ON state of such thyristor 307 can also be configured above the lasing threshold such that the thyristor 307 emits a digital (ON/OFF) optical signal corresponding to the digital electrical signal B generated at the cathode terminal of the thyristor 307 of the optical BPSK detector 124-2.

In this configuration, the binary levels of the digital electrical signals A, $\overline{A}$, B, $\overline{B}$ (and possibly the ON/OFF state of the digital optical signals emitted from the thyristors) for the ON and OFF states of the thyristors within the optical BPSK detectors 124-1 and 124-2 correspond to the four possible phase offsets of the received phase-shifted optical carrier signal. An example of correspondence between the binary levels of the digital electrical signals A, B (and possibly the ON/OFF state of the corresponding digital optical signals emitted from the thyristors) and four phase offsets of the received phase-shifted optical carrier signal is shown in the chart of FIG. 6B and the phase constellation diagram of 7C. Note that these two possible phase offsets are 90 degrees (or $\pi/2$ radians) apart from one another.

Optical 8-PSK Detector

An embodiment of the optical mixer and optical PSK detector 124A" for detecting and demodulating optical 8-PSK signals is shown in FIG. 7A. It employs a network of two 180-degree optical hybrid couplers 700A and 700B and two optical QPSK detectors 124A'-1 and 124A'-2 as described above with respect to FIG. 6A for optical mixing of the received phase-shifted carrier signal and the optical local oscillating signal output by the OPPL 122 and demodulation. As shown in FIG. 7A, the 180-degree optical hybrid coupler 700A functions to split the received phase-shifted carrier signal for supply to the two optical QPSK detectors 124A'-1 and 124A'-2. The 180-degree optical hybrid coupler 700B functions to split the optical local oscillating signal output by the OPPL 122 for supply to the two optical QPSK detectors 124A'-1 and 124A'-2.

Waveguide 701A supplies the received phased-shifted optical carrier signal to the In0 input waveguide of the 180-degree optical hybrid coupler 700A. In this configuration, the 180-degree optical hybrid coupler 700A produces two output signals that propagate out from the Out0 and Out1 waveguides of the 180-degree optical hybrid coupler 700A. The intensity of the received phased-shifted optical carrier signal is split evenly (50:50 split) in each one of two output signals with a phase delay (lag) of 90 degrees ($\pi/2$ radians) for the output signal that propagates out from the Out1 waveguide relative the output signal that propagates out from the Out0 waveguide.

Waveguide 701B supplies the optical LO signal to the In0 input waveguide of the 180-degree optical hybrid coupler 700B. In this configuration, the 180-degree optical hybrid coupler 700B produces two output signals that propagate out from the Out0 and Out1 waveguides of the 180-degree optical hybrid coupler 700B. The intensity of the optical LO signal is split evenly (50:50 split) in each one of two output signals with a phase delay (lag) of 90 degrees ($\pi/2$ radians) for the output signal that propagates out from the Out1 waveguide relative the output signal that propagates out from the Out0 waveguide.

Waveguide 703A supplies the optical signal output from the Out0 output waveguide of the 180-degree hybrid coupler 700A to an optical phase modulator 705, which functions to delay the phase of the supplied received phased-shifted optical carrier signal by 45 degrees (or $\pi/4$ radians). The resultant optical signal is supplied to the input waveguide 601A of the optical QPSK detector 124A'-1 as shown. Waveguide 703B supplies the optical signal output from the Out1 output waveguide of the 180-degree hybrid coupler 700A to the input waveguide 601A of the optical QPSK detector 124A'-2 as shown. Waveguide 703C supplies the optical signal output from the Out0 output waveguide of the 180-degree hybrid coupler 700B to the input waveguide 601B of the optical QPSK detector 124A'-1 as shown. Waveguide 703D supplies the optical signal output from the Out1 output waveguide of the 180-degree hybrid coupler 700B to the input waveguide 601B of the optical QPSK detectors 124A'-2 as shown.

In this configuration, the phase of the received phase-shifted optical carrier signal that is supplied via the waveguide 703A to the input waveguide 601A of the optical QPSK detector 124A'-1 lags by 45 degrees ($\pi/4$ radians) the phase of the received phase-shifted optical carrier signal. The phase of the received phase-shifted optical carrier signal that is supplied via the waveguide 703B to the input waveguide 601A of the optical QPSK detector 124A'-2 lags by 90 degrees ($\pi/2$ radians) the phase of the received phase-shifted optical carrier signal. The phase of the optical LO signal that is supplied via the waveguide 703C to the input waveguide 601B of the optical QPSK detector 124A'-1 is aligned (lag near zero degrees or radians) to the phase of the optical LO signal supplied by the OPLL 122. The phase of the optical LO signal that is supplied via the waveguide 703D to the input waveguide 601B of optical QPSK detector 124A'-2 lags by 90 degrees ($\pi/2$ radians) the phase of the optical LO signal that is supplied by the OPLL 122.

Furthermore, in this configuration, the ON and OFF states of the thyristors of the optical QPSK detector 124A'-1 generates digital electrical signals A, $\overline{A}$, B, $\overline{B}$ (and possibly corresponding digital optical signals A, B) and the ON and OFF states of the thyristors of the optical QPSK detector 124A'-2 generates digital electrical signals A', $\overline{A}$', B', $\overline{B}$' (and possibly corresponding digital optical signals A', B'). The digital optical signals A', B' are supplied to a thyristor-based optical XOR block 707 that generates a digital electrical signal C that is the Boolean XOR function of the ON/OFF states of the digital optical signals A', B'. The binary levels of the digital electrical signals A, B, C correspond to the eight possible phase offsets of the received phase-shifted optical carrier signal. An example of correspondence between the binary levels of the electrical signals A, B, C and eight phase offsets of the received phase-shifted optical carrier signal is shown in the chart of FIG. 7B and the phase constellation diagram of FIG. 7C. Note that these eight possible phase offsets are 45 degrees (or $\pi/4$ radians) apart from one another.

Thyristor-Based Optical XOR Block

Figures 8A, 8B:
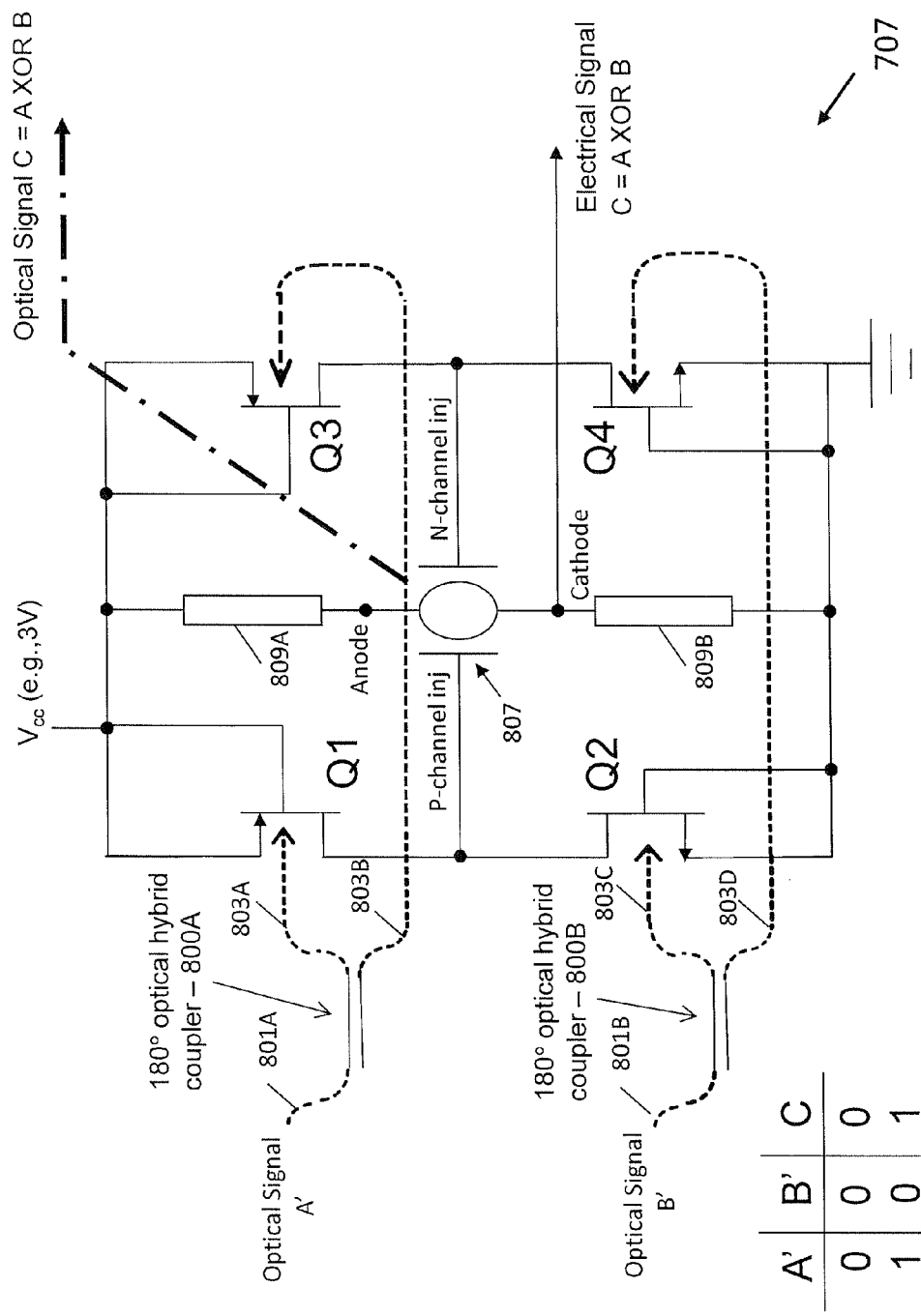
FIG. 8A is a schematic circuit diagram of a thyristor-based optical XOR circuit according to the present disclosure.
FIG. 8B is a table showing the XOR function provided by the optical XOR circuit of FIG. 8A.

An embodiment of the thyristor-based optical XOR block 707 is shown in FIG. 8A. It employs a network of two 180-degree optical hybrid couplers 800A, 800B for splitting the input digital optical signals A', B'. A waveguide 801A supplies the input digital optical signal A' to the In0 input waveguide of 180-degree optical hybrid coupler 800A. In this configuration, the 180-degree optical hybrid coupler 800A produces two output signals that propagate out from the Out0 and the Out1 output waveguides of the 180-degree optical hybrid coupler 800A. The intensity of the digital optical signal A' is split evenly (50:50 split) in each one of two output signals. A waveguide 801B supplies the input digital optical signal B' to the In0 input waveguide of 180-degree optical hybrid coupler 800B. In this configuration, the 180-degree optical hybrid coupler 800B produces two output signals that propagate out from the Out0 and the Out1 output waveguides of the 180-degree optical hybrid coupler 800B. The intensity of the digital optical signal B' is split evenly (50:50 split) in each one of two output signals.

Waveguides 803A, 803B, 803C, 803D supply the optical signals output from the Out0 and Out1 output waveguides of the 180-degree hybrid couplers 800A and 800B to corresponding phototransistors Q1, Q2, Q3, Q4 of a thyristor-based circuit as described below.

The thyristor-based circuit includes a four terminal vertical thyristor (N region-P region-N region-P region) 807 with a split load. A first load element 809A is coupled between the positive voltage supply ($V_{cc}$) and the anode terminal of the thyristor 807. A second load element 809B is coupled between the cathode terminal of the thyristor 807 and the negative voltage supply (ground). The thyristor 807 also has a p-channel injector terminal and an n-channel injector terminal.

A p-channel HFET phototransistor Q1 and an n-channel HFET phototransistor Q2 are coupled in series between the positive voltage supply ($V_{cc}$) and the negative voltage supply (ground). The p-channel HFET phototransistor Q1 has a source and gate terminal both connected to the positive voltage supply ($V_{cc}$). The n-channel HFET phototransistor Q2 has a source and gate terminal both connected to the negative voltage supply (ground). The drain of the p-channel HFET phototransistor Q1 and the drain of the n-channel HFET phototransistor Q2 are coupled together and to the p-channel injector terminal of the thyristor 807.

A p-channel HFET phototransistor Q3 and an n-channel HFET phototransistor Q4 are coupled in series between the positive voltage supply ($V_{cc}$) and the negative voltage supply (ground). The p-channel HFET phototransistor Q3 has a source and gate terminal both connected to the positive voltage supply ($V_{cc}$). The n-channel HFET phototransistor Q4 has a source and gate terminal both connected to the negative voltage supply (ground). The drain of the p-channel HFET phototransistor Q3 and the drain of the n-channel HFET phototransistor Q4 are coupled together and to the re-channel injector terminal of the thyristor 807.

The digital optical signal A' output from the Out0 output waveguide of the 180-degree optical hybrid coupler 800A is guided into the waveguide region of the p-channel HFET phototransistor Q1 and the digital optical signal A' output from the Out1 output waveguide of the 180-degree optical hybrid coupler 800A is guided into the waveguide region of the p-channel HFET phototransistor Q3. The digital optical signal B' output from the Out0 output waveguide of the 180-degree optical hybrid coupler 800B is guided into the waveguide region of the n-channel HFET phototransistor Q2 and the digital optical signal B' output from the Out1 output waveguide of the 180-degree optical hybrid coupler 800B is guided into the waveguide region of the n-channel HFET phototransistor Q4.

In this configuration, the p-channel HFET phototransistors Q1 and Q3 are activated when the state of the digital optical signal A' is ON, and the n-channel HFET phototransistors Q2 and Q4 are activated when the state of the digital optical signal B' is ON. The p-channel HFET phototransistors Q1 is configured to operate as a turn-on phototransistor for the thyristor 807 when the state of the digital optical signal A' is ON and the state of the digital optical signal B' is OFF. The n-channel HFET phototransistor Q4 is configured to operate as a turn-on phototransistor for the thyristor 807 when the state of the digital optical signal B' is ON and the state of the digital optical signal A' is OFF. The p-channel HFET phototransistor Q3 and the n-channel HFET phototransistor Q2 are configured to operate as turn-off phototransistors for the thyristor 807 when the states of both the digital optical signal A' and the digital optical signal B' are ON.

Specifically, the phototransistors Q1, Q2, Q3 and Q4 can be sized so that the turn-off phototransistors Q2 and Q3 are larger (for example, by a factor of two) than the turn-on phototransistors Q1 and Q4. When the state of the digital optical signal A' is ON and the state of the digital optical signal B' is OFF, the p-channel HFET phototransistors Q1 and Q3 are activated and the n-channel HFET phototransistors Q2 and Q4 are not activated. In this case, the turn-on p-channel HFET phototransistor Q1 supplies hole current to the p-channel injector and the turn-off transistor Q3 draws electron current from the n-channel injector; however, due to the internal gain of the thyristor, the internal current flow of electrons is dominant which operates the thyristor 807 in its ON state where it conducts current vertically between the anode and the cathode terminal of the thyristor 807. When the state of the digital optical signal A' is OFF and the state of the digital optical signal B' is ON, the p-channel HFET phototransistors Q1 and Q3 are not activated and the n-channel HFET phototransistors Q2 and Q4 are activated. In this case, the turn-on n-channel HFET phototransistor Q4 supplies electron current to the n-channel injector and the turn-off transistor Q2 draws hole current from the p-channel injector; however, due to the internal gain of the thyristor, the internal current flow of holes is dominant which operates the thyristor 807 in its ON state where it conducts current vertically between the anode and the cathode terminal of the thyristor 807. When the states of both the digital optical signal A' and the digital optical signal B' are ON, the turn-on phototransistors Q1, Q2, Q3 and Q4 are all activated. However, in this case, the hole current drain operation of the larger turn-off transistor Q2 dominates the hole injection operation of the smaller turn-on transistor Q1, which effectively operates to drain hole current from the p-channel injector of the thyristor 807. Similarly, the electron current drain operation of the larger turn-off transistor Q3 dominates the electron injection operation of the smaller turn-on transistor Q4, which effectively operates to drain electron current from the n-channel injector of the thyristor 807. The drain of the hole current from the p-channel injector in conjunction with the drain of electron current from the n-channel injector operates the thyristor 807 in its OFF state where there is minimal current conduction vertically between the anode and the cathode terminal of the thyristor 807. When the states of both the digital optical signals A' and B' are OFF, none of the phototransistors Q1, Q2, Q3, Q4 are activated and thyristor 807 operates in its OFF state.

The ON and OFF states of the thyristor 807 generates the digital electrical signal C at the cathode terminal of the thyristor 808. The ON state of the thyristor 807 can also be configured above the lasing threshold such that the thyristor 807 emits a digital (ON/OFF) optical signal corresponding to the digital electrical signal C generated at the cathode terminal of the thyristor 807. In this configuration, the binary levels of the digital electrical signal C (and possibly the ON/OFF state of the corresponding digital optical signal emitted from the thyristor) for the ON and OFF states of the thyristor 807 corresponds to the Boolean XOR function of the ON/OFF states of the digital optical signals A' and B' as shown in the table of FIG. 8B.

Optical 16-PSK Detector

Figure 9A:
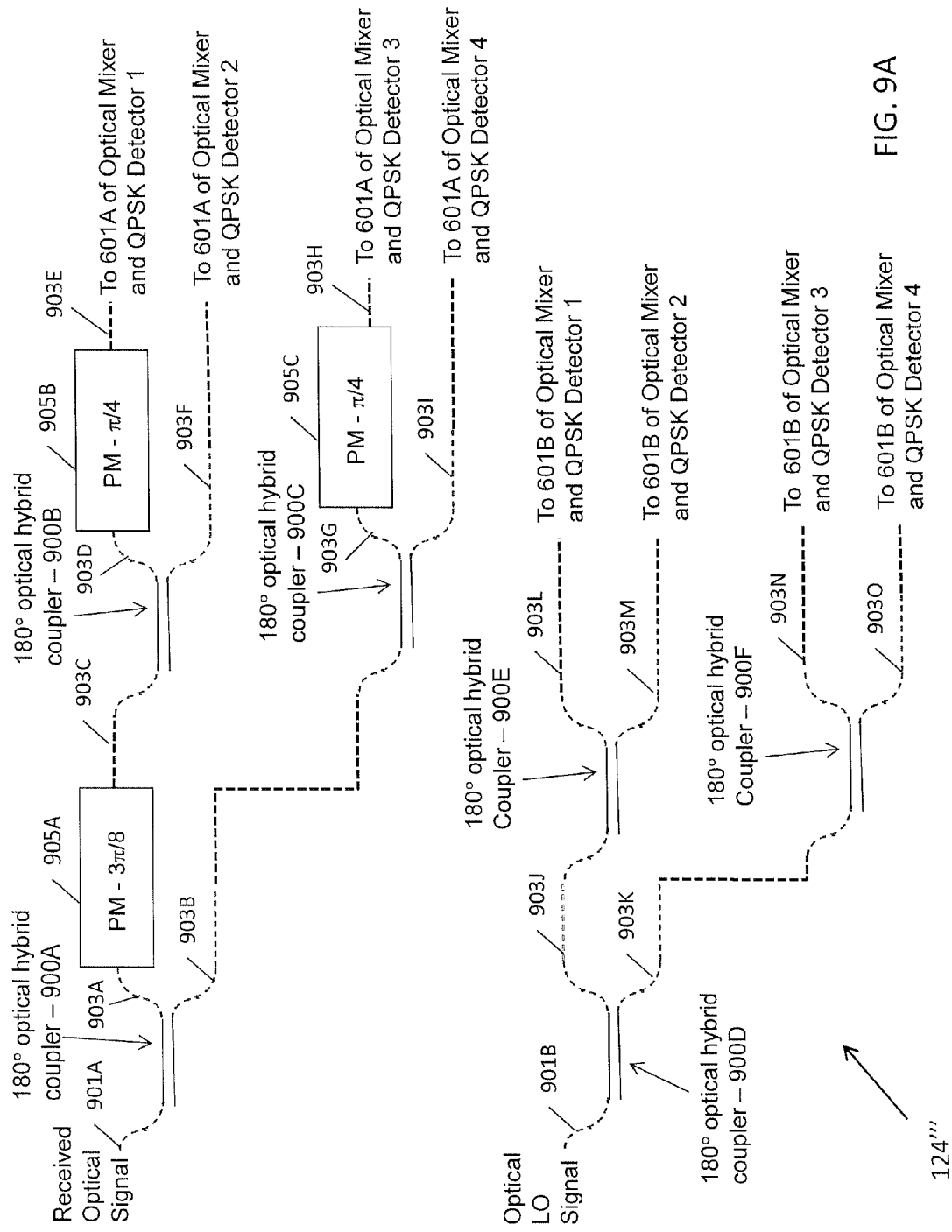
FIGS. 9A and 9B, collectively, is a schematic diagram of the optical mixer and thyristor-based optical 16-PSK detector, suitable for use in the coherent PSK optical receiver of FIG. 5 that receives optical 16-PSK-modulated signals.
Figure 9B:
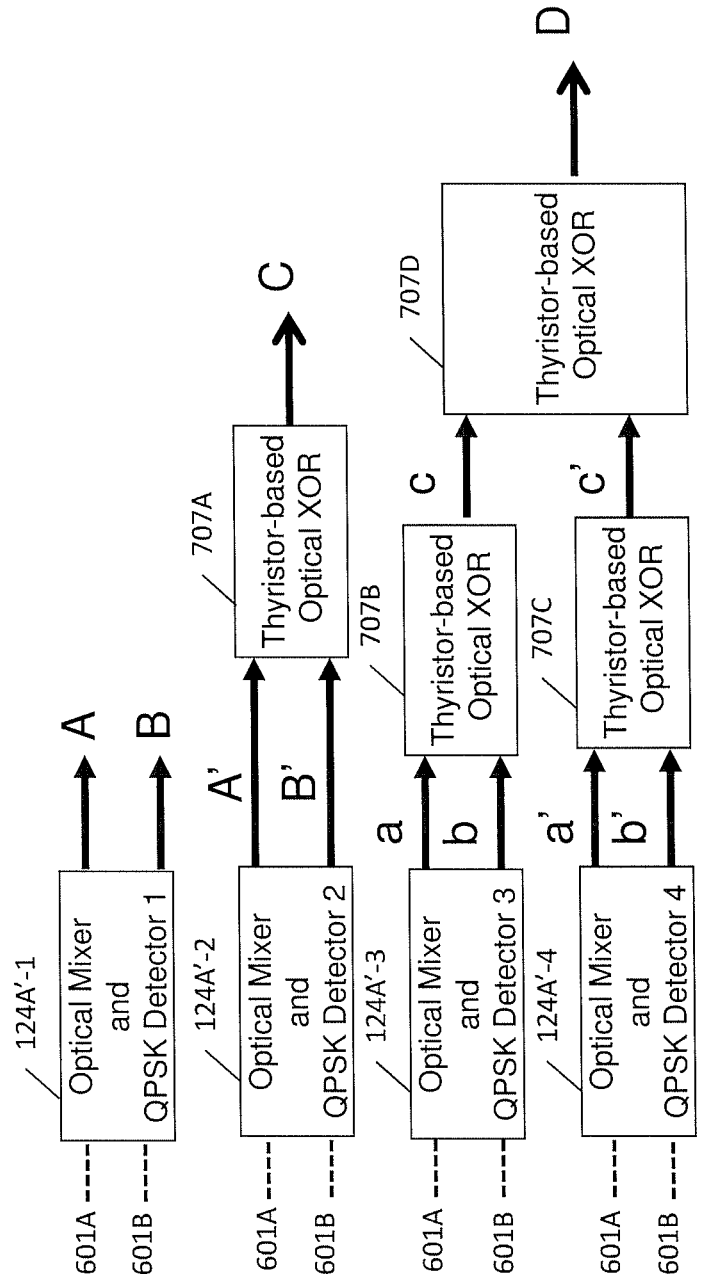

An embodiment of the optical mixer and optical PSK detector 124A''' for detecting and demodulating optical 16-PSK signals is shown in FIGS. 9A and 9B. It employs a network of six 180-degree optical hybrid couplers 900A, 900B, 900C, 900D, 900E and 900F and four optical QPSK detectors 124A'-1, 124A'-2, 124A'-3, 124A'-4 as described above with respect to FIG. 6A for optical mixing of the received phase-shifted carrier signal and the optical local oscillating signal output by the OPPL 122 and demodulation.

As shown in FIG. 9A, waveguide 901A supplies the received phased-shifted optical carrier signal to the In0 input waveguide of the 180-degree optical hybrid coupler 900A. In this configuration, the 180-degree optical hybrid coupler 900A produces two output signals that propagate out from the Out0 and Out1 waveguides of the 180-degree optical hybrid coupler 900A. The intensity of the received phased-shifted optical carrier signal is split evenly (50:50 split) in each one of two output signals with a phase delay (lag) of 90 degrees ($\pi/2$ radians) for the output signal that propagates out from the Out1 waveguide relative the output signal that propagates out from the Out0 waveguide.

Waveguide 901B supplies the optical LO signal to the In0 input waveguide of the 180-degree optical hybrid coupler 900D. In this configuration, the 180-degree optical hybrid coupler 900D produces two output signals that propagate out from the Out0 and Out1 waveguides of the 180-degree optical hybrid coupler 900D. The intensity of the optical LO signal is split evenly (50:50 split) in each one of two output signals with a phase delay (lag) of 90 degrees ($\pi/2$ radians) for the output signal that propagates out from the Out1 waveguide relative the output signal that propagates out from the Out0 waveguide.

Waveguide 903A supplies the optical signal output from the Out0 output waveguide of the 180-degree hybrid coupler 900A to an optical phase modulator 905A, which functions to delay the phase of the supplied received phased-shifted optical carrier signal by 67.5 degrees (or $3\pi/8$ radians). The resultant optical signal is supplied by waveguide 903C to the In0 input waveguide of the 180-degree optical hybrid coupler 900B. In this configuration, the 180-degree optical hybrid coupler 900B produces two output signals that propagate out from the Out0 and Out1 waveguides of the 180-degree optical hybrid coupler 900B. The intensity of the resultant optical signal is split evenly (50:50 split) in each one of two output signals with a phase delay (lag) of 90 degrees (π/2 radians) for the output signal that propagates out from the Out1 waveguide relative the output signal that propagates out from the Out0 waveguide. Waveguide 903D supplies the optical signal output from the Out0 output waveguide of the 180-degree hybrid coupler 900B to an optical phase modulator 905B, which functions to delay the phase of the supplied received phased-shifted optical carrier signal by 45 degrees (or π/4 radians). The resultant optical signal is supplied by waveguide 903E to the input waveguide 601A of the optical QPSK detector 124A'-1. Waveguide 903F supplies the optical signal output from the Out1 output waveguide of the 180-degree hybrid coupler 900B to the input waveguide 601A of the optical QPSK detector 124A'-2.

Waveguide 903B supplies the optical signal output from the Out1 output waveguide of the 180-degree hybrid coupler 900A to the In0 input waveguide of the 180-degree optical hybrid coupler 900C. In this configuration, the 180-degree optical hybrid coupler 900C produces two output signals that propagate out from the Out0 and Out1 waveguides of the 180-degree optical hybrid coupler 900C. The intensity of the resultant optical signal is split evenly (50:50 split) in each one of two output signals with a phase delay (lag) of 90 degrees (π/2 radians) for the output signal that propagates out from the Out1 waveguide relative the output signal that propagates out from the Out0 waveguide. Waveguide 903G supplies the optical signal output from the Out0 output waveguide of the 180-degree hybrid coupler 900C to an optical phase modulator 905C, which functions to delay the phase of the supplied received phased-shifted optical carrier signal by 45 degrees (or π/4 radians). The resultant optical signal is supplied by waveguide 903H to the input waveguide 601A of the optical QPSK detector 124A'-3. Waveguide 903I supplies the optical signal output from the Out1 output waveguide of the 180-degree hybrid coupler 900C to the input waveguide 601A of the optical QPSK detector 124A'-4.

Waveguide 903J supplies the optical LO signal output from the Out0 output waveguide of the 180-degree hybrid coupler 900D to the In0 input waveguide of the 180-degree optical hybrid coupler 900E. In this configuration, the 180-degree optical hybrid coupler 900E produces two output signals that propagate out from the Out0 and Out1 waveguides of the 180-degree optical hybrid coupler 900E. The intensity of the resultant optical signal is split evenly (50:50 split) in each one of two output signals with a phase delay (lag) of 90 degrees (π/2 radians) for the output signal that propagates out from the Out1 waveguide relative the output signal that propagates out from the Out0 waveguide. Waveguide 903L supplies the optical signal output from the Out0 output waveguide of the 180-degree hybrid coupler 900E to the input waveguide 601B of the optical QPSK detector 124A'-1. Waveguide 903M supplies the optical signal output from the Out1 output waveguide of the 180-degree hybrid coupler 900E to the input waveguide 601B of the optical QPSK detector 124A'-2.

Waveguide 903K supplies the optical LO signal output from the Out1 output waveguide of the 180-degree hybrid coupler 900D to the In0 input waveguide of the 180-degree optical hybrid coupler 900F. In this configuration, the 180-degree optical hybrid coupler 900F produces two output signals that propagate out from the Out0 and Out1 waveguides of the 180-degree optical hybrid coupler 900F. The intensity of the resultant optical signal is split evenly (50:50 split) in each one of two output signals with a phase delay (lag) of 90 degrees (π/2 radians) for the output signal that propagates out from the Out1 waveguide relative the output signal that propagates out from the Out0 waveguide. Waveguide 903N supplies the optical signal output from the Out0 output waveguide of the 180-degree hybrid coupler 900F to the input waveguide 601B of the optical QPSK detector 124A'-3. Waveguide 903O supplies the optical signal output from the Out1 output waveguide of the 180-degree hybrid coupler 000F to the input waveguide 601B of the optical QPSK detector 124A'-4.

In this configuration, the phase of the received phase-shifted optical carrier signal that is supplied via the waveguide 903E to the input waveguide 601A of the optical QPSK detector 124A'-1 lags by 112.5 degrees (5π/8 radians) the phase of the received phase-shifted optical carrier signal. The phase of the received phase-shifted optical carrier signal that is supplied via the waveguide 903F to the input waveguide 601A of the optical QPSK detector 124A'-2 lags by 157.5 degrees (7π/8 radians) the phase of the received phase-shifted optical carrier signal. The phase of the received phase-shifted optical carrier signal that is supplied via the waveguide 903H to the input waveguide 601A of the optical QPSK detector 124A'-3 lags by 135 degrees (3π/4 radians) the phase of the received phase-shifted optical carrier signal. The phase of the received phase-shifted optical carrier signal that is supplied via the waveguide 903I to the input waveguide 601A of the optical QPSK detector 124A'-4 lags by 180 degrees Or radians) the phase of the received phase-shifted optical carrier signal. The phase of the optical LO signal that is supplied via the waveguide 903L to the input waveguide 601B of optical QPSK detector 124A'-1 is aligned (lag near zero degrees or radians) to the phase of the optical LO signal supplied by the OPLL 122. The phase of the optical LO signal that is supplied via the waveguide 903M to the input waveguide 601B of optical QPSK detector 124A'-2 lags by 90 degrees (π/2 radians) the phase of the optical LO signal that is supplied by the OPLL 122. The phase of the optical LO signal that is supplied via the waveguide 903N to the input waveguide 601B of optical QPSK detector 124A'-3 lags by 90 degrees (π/2 radians) the phase of the optical LO signal that is supplied by the OPLL 122. The phase of the optical LO signal that is supplied via the waveguide 903O to the input waveguide 601B of optical QPSK detector 124A'-4 lags by 180 degrees (it radians) the phase of the optical LO signal that is supplied by the OPLL 122.

Furthermore, in this configuration, the ON and OFF states of the thyristors of the optical QPSK detector 124A'-1 generates digital electrical signals A, $\overline{A}$, B, $\overline{B}$ (and possibly corresponding digital optical signals A, B). The ON and OFF states of the thyristors of the optical QPSK detector 124A'-2 generates digital electrical signals A', $\overline{A}$', B', $\overline{B}$' (and possibly corresponding digital optical signals A', B'). The ON and OFF states of the thyristors of the optical QPSK detector 124A'-3 generates digital electrical signals a, $\overline{a}$, b, $\overline{b}$ (and possibly corresponding digital optical signals a, b). The ON and OFF states of the thyristors of the optical QPSK detector 124A'-4 generates digital electrical signals a', $\overline{a}$', b', $\overline{b}$' (and possibly corresponding digital optical signals a', b').

As shown in FIG. 9B, the digital optical signals A', B' are supplied to a thyristor-based optical XOR block 907A that generates a digital electrical signal C (and possibly a corresponding digital optical signal C) that is the Boolean XOR function of the ON/OFF states of the digital optical signals A', B'. The digital optical signals a, b are supplied to a thyristor-based optical XOR block 907B that generates a digital optical signal c (and possibly a corresponding digital optical signal c) that is the Boolean XOR function of the ON/OFF states of the digital optical signals a, b. The digital optical signals a', b' are supplied to a thyristor-based optical XOR block 907C that generates a digital optical signal c' (and possibly a corresponding digital optical signal c) that is the Boolean XOR function of the ON/OFF states of the digital optical signals a', b'. The digital optical signals c, c' are supplied to a thyristor-based optical XOR block 907D that generates a digital electrical signal D (and possibly a corresponding digital optical signal D) that is the Boolean XOR function of the ON/OFF states of the digital optical signals c, c'. The optical XOR blocks 907A, 907B, 907D and 907D can be realized with the optical XOR block described above with respect to FIGS. 8A and 8B.

Figures 9C, 9D:
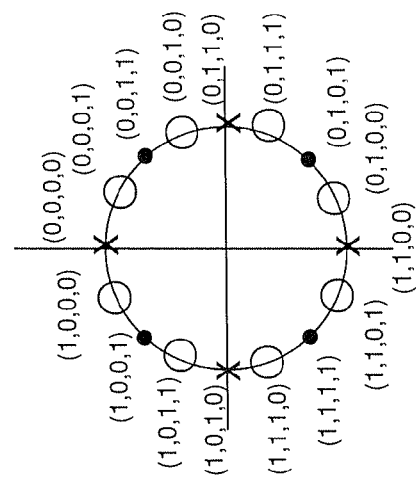
FIG. 9C is a table of an exemplary mapping of phases to sixteen symbols represented by the digital output signals produced by the optical 16-PSK detector of FIGS. 9A and 9B.
FIG. 9D is a constellation diagram of the exemplary mapping of phases to symbols as shown in the table of FIG. 9C.

The binary levels of the digital electrical signals A, B, C, D correspond to the sixteen possible phase offsets of the received phase-shifted optical carrier signal. An example of correspondence between the binary levels of the digital electrical signals A, B, C, D and four phase offsets of the received phase-shifted optical carrier signal is shown in the chart of FIG. 9C and the phase constellation diagram of FIG. 9D. Note that these sixteen possible phase offsets are 22.5 degrees (or π/8 radians) apart from one another.

Optical 16-QAM Detector

Figure 10A:
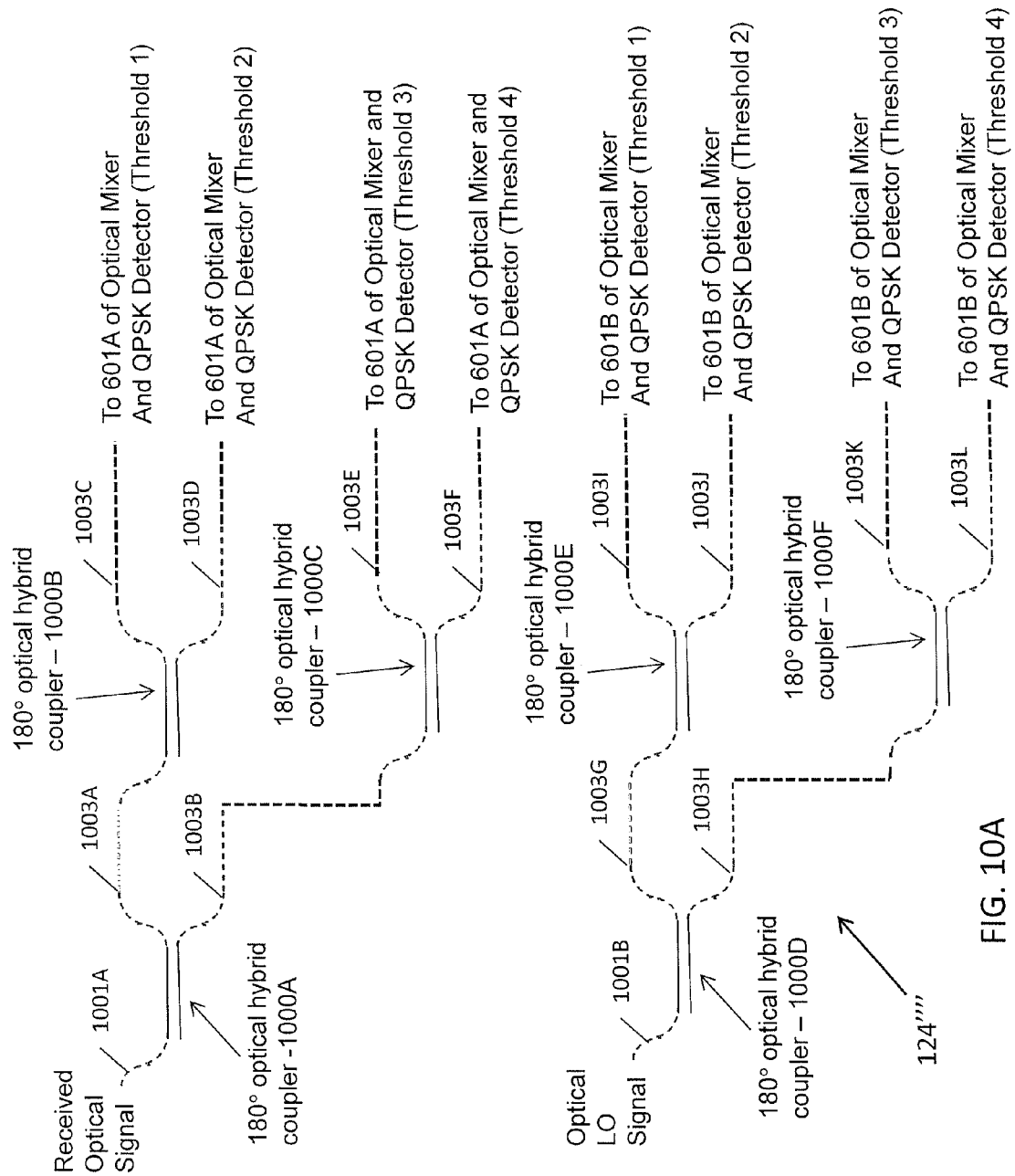
FIGS. 10A and 10B, collectively, is a schematic diagram of the optical mixer and thyristor-based optical PSK-QAM detector, suitable for use in the coherent PSK optical receiver of FIG. 5 that receives optical PSK-QAM-modulated signals.
Figure 10B:
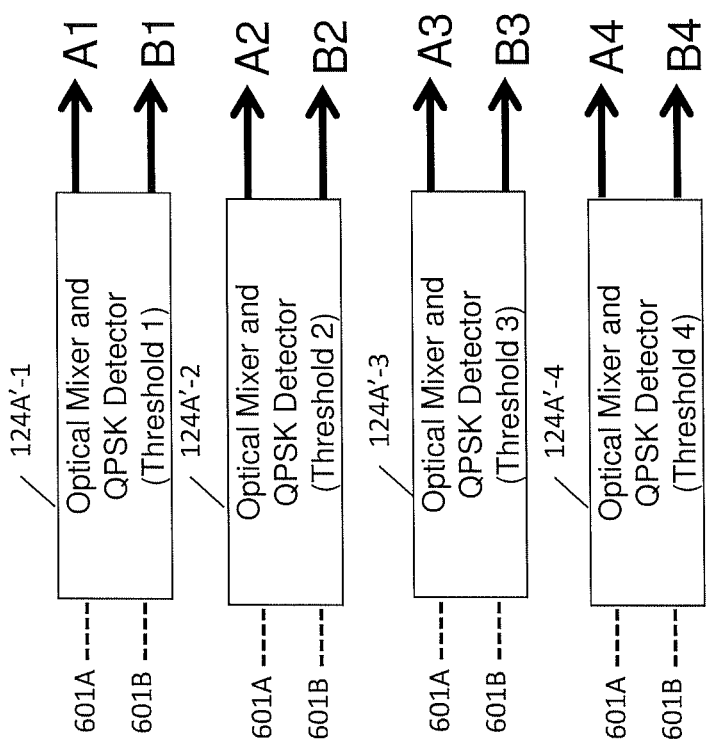

An embodiment of the optical mixer and optical PSK detector 124A"" for detecting and demodulating optical 16-QAM signals is shown in FIGS. 10A and 10B. It employs a network of six 180-degree optical hybrid couplers 1000A, 1000B, 1000C, 1000D, 1000E and 1000F and four optical QPSK detectors 124A'-1, 124A'-2, 124A'-3, 124A'-4 as described above with respect to FIG. 6A for optical mixing of the received phase-shifted carrier signal and the optical local oscillating signal output by the OPPL 122 and demodulation. The optical 16-QAM signals employ a combination of amplitude modulation (with four possible levels of amplitude modulation increasing in magnitude and designated T1, T2, T3 and T4) and PSK modulation (with four possible phase offsets per amplitude modulation level). The Q1 and Q4 phototransistors of the four optical QPSK detectors operate to inject hole/electron current into corresponding thyristor injector terminals. Similarly, the Q2 and Q3 phototransistors of the four optical QPSK detectors operate to drain hole/electron current from the corresponding thyristor injector terminals. Furthermore, the supply voltages supplied to the thyristors of the four optical QPSK detectors are adjusted such that threshold levels for activating such thyristors increases in magnitude over the four optical QPSK detectors to correspond to the four possible levels of amplitude modulation T1, T2, T3 and T4. In this manner, the threshold level for activation of the thyristor for the optical QPSK detector 124A'-1 is less than the threshold level for activation of the thyristor for the optical QPSK detector 124A'-2, which is less than the threshold level for activation of the thyristor for the optical QPSK detector 124A'-3, which is less than the threshold level for activation of the thyristor for the optical QPSK detector 124A'-4. This configuration provides for optical detection and demodulation of the optical 16-QAM signals.

As shown in FIG. 10A, waveguide 1001A supplies the received phased-shifted optical carrier signal to the In0 input waveguide of the 180-degree optical hybrid coupler 1000A. In this configuration, the 180-degree optical hybrid coupler 1000A produces two output signals that propagate out from the Out0 and Out1 waveguides of the 180-degree optical hybrid coupler 1000A. The intensity of the received phased-shifted optical carrier signal is split evenly (50:50 split) in each one of two output signals with a phase delay (lag) of 90 degrees (π/2 radians) for the output signal that propagates out from the Out1 waveguide relative the output signal that propagates out from the Out0 waveguide.

Waveguide 1001B supplies the optical LO signal to the In0 input waveguide of the 180-degree optical hybrid coupler 1000D. In this configuration, the 180-degree optical hybrid coupler 1000D produces two output signals that propagate out from the Out0 and Out1 waveguides of the 180-degree optical hybrid coupler 1000D. The intensity of the optical LO signal is split evenly (50:50 split) in each one of two output signals with a phase delay (lag) of 90 degrees (π/2 radians) for the output signal that propagates out from the Out1 waveguide relative the output signal that propagates out from the Out0 waveguide.

Waveguide 1003A supplies the optical signal output from the Out0 output waveguide of the 180-degree hybrid coupler 1000A to the In0 input waveguide of the 180-degree optical hybrid coupler 1000B. In this configuration, the 180-degree optical hybrid coupler 1000B produces two output signals that propagate out from the Out0 and Out1 waveguides of the 180-degree optical hybrid coupler 1000B. The intensity of the resultant optical signal is split evenly (50:50 split) in each one of two output signals with a phase delay (lag) of 90 degrees (π/2 radians) for the output signal that propagates out from the Out1 waveguide relative the output signal that propagates out from the Out0 waveguide. Waveguide 1003C supplies the optical signal output from the Out0 output waveguide of the 180-degree hybrid coupler 1000B to the input waveguide 601A of the optical QPSK detector 124A'-1. Waveguide 1003D supplies the optical signal output from the Out1 output waveguide of the 180-degree hybrid coupler 1000B to the input waveguide 601A of the optical QPSK detector 124A'-2.

Waveguide 1003B supplies the optical signal output from the Out1 output waveguide of the 180-degree hybrid coupler 1000A to the In0 input waveguide of the 180-degree optical hybrid coupler 1000C. In this configuration, the 180-degree optical hybrid coupler 1000C produces two output signals that propagate out from the Out0 and Out1 waveguides of the 180-degree optical hybrid coupler 1000C. The intensity of the resultant optical signal is split evenly (50:50 split) in each one of two output signals with a phase delay (lag) of 90 degrees (π/2 radians) for the output signal that propagates out from the Out1 waveguide relative the output signal that propagates out from the Out0 waveguide. Waveguide 1003E supplies the optical signal output from the Out0 output waveguide of the 180-degree hybrid coupler 1000C to the input waveguide 601A of the optical QPSK detector 124A'-3. Waveguide 1003F supplies the optical signal output from the Out1 output waveguide of the 180-degree hybrid coupler 1000C to the input waveguide 601A of the optical QPSK detector 124A'-4.

Waveguide 1003G supplies the optical LO signal output from the Out0 output waveguide of the 180-degree hybrid coupler 1000D to the In0 input waveguide of the 180-degree optical hybrid coupler 1000E. In this configuration, the 180-degree optical hybrid coupler 1000E produces two output signals that propagate out from the Out0 and Out1 waveguides of the 180-degree optical hybrid coupler 1000E. The intensity of the resultant optical signal is split evenly (50:50 split) in each one of two output signals with a phase delay (lag) of 90 degrees (π/2 radians) for the output signal that propagates out from the Out1 waveguide relative the output signal that propagates out from the Out0 waveguide. Waveguide 1003I supplies the optical signal output from the Out0 output waveguide of the 180-degree hybrid coupler 1000E to the input waveguide 601B of the optical QPSK detector 124A'-1. Waveguide 1003J supplies the optical signal output from the Out1 output waveguide of the 180-degree hybrid coupler 1000E to the input waveguide 601B of the optical QPSK detector 124A'-2.

Waveguide 1003H supplies the optical LO signal output from the Out1 output waveguide of the 180-degree hybrid coupler 1000D to the In0 input waveguide of the 180-degree optical hybrid coupler 1000F. In this configuration, the 180-degree optical hybrid coupler 1000F produces two output signals that propagate out from the Out0 and Out1 waveguides of the 180-degree optical hybrid coupler 1000F. The intensity of the resultant optical signal is split evenly (50:50 split) in each one of two output signals with a phase delay (lag) of 90 degrees ($\pi/2$ radians) for the output signal that propagates out from the Out1 waveguide relative the output signal that propagates out from the Out0 waveguide. Waveguide 1003K supplies the optical signal output from the Out0 output waveguide of the 180-degree hybrid coupler 1000F to the input waveguide 601B of the optical QPSK detector 124A'-3. Waveguide 1003L supplies the optical signal output from the Out1 output waveguide of the 180-degree hybrid coupler 1000F to the input waveguide 601B of the optical QPSK detector 124A'-4.

In this configuration, the phase of the received phase-shifted optical carrier signal that is supplied via the waveguide 1003C to the input waveguide 601A of the optical QPSK detector 124A'-1 is aligned (lag near zero degrees or radians) to the phase of the received phase-shifted optical carrier signal. The phase of the received phase-shifted optical carrier signal that is supplied via the waveguide 1003D to the input waveguide 601A of the optical QPSK detector 124A'-2 lags by 90 degrees ($\pi/2$ radians) the phase of the received phase-shifted optical carrier signal. The phase of the received phase-shifted optical carrier signal that is supplied via the waveguide 1003E to the input waveguide 601A of the optical QPSK detector 124A'-3 lags by 90 degrees ($\pi/2$ radians) the phase of the received phase-shifted optical carrier signal. The phase of the received phase-shifted optical carrier signal that is supplied via the waveguide 1003F to the input waveguide 601A of the optical QPSK detector 124A'-4 lags by 180 degrees ($\pi$ radians) the phase of the received phase-shifted optical carrier signal. The phase of the optical LO signal that is supplied via the waveguide 1003I to the input waveguide 601B of optical QPSK detector 124A'-1 is aligned (lag near zero degrees or radians) to the phase of the optical LO signal supplied by the OPLL 122. The phase of the optical LO signal that is supplied via the waveguide 1003J to the input waveguide 601B of optical QPSK detector 124A'-2 lags by 90 degrees ($\pi/2$ radians) the phase of the optical LO signal that is supplied by the OPLL 122. The phase of the optical LO signal that is supplied via the waveguide 1003K to the input waveguide 601B of optical QPSK detector 124A'-3 lags by 90 degrees ($\pi/2$ radians) the phase of the optical LO signal that is supplied by the OPLL 122. The phase of the optical LO signal that is supplied via the waveguide 1003L to the input waveguide 601B of optical QPSK detector 124A'-4 lags by 180 degrees Or radians) the phase of the optical LO signal that is supplied by the OPLL 122.

As described above, the Q1 and Q4 phototransistors of the four optical QPSK detectors operate to inject hole/electron current into corresponding thyristor injector terminals. Similarly, the Q2 and Q3 phototransistors of the four optical QPSK detectors operate to drain hole/electron current from the corresponding thyristor injector terminals. Furthermore, the supply voltages supplied to the thyristors of the four optical QPSK detectors are adjusted such that threshold levels for activating such thyristors increases in magnitude over the four optical QPSK detectors to correspond to the four possible levels of amplitude modulation T1, T2, T3 and T4.

In this configuration, the ON and OFF states of the thyristors of the optical QPSK detector 124A'-1 generates digital electrical signals A1, $\overline{A1}$, B1, $\overline{B1}$ (and possibly corresponding digital optical signals A1, B1) corresponding to four possible phase offsets for the T1 level of amplitude modulation. The ON and OFF states of the thyristors of the optical QPSK detector 124A'-2 generates digital electrical signals A2, $\overline{A2}$, B2, $\overline{B2}$ (and possibly corresponding digital optical signals A2, B2) corresponding to four possible phase offsets for the T2 level of amplitude modulation. The ON and OFF states of the thyristors of the optical QPSK detector 124A'-3 generates digital electrical signals A3, $\overline{A3}$, B3, $\overline{B3}$ (and possibly corresponding digital optical signals A3, B3) corresponding to four possible phase offsets for the T3 level of amplitude modulation. The ON and OFF states of the thyristors of the optical QPSK detector 124A'-4 generates digital electrical signals A4, $\overline{A4}$, B4, $\overline{B4}$ (and possibly corresponding digital optical signals A4, B4) corresponding to four possible phase offsets for the T4 level of amplitude modulation. In this manner, the binary levels of the electrical signals A1, B1, A2, B2, A3, B3, A4, B4 correspond to the sixteen possible combinations of amplitude modulation levels (T1/T2/T3/T4) and phase offsets of the received optical carrier signal.

Figures 10C, 10D:
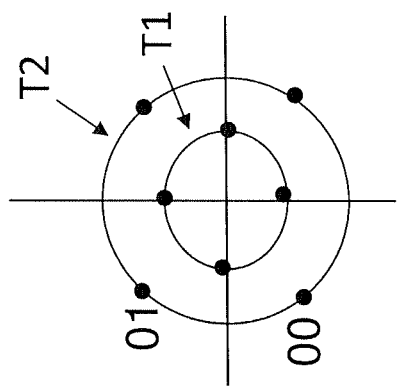
FIG. 10C is a table of an exemplary mapping of phases and two amplitude modulations (T1 and T2) to eight symbols represented by the digital output signals produced by the optical PSK-QAM detector of FIGS. 10A and 10B.
FIG. 10D is a constellation diagram of the exemplary mapping of phases and two amplitude modulations (T1 and T2) to eight symbols as shown in the table of FIG. 10C.
Figure 10E:
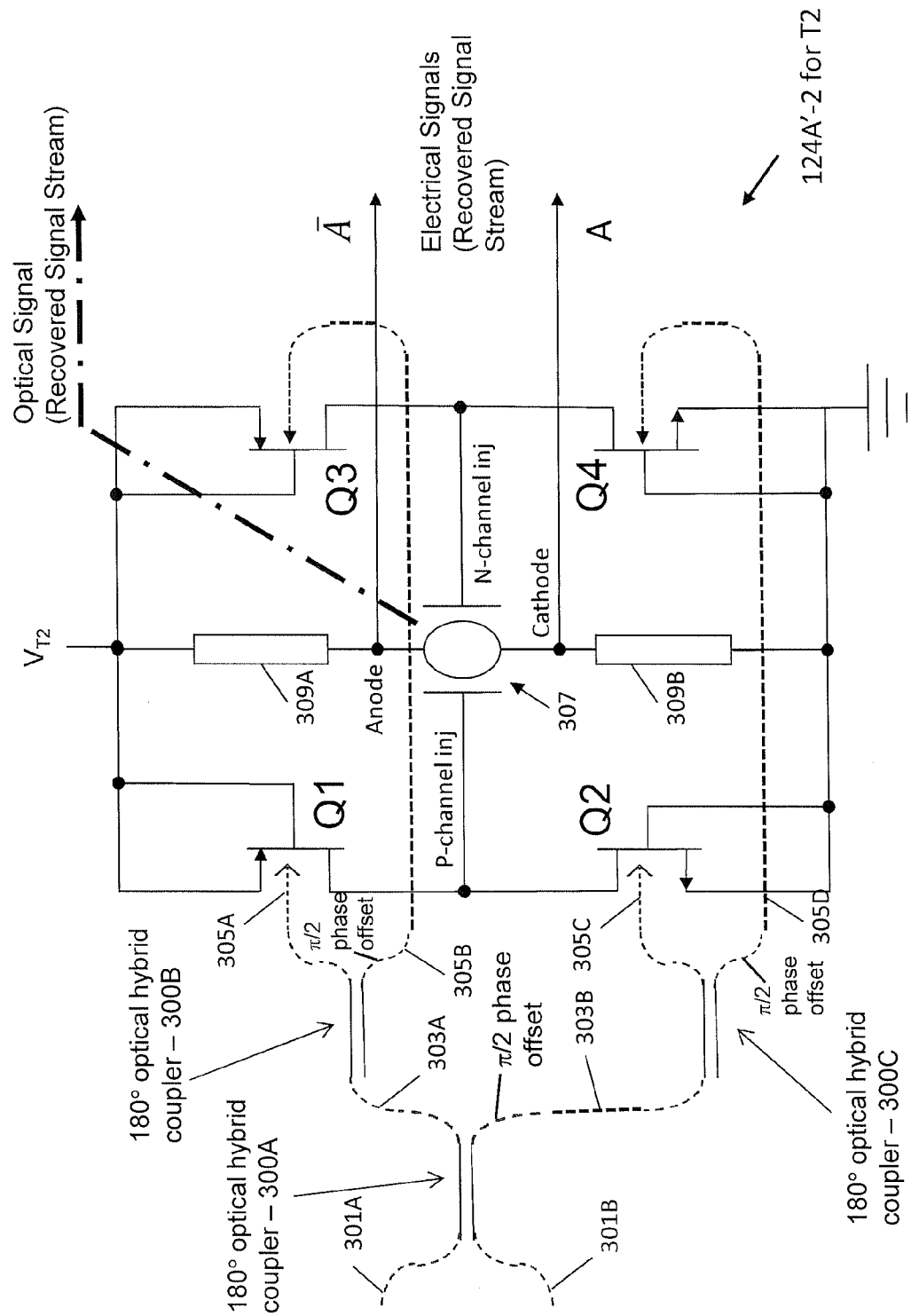
FIG. 10E is a schematic circuit diagram of part of the optical PSK-QAM detector of FIGS. 10A and 10B for detecting the phases of the T2 amplitude modulation level.
Figures 10F, 10G:
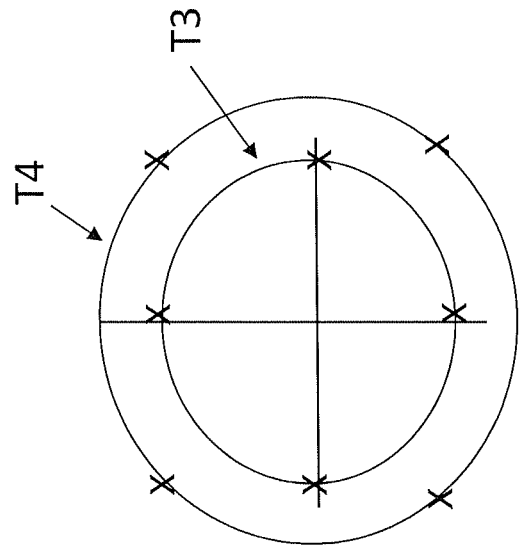
FIG. 10F is a table of an exemplary mapping of phases and two amplitude modulations (T3 and T4) to eight symbols represented by the digital output signals produced by the optical PSK-QAM detector of FIGS. 10A and 10B.
FIG. 10G is a constellation diagram of the exemplary mapping of phases and two amplitude modulations (T3 and T4) to eight symbols as shown in the table of FIG. 10F.

An example of correspondence between the binary levels of the digital electrical signals A1, B1, A2, B2, A3, B3, A4, B4 and sixteen combinations of amplitude modulation levels (T1/T2/T3/T4) and phase offsets of the received optical carrier signal is shown in the charts of FIGS. 10C and 10E and the phase constellation diagrams of FIGS. 10D and 10F. The chart of FIG. 10C and the constellation diagram of FIG. 10D show an example of correspondence between the binary levels of the electrical signals A1, B1, A2, B2 and eight combinations of amplitude modulation levels (T1/T2) and phase offsets of the received optical carrier signal.

FIG. 10E shows an embodiment for one part (the BPSK detector for the A2 signal) of the optical QPSK detector 124A'-2 for the T2 level of amplitude modulation. In this embodiment, the voltage supply potential ($V_{T2}$) is configured to set the switching threshold of the thyristor 307 (the point where the thyristor 307 operates in its ON state where it conducts current vertically between the anode and the cathode terminal of the thyristor 307) such that is larger than the switching threshold for the thyristor 307 of the optical QPSK detector 124A'-1 for the T1 level of amplitude modulation. A similar configuration is used for the other part (the BPSK detector for the B2 signal) of the optical QPSK detector 124A'-2 for the T2 level of amplitude modulation.

The chart of FIG. 10F and the constellation diagram of FIG. 10G show an example of correspondence between the binary levels of the digital electrical signals A3, B3, A4, B4 and eight combinations of amplitude modulation levels (T3/T4) and phase offsets of the received optical carrier signal.

Figure 10H:
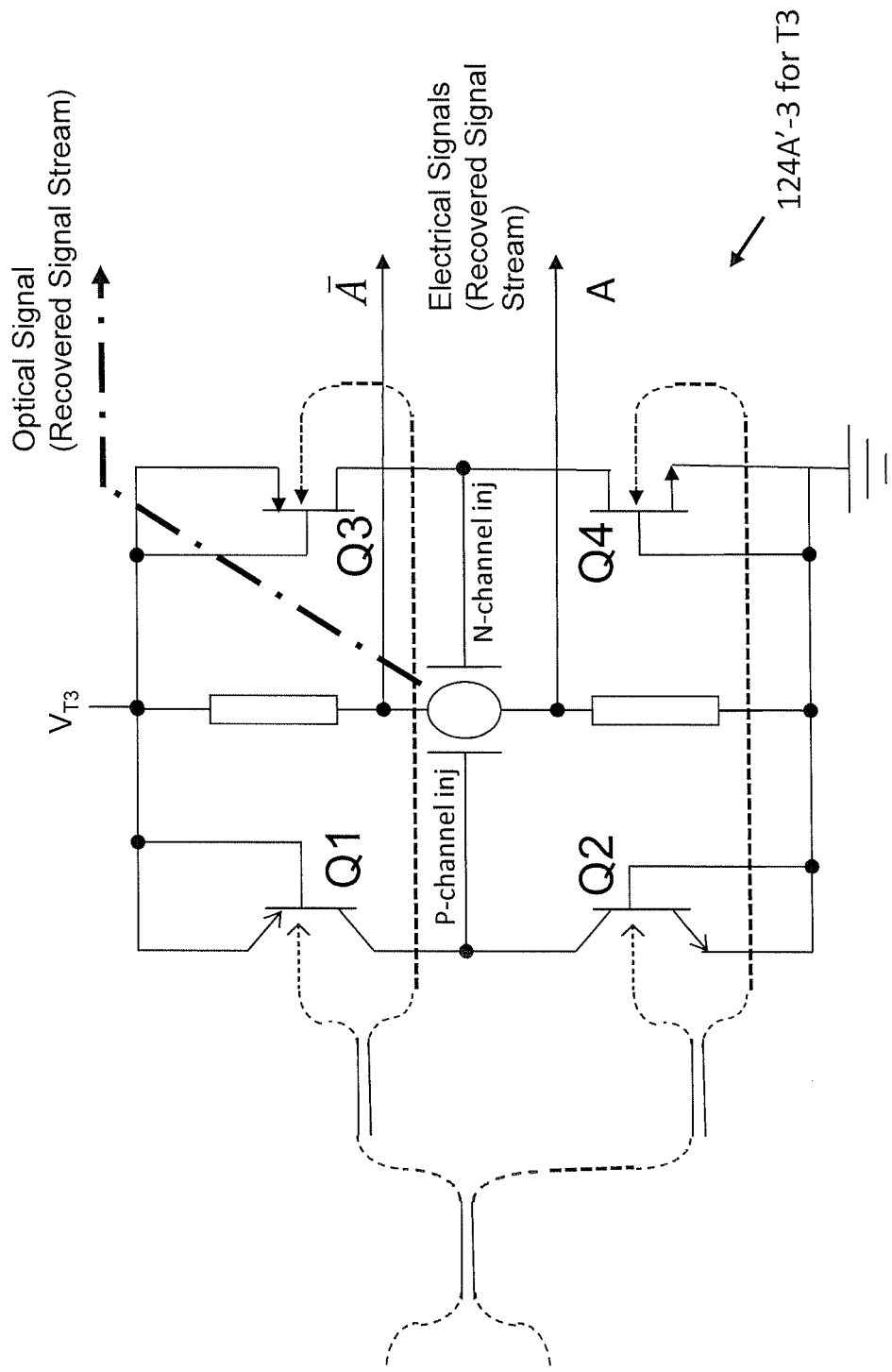
FIG. 10H is a schematic circuit diagram of part of the optical PSK-QAM detector of FIGS. 10A and 10B for detecting the phases of the T3 amplitude modulation level.

FIG. 10H shows an embodiment for one part (the BPSK detector for the A3 signal) of the optical QPSK detector 124A'-3 for the T3 level of amplitude modulation. In this embodiment, the voltage supply potential ($V_{T3}$) is configured to set the switching threshold of the thyristor 307 such that is larger than the switching threshold for the thyristor 307 of the optical QPSK detector 124A'-2 for the T2 level of amplitude modulation. A similar configuration is used for the other part (the BPSK detector for the B3 signal) of the optical QPSK detector 124A'-3 for the T3 level of amplitude modulation.

Figure 10I:
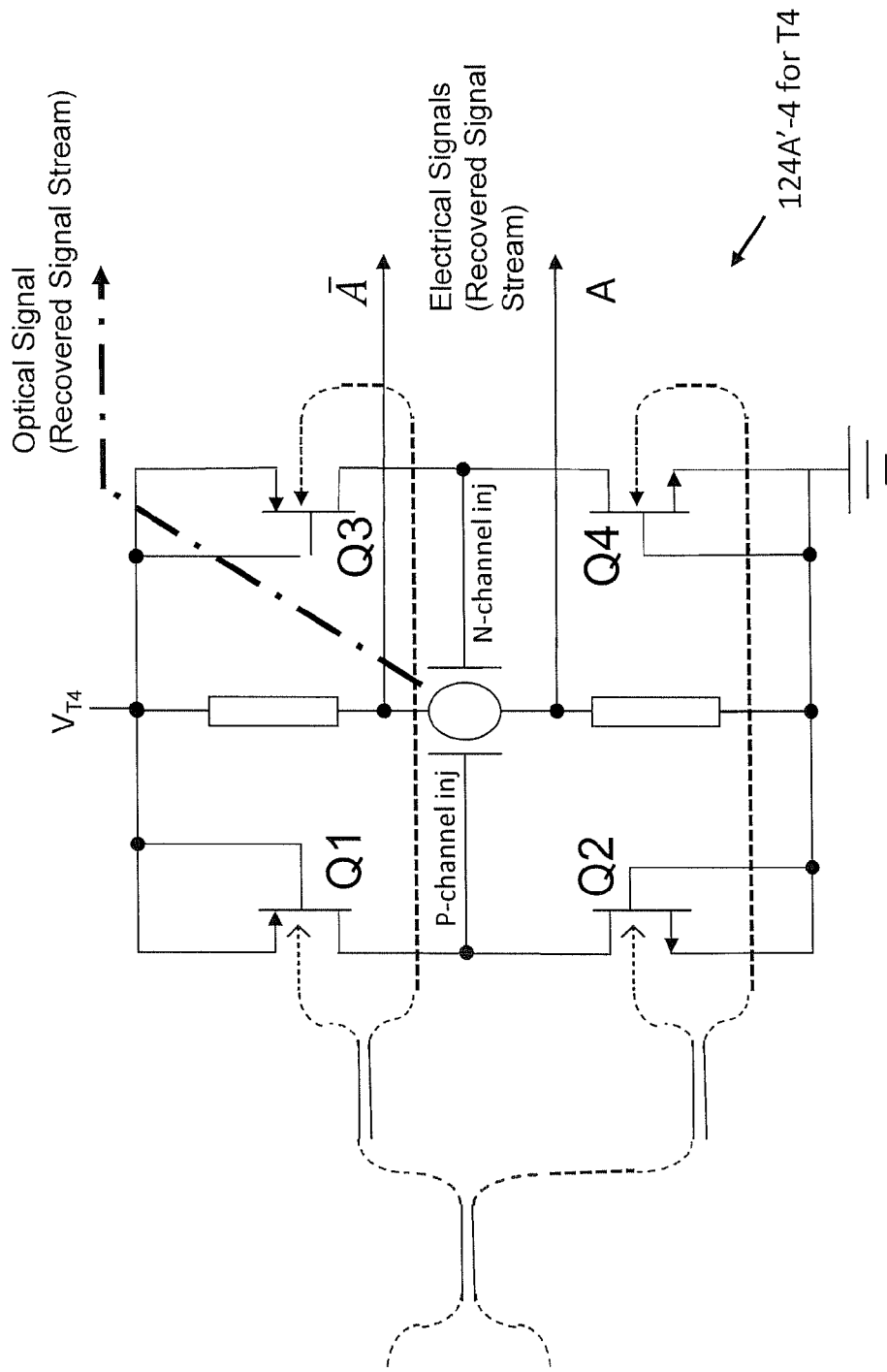
FIG. 10I is a schematic circuit diagram of part of the optical PSK-QAM detector of FIGS. 10A and 10B for detecting the phases of the T4 amplitude modulation level.

FIG. 10I shows an embodiment for one part (the BPSK detector for the A4 signal) of the optical QPSK detector 124A'-4 for the T4 level of amplitude modulation. In this embodiment, the voltage supply potential ($V_{T4}$) is configured to set the switching threshold of the thyristor 307 such that is larger than the switching threshold for the thyristor 307 of the optical QPSK detector 124A'-2 for the T3 level of amplitude modulation. A similar configuration is used for the other part (the BPSK detector for the B4 signal) of the optical QPSK detector 124A'-4 for the T4 level of amplitude modulation.

Figure 10J:
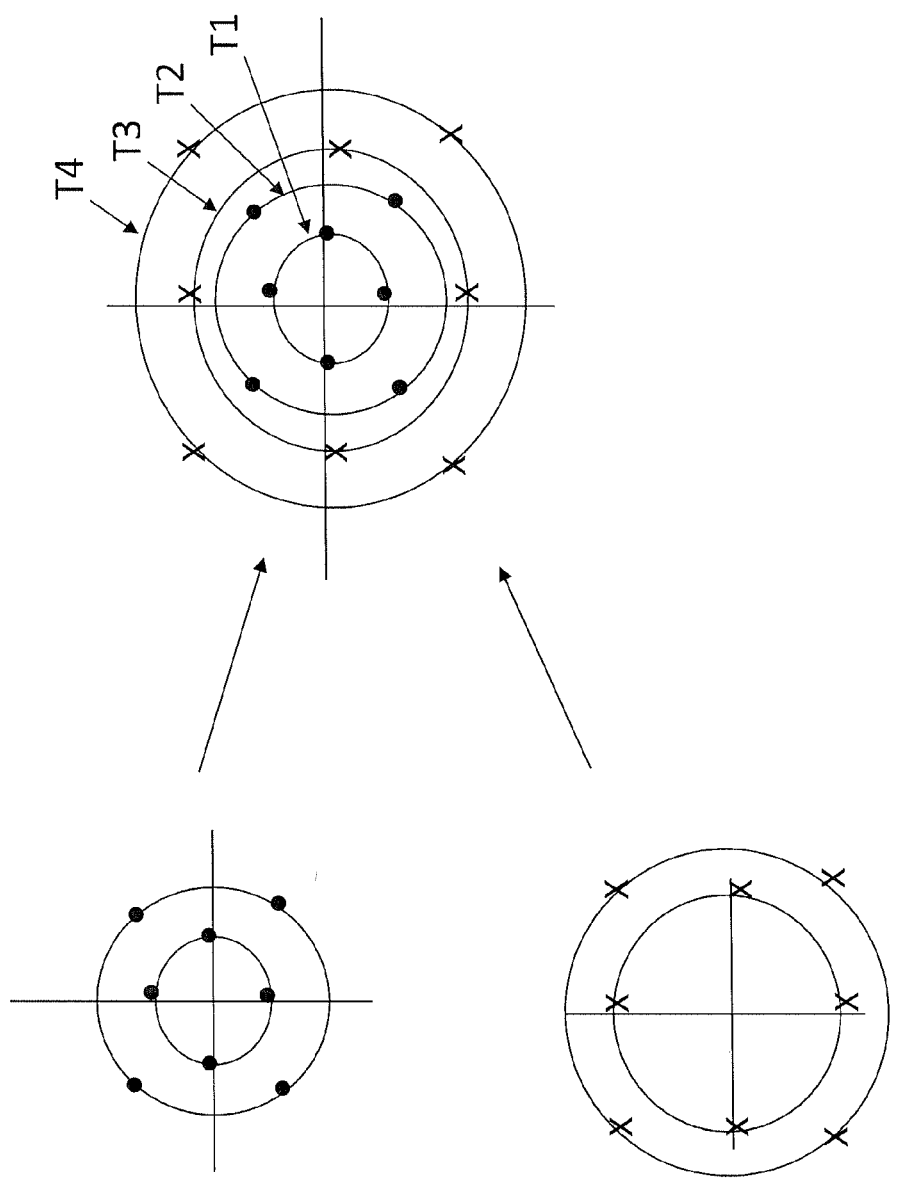
FIG. 10J shows the full constellation diagram of the exemplary mapping of phases and four amplitude modulations (T1, T2, T3 and T4) to sixteen symbols that can be detected by the optical PSK-QAM detector of FIGS. 10A and 10B.

FIG. 10J shows the combination of the constellation diagrams of FIGS. 10D and 10G to show the sixteen possible combinations of amplitude modulation levels (T1/T2/T3/T4) and phase offsets of the received optical carrier signal that can be represented by the binary levels of the digital electrical signals A1, B1, A2, B2, A3, B3, A4, B4. Note that the four possible phase offsets for each amplitude modulation level are 90 degrees (or $\pi/2$ radians) apart from one another.

Optical Phase Lock Loop/Clock Recovery Block

Figure 11:
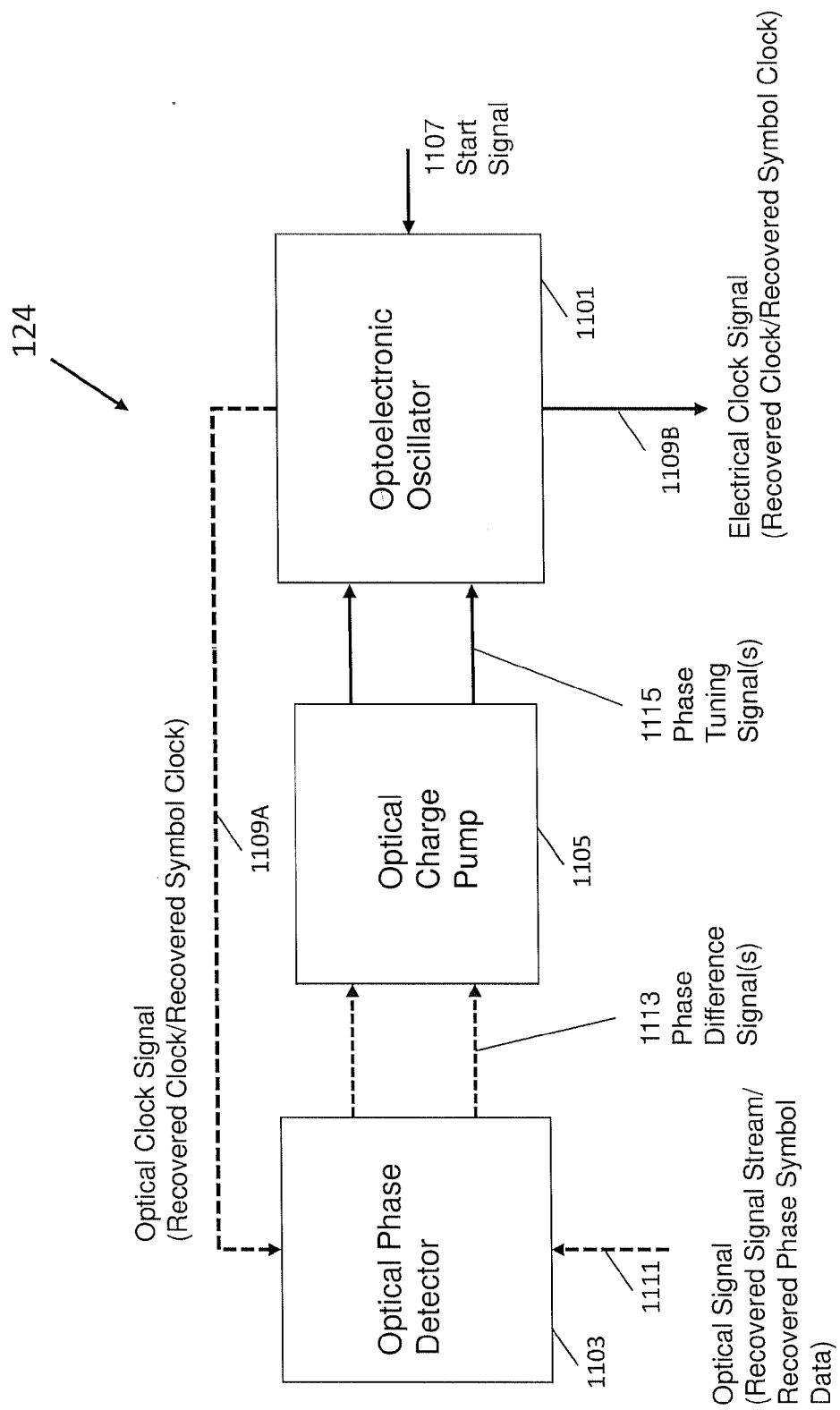
FIG. 11 is a schematic block diagram of an exemplary embodiment of the optical phase lock loop (OPPL) that functions as clock recovery circuit suitable for use in the coherent optical receivers of FIGS. 2A and 5.

FIG. 11 is a block diagram illustrating an embodiment of the clock recovery block 124 of FIG. 2B (and FIG. 5), which is realized by an optical phase lock loop that includes a phase-tunable optoelectronic oscillator 1101, an optical phase detector 1103 and an optical charge pump and loop filter circuit 1105. The clock recovery block (particularly the optical phase detector 1103) is supplied with a reference optical signal input (in this example, the digital optical signal input 1111 generated by the PSK detector, which represents a recovered signal stream of symbols carried by a received phase-shifted optical carrier signal). The symbol clock employed by a transmitter in modulating the phase of the optical carrier signal is embedded in this digital optical signal input 1111. The phase-tunable optoelectronic oscillator 1101 of the clock recovery block is configured to produce an optical clock signal (and corresponding electrical clock signal) having ON/OFF transitions that are synchronized to the timing of the reference optical signal input (in this example, the timing of symbol clock of the transmitter embedded in the digital optical signal input 1111).

The optoelectronic oscillator 1101 produces an optical clock signal 1109A and corresponding electrical clock signal 1109B upon activation by a start signal 1107. The phase of both the optical clock signal 1109A and the corresponding electrical clock signal 1109B is tuned according to one or more phase tuning signals 1115 that are supplied to the optoelectronic oscillator 1101. The digital optical signal input 1111 generated by the PSK detector as well as the optical clock signal 1109A produced by the optoelectronic oscillator 1101 are supplied by waveguides to the optical phase detector 1103, which functions to determine the digital phase difference (or equivalently to determine the difference in digital phase) between the digital optical signal input 1111 and the optical clock signal 1109A and outputs one or more optical phase difference signals 1113 representative of such phase difference to the optical charge pump and loop filter 1105. The optical charge pump and loop filter circuit 1005 functions as a loop filter to integrate the optical phase difference signals 1113 over time and generate the phase tuning signal(s) 1115 for control of the phase of the optical clock signal 1109A (as well as the phase of the corresponding electrical clock signal 1109B) such that it matches the phase of the symbol clock signal embedded within the digital optical signal input 1111. In the locked state where the phase of the optical clock signal 1109A (and the phase of the corresponding electrical clock signal 1109B) matches the phase of the symbol clock signal, the frequency of the optical clock signal 1109A (and the frequency of the corresponding electrical clock signal 1109B) matches the frequency of the symbol clock signal. In this manner, the clock recovery block 124 operates to automatically tune the frequency and phase of the optical clock signal 1109A (and the frequency and phase of the corresponding electrical clock signal 1109B) into this locked state in order to recover the symbol clock signal embedded in the digital optical signal input 1111.

The optical phase lock loop of FIG. 11 can be adapted to perform a wide variety of other functions beyond clock recovery. Such applications can include clock generation (such as up-conversion of a low frequency clock to a higher frequency clock or down-conversion of a higher frequency clock to a lower frequency clock), generation of local oscillating signals for communication systems (such as generation of local oscillating signals for modulation and demodulation), and clock distribution and jitter compensation in integrated circuits, instrumentation systems and communication systems.

Optical Phase Detector

Figure 12A:
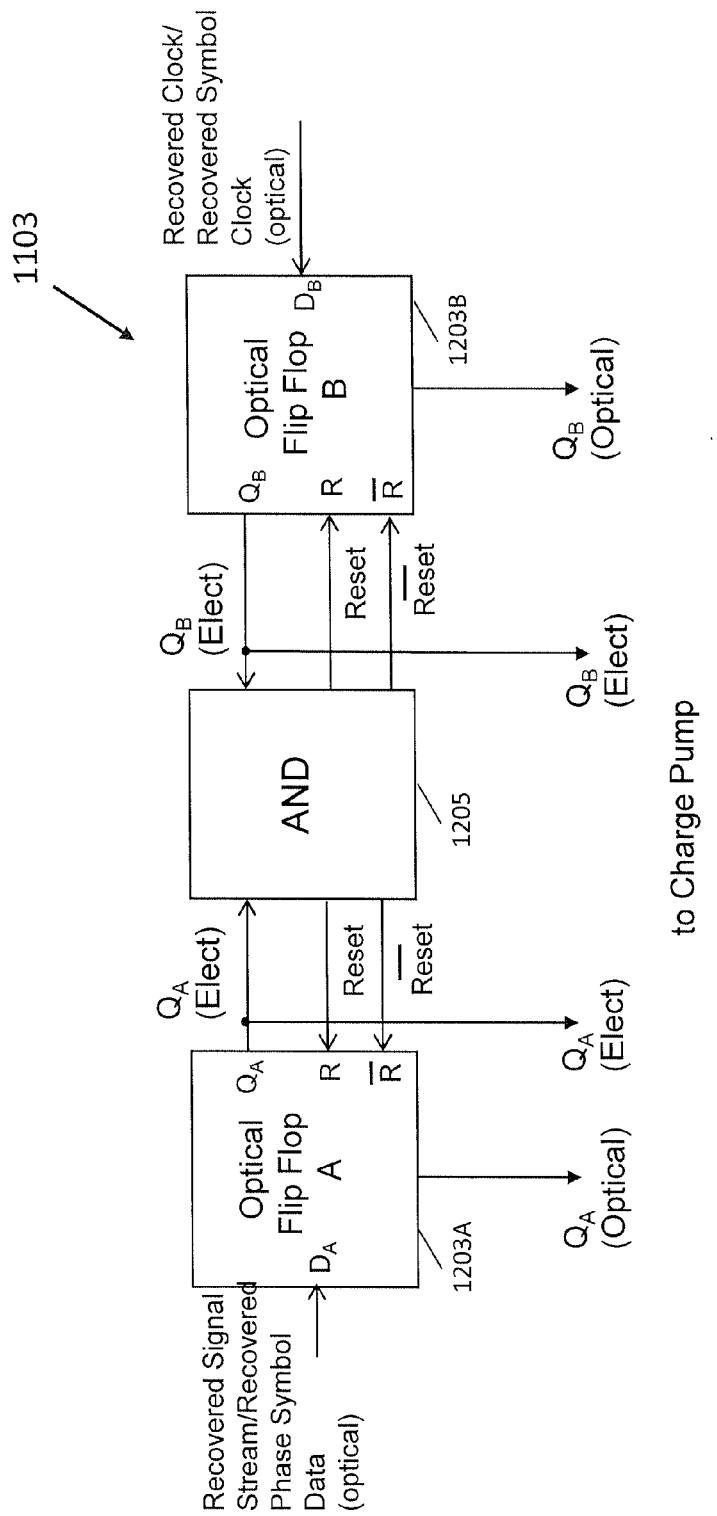
FIG. 12A is a schematic diagram of an exemplary embodiment of optical phase detector suitable for use in the optical phase lock loop (clock recovery circuit) of FIG. 11.

FIG. 12A illustrates an embodiment of the optical phase detector 1103 of FIG. 11, which includes an AND gate 1205 operably coupled between two optical flip-flops 1203A and 1203B. The optical flip-flop 1203A receives the digital optical signal input ($D_A$) 1111 at its $D_A$ input and functions to generate a digital optical signal output $Q_A$ and corresponding digital electrical signal output $Q_A$ based on the binary level of the complementary digital electrical Reset/$\overline{\text{Reset}}$ signals at its R/$\overline{\text{R}}$ inputs and the digital optical signal input ($D_A$) 1111 at its $D_A$ input according to the table of FIG. 12B. The optical flip-flop 1203B receives the optical clock signal ($D_B$) 1109A at its $D_B$ input and functions to generate a digital optical signal output $Q_B$ and corresponding digital electrical signal output $Q_B$ based on the binary level of the complementary digital electrical Reset/Reset signals at its R/R inputs and the clock signal ($D_B$) 1109A at its $D_B$ input according to table of FIG. 12C. The AND gate 1205 receives the digital electrical output signals $Q_A$ and $Q_B$ output by the optical flip-flops 1203A and 1203B and generates the complementary electrical Reset/$\overline{\text{Reset}}$ signals according to the table of FIG. 12D. The complementary electrical Reset/$\overline{\text{Reset}}$ signals are supplied to the R and R inputs of both optical flip-flops 1203A and 1203B.

In this configuration, the ON level of the digital optical signal input $Q_A$ (and the corresponding high level of the digital electrical signal output $Q_A$) represents the digital phase difference between the digital optical signal input 1111 and the optical clock signal 1109A (where the digital optical signal input 1111 is ON and the optical clock signal 1109A is OFF). Similarly, the ON level of the digital optical signal output $Q_B$ (and the corresponding high level of the electrical signal $Q_B$) represented the digital phase difference between the optical clock signal 1109A and the digital optical signal input 1111 (where the optical clock signal 1109A is ON and the digital optical signal input 1111 is OFF). The digital electrical and optical signal $Q_A$ as well as the digital electrical and optical signals $Q_B$ are output to the optical charge pump and filter circuit 1105.

The optical charge pump and filter circuit 1105 operates as a loop filter that converts the digital optical signal $Q_A$ into a corresponding voltage signal that tracks whether the digital optical signal output $Q_A$ (and the corresponding digital electrical signal $Q_A$) is greater than the digital optical signal output $Q_B$ (and the corresponding digital electrical signal $Q_B$) over time. This output is used as a phase tuning signal 1115 supplied to the optoelectronic oscillator 1101 in order to increase the frequency of the optical clock signal 1109A and the corresponding electrical clock signal 1109B generated by the optoelectronic oscillator 1101. The optical charge pump and loop filter circuit 1105 also operates as a loop filter that converts the digital optical signal $Q_B$ into a corresponding voltage signal that tracks whether the digital optical signal output $Q_B$ (and the corresponding digital electrical signal $Q_B$) is greater than the digital optical signal output $Q_A$ (and the corresponding digital electrical signal $Q_A$) over time. This output is used as a phase tuning signal 1115 supplied to the optoelectronic oscillator 1101 in order to decrease the frequency of the optical clock signal 1109A and the corresponding electrical clock signal 1109B generated by the optoelectronic oscillator 1101. In this configuration, the frequency and phase of the optical clock signal 1109A and the corresponding electrical clock signal 1109B generated by the optoelectronic oscillator 1101 will be adjusted such that it matches the frequency and phase of the symbol clock for the recovered digital optical signal input 1111.

Figure 13A:
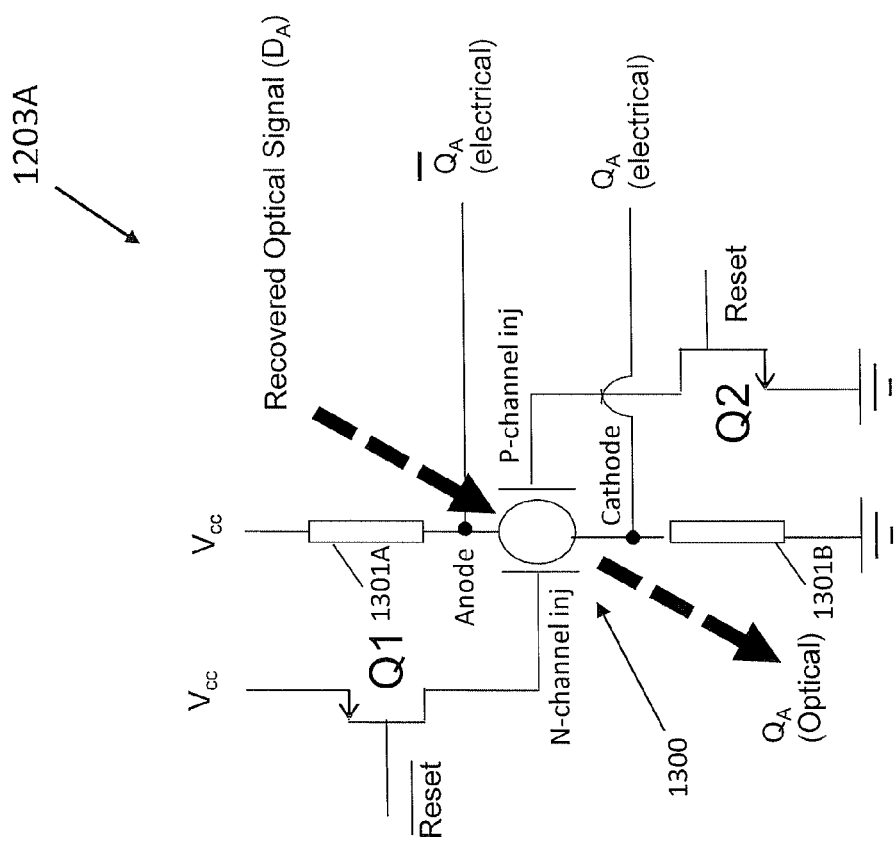
FIG. 13A is a schematic circuit diagram of an exemplary embodiment of an optical flip-flop, which is configured for use as the optical flip-flop A of FIG. 12A.

FIG. 13A illustrates an embodiment of the optical flip-flop 1203A of FIG. 12A. The optical flip-flop is a circuit that has two stable states and can be used to store state information. The circuit can be made to change state by signals applied to one or more control inputs (where at least one control input is an optical signal) and will have one or more outputs (where one or more of such outputs can be an optical signal). It can be used as basic storage element in sequential logic. It also can be used as a fundamental building block of digital electronics systems used in computers, communications, and many other types of systems. When used in a finite-state machine, the output and next state depend not only on its current input, but also on its current state (and hence, previous inputs). It can also be used for counting of pulses, and for synchronizing variably-timed input signals to some reference timing signal.

A waveguide (not shown), which is the $D_A$ input of the optical flip-flop 1203A, supplies an optical control input signal (in this example, the recovered digital optical signal input 1111) to the waveguide region of a four terminal vertical thyristor (N region-P region-N region-P region) 1300 with a split load. A first load element 1301A is coupled between the positive voltage supply ($V_{cc}$) and the anode terminal of the thyristor 1300. A second load element 1301B is coupled between the cathode terminal of the thyristor 1300 and the negative voltage supply (ground). The thyristor 1300 also has a p-channel injector terminal and an n-channel injector terminal. A p-channel HFET transistor Q1 is coupled between the positive voltage supply ($V_{cc}$) and the n-channel injector terminal. An n-channel HFET transistor Q2 is coupled between the negative voltage supply (ground) and the p-channel injector terminal. Two complementary electrical control inputs (Reset/$\overline{Reset}$ signals), which in this example are output by the AND gate 1205, are supplied as inputs to the optical flip-flop 1203A. The electrical $\overline{Reset}$ signal is supplied as an input to the gate terminal of the p-channel HFET transistor Q1. The electrical Reset signal is supplied as an input to the gate terminal of the n-channel HFET transistor Q2. The p-channel HFET transistor Q1 is activated and operates as a turn-off transistor for the thyristor 1300 when the level of the electrical $\overline{Reset}$ signal is low. The n-channel HFET transistor Q2 is activated and operates as a turn-off transistor for the thyristor 1300 when the level of the electrical Reset signal is high. The complementary nature of the electrical Reset and $\overline{Reset}$ signals dictates that the p-channel HFET transistor Q1 and the n-channel HFET transistor Q2 are activated at the same time when the level of the electrical $\overline{Reset}$ signal is low and the level of the complementary electrical Reset signal is high. When activated, the p-channel HFET transistor Q1 drains electron current from (i.e., supplies hole current to) the n-channel injector and the n-channel HFET transistor Q2 drains hole current from (i.e., supplies electron current to) the p-channel injector of the thyristor 1300 such that the thyristor 1300 switches OFF and there is minimal current conduction between the anode terminal and the cathode terminal of the thyristor 1300. When the electrical $\overline{Reset}$ signal is high (and the complementary electrical Reset signal is low) and the optical control input signal (in this example, the recovered digital optical signal input 1111) is ON, the optical control input signal is absorbed by the thyristor 1300 in order to introduce majority charge carriers into the thyristor 1300. Such absorbed charge is sufficient to operate the thyristor 1300 in its ON state where it conducts current vertically between the anode terminal and the cathode terminal of the thyristor 1300. In this ON state, the current that conducts vertically between the anode terminal and the cathode terminal is above the lasing threshold of the thyristor 1300 in order to produce a digital optical signal $Q_A$ that is emitted from the thyristor 1300. A corresponding digital electrical signal $Q_A$ is produced at the cathode terminal of the thyristor 1300. Note that the current draining operations of the HFET transistors Q1 and Q2 that operate the thyristor 1300 in its OFF state in response to the electrical $\overline{Reset}$ signal being low (and the complementary electrical Reset signal being high) overrides the ON state operation of the thyristor 1300 triggered by the ON state of the optical control input signal. This arises because the HFET transistors Q1 and Q2 force the OFF state of the thyristor 1300. In this manner, the ON and OFF states of the thyristor 1300 emits a digital (ON/OFF) optical signal $Q_A$ and generates a corresponding digital electrical signal $Q_A$ at the cathode terminal of the thyristor 1300. The ON/OFF states of the digital optical signal $Q_A$ and corresponding binary levels of the digital electrical signal $Q_A$ correspond to the binary levels of the recovered digital optical signal 1111 ($D_A$) and the complementary electrical Reset/$\overline{Reset}$ signals according to the table of FIG. 12B.

Figure 13B:
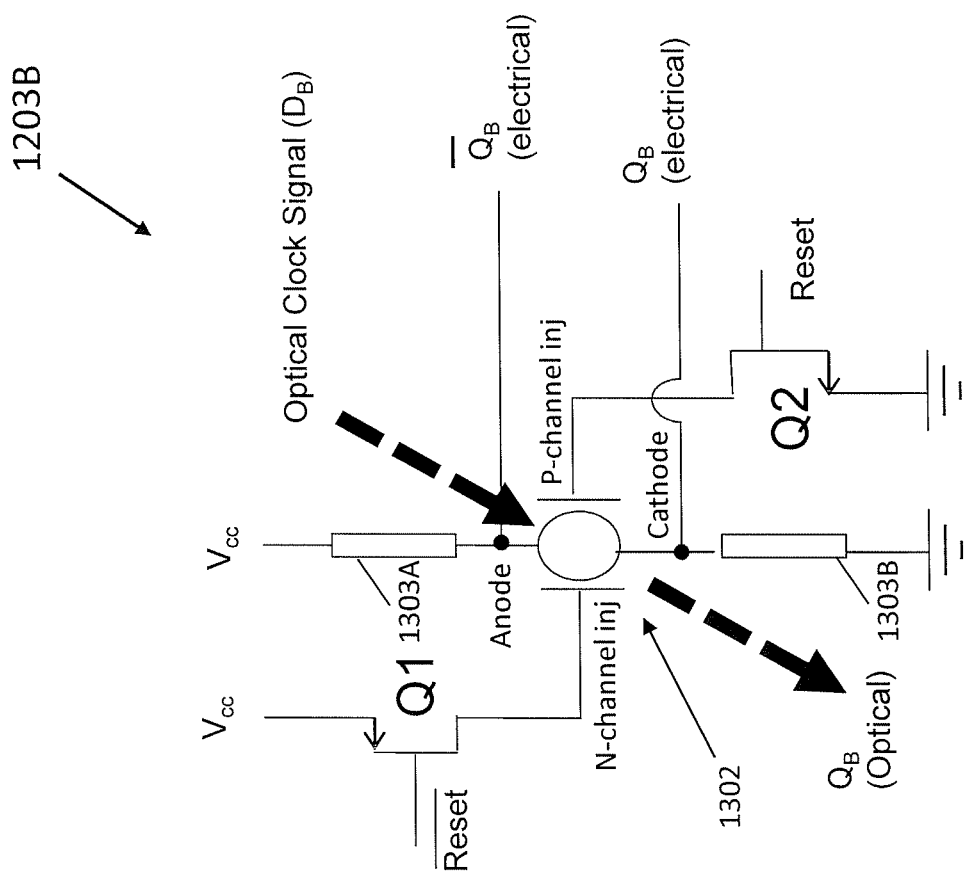
FIG. 13B is a schematic circuit diagram of an exemplary embodiment of an optical flip flop, which is configured for use as the optical flip-flop B of FIG. 12A.

FIG. 13B illustrates an embodiment of the optical flip-flop 1203B of FIG. 12A similar to the optical flip-flip of FIG. 13A. A waveguide (not shown), which is the $D_B$ input of the optical flip-flop 1203B, supplies an optical control input signal (in this example, the optical clock signal 1009A) to the waveguide region of a four terminal vertical thyristor (N region-P region-N region-P region) 1302 with a split load. A first load element 1303A is coupled between the positive voltage supply ($V_{cc}$) and the anode terminal of the thyristor 1302. A second load element 1303B is coupled between the cathode terminal of the thyristor 1303 and the negative voltage supply (ground). The thyristor 1302 also has a p-channel injector terminal and an n-channel injector terminal. A p-channel HFET transistor Q1 is coupled between the positive voltage supply ($V_{cc}$) and the n-channel injector terminal. An n-channel HFET transistor Q2 is coupled between the negative voltage supply (ground) and the p-channel injector terminal. Two complementary electrical control inputs (Reset/$\overline{Reset}$ signals), which in this example are output by the AND gate 1205, are supplied as inputs to the optical flip-flop 1203B. The electrical $\overline{\text{Reset}}$ signal is supplied as an input to the gate terminal of the p-channel HFET transistor Q1. The electrical Reset signal is supplied as an input to the gate terminal of the n-channel HFET transistor Q2. The p-channel HFET transistor Q1 is activated and operates as a turn-off transistor for the thyristor 1302 when the level of the electrical $\overline{\text{Reset}}$ signal is low. The n-channel HFET transistor Q2 is activated and operates as a turn-off transistor for the thyristor 1302 when the level of the electrical Reset signal is high. The complementary nature of the electrical Reset and $\overline{\text{Reset}}$ signals dictates that the p-channel HFET transistor Q1 and the n-channel HFET transistor Q2 are activated at the same time when the level of the electrical $\overline{\text{Reset}}$ signal is low and the level of the complementary electrical Reset signal is high. When activated, the p-channel HFET transistor Q1 drains electron current from (i.e., supplies hole current to) the n-channel injector and the n-channel HFET transistor Q2 drains hole current from (i.e., supplies electron current to) the p-channel injector of the thyristor 1302 such that the thyristor 1302 switches OFF and there is minimal current conduction between the anode terminal and the cathode terminal of the thyristor 1302. When the electrical $\overline{\text{Reset}}$ signal is high (and the complementary electrical Reset signal is low) and the optical control input signal (in this example, optical clock signal 1009A) is ON, the optical control input signal is absorbed by the thyristor 1302 in order to introduce majority charge carriers into the thyristor 1302. Such absorbed charge is sufficient to operate the thyristor 1302 in its ON state where it conducts current vertically between the anode terminal and the cathode terminal of the thyristor 1302. In this ON state, the current that conducts vertically between the anode terminal and the cathode terminal is above the lasing threshold of the thyristor 1302 in order to produce a digital optical signal $Q_B$ that is emitted from the thyristor 1302. A corresponding digital electrical signal $Q_B$ is produced at the cathode terminal of the thyristor 1302. Note that the current draining operations of the HFET transistors Q1 and Q2 that operate the thyristor 1302 in its OFF state in response to the electrical $\overline{\text{Reset}}$ signal being low (and the complementary electrical Reset signal being high) overrides the ON state operation of the thyristor 1302 triggered by the ON state of the optical control input signal. This arises because the HFET transistors Q1 and Q2 force the OFF state of the thyristor 1302. In this manner, the ON and OFF states of the thyristor 1302 emits a digital (ON/OFF) optical signal $Q_B$ and generates a corresponding digital electrical signal $Q_B$ at the cathode terminal of the thyristor 1302. The ON/OFF states of the digital optical signal $Q_B$ and corresponding binary levels of the digital electrical signal $Q_B$ correspond to the ON/OFF states of the optical clock signal 1009A ($D_B$) and the complementary electrical Reset/$\overline{\text{Reset}}$ signals according to the table of FIG. 12C.

Figure 14A:
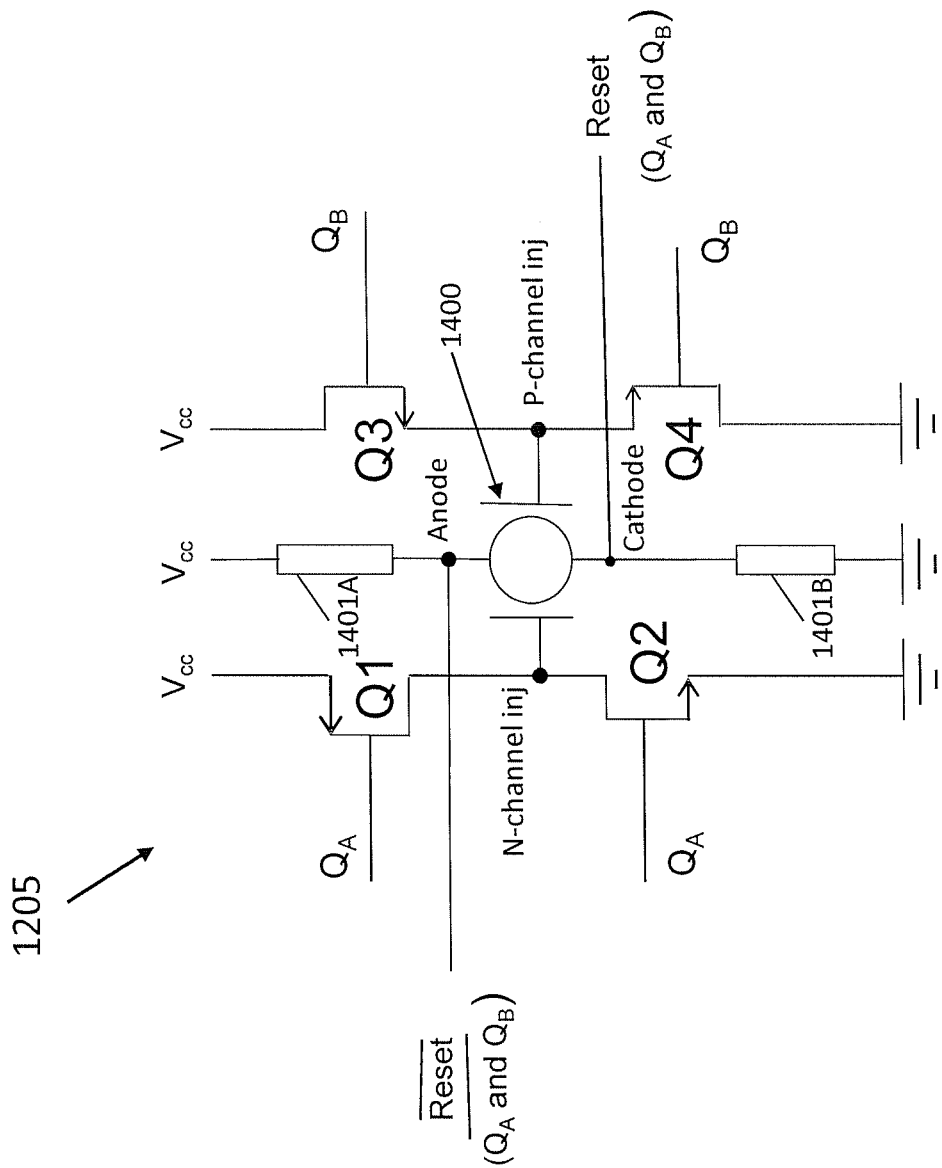
FIG. 14A is a schematic circuit diagram of an exemplary embodiment of an AND gate, which is configured for use as the AND gate of FIG. 12A.

FIG. 14A illustrates an embodiment of an AND gate 1205 of FIG. 12 with electrical inputs. The AND gate 1205 is basic digital logic gate produces a digital electrical output signal (in this example, the electrical Reset signal) that is the logical conjunction (the Boolean AND function) of two digital electrical inputs (in this example, the digital electrical signals $Q_A$ and $Q_B$) according to the table of FIG. 12D. The AND gate 1205 includes a four terminal vertical thyristor (N region-P region-N region-P region) 1400 with a split load. A first load element 1401A is coupled between the positive voltage supply ($V_{cc}$) and the anode terminal of the thyristor 1400. A second load element 1401B is coupled between the cathode terminal of the thyristor 1400 and the negative voltage supply (ground). The thyristor 1400 also has a p-channel injector terminal and an n-channel injector terminal.

A p-channel HFET transistor Q1 and an n-channel HFET transistor Q2 are coupled in series between the positive voltage supply ($V_{cc}$) and the negative voltage supply (ground). The p-channel HFET transistor Q1 has a source terminal connected to the positive voltage supply ($V_{cc}$). The n-channel HFET transistor Q2 has a source terminal connected to the negative voltage supply (ground). The drain terminal of the p-channel HFET transistor Q1 and the drain terminal of the n-channel HFET transistor Q2 are coupled together and to the n-channel injector terminal of the thyristor 1400. An re-channel HFET transistor Q3 and a p-channel HFET transistor Q4 are coupled in series between the positive voltage supply ($V_{cc}$) and the negative voltage supply (ground). The n-channel HFET transistor Q3 has a drain terminal connected to the positive voltage supply ($V_{cc}$). The p-channel HFET transistor Q4 has a drain terminal connected to the negative voltage supply (ground). The source terminal of the n-channel HFET transistor Q3 and the source terminal of the p-channel HFET transistor Q4 are coupled together and to the p-channel injector terminal of the thyristor 1400.

The digital electrical input $Q_A$ (which is supplied from the optical flip-flop 1203A in this example) is supplied as an input to the gate terminals of both the p-channel HFET transistor Q1 and the n-channel HFET transistor Q2. The digital electrical input $Q_B$ (which is supplied from the optical flip-flop 1203B in this example) is supplied as an input to the gate terminals of both the n-channel HFET transistor Q3 and the p-channel HFET transistor Q4. In this configuration, the n-channel HFET transistor Q2 is activated and operates as a turn-on transistor for the thyristor 1400 when the binary level of the digital electrical input $Q_A$ is high. When activated, the n-channel HFET transistor Q2 supplies electron current to the n-channel injector. Similarly, the n-channel HFET transistor Q3 is activated and operates as a turn-on transistor for the thyristor 1400 when the binary level of the digital electrical input $Q_B$ is high. When activated, the n-channel HFET transistor Q3 supplies hole current to the p-channel injector. The currents injected by both the n-channel HFET transistors Q2 and Q3 are configured such that the thyristor 1400 operates in its ON state where it conducts current vertically between the anode terminal and the cathode terminal of the thyristor 1400. The p-channel HFET transistor Q1 is activated and operates as a turn-off transistor for the thyristor 1400 when the binary level of the digital electrical input $Q_A$ is low. When activated, the p-channel HFET transistor Q1 draws electron current from (i.e., supplies hole current to) the n-channel injector such that the thyristor 1400 operates in its OFF state where there is minimal current conduction vertically between the anode and the cathode terminal of the thyristor 1400. Similarly, the p-channel HFET transistor Q4 is activated and operates as a turn-off transistor for the thyristor 1400 when the binary level of the digital electrical input $Q_B$ is low. When activated, the p-channel HFET transistor Q4 draws hole current from (i.e., supplies electron current to) the p-channel injector such that the thyristor 1400 operates in its OFF state. Thus, when both of the digital electrical signals $Q_A$ and $Q_B$ are high, the thyristor 1400 operates in its ON state. When either one (but not both) of the digital electrical signals $Q_A$ and $Q_B$ are high, the thyristor 1400 operates in its OFF state. When either one (and possibly both) of the digital electrical signals $Q_A$ and $Q_B$ are low, the thyristor 1400 operates in its OFF state.

The ON and OFF states of the thyristor 1400 generates the digital electrical $\overline{\text{Reset}}$ signal at the anode terminal of the thyristor 1400 and a complementary Reset signal (of opposite polarity) at the cathode terminal of the thyristor 1400. In this configuration, the binary levels of the digital electrical Reset signal for the ON and OFF states of the thyristor 1400 corresponds to the logical conjunction (the Boolean AND function) of two digital electrical inputs $Q_A$ and $Q_B$ according to the table of FIG. 12D.

Figure 14B:
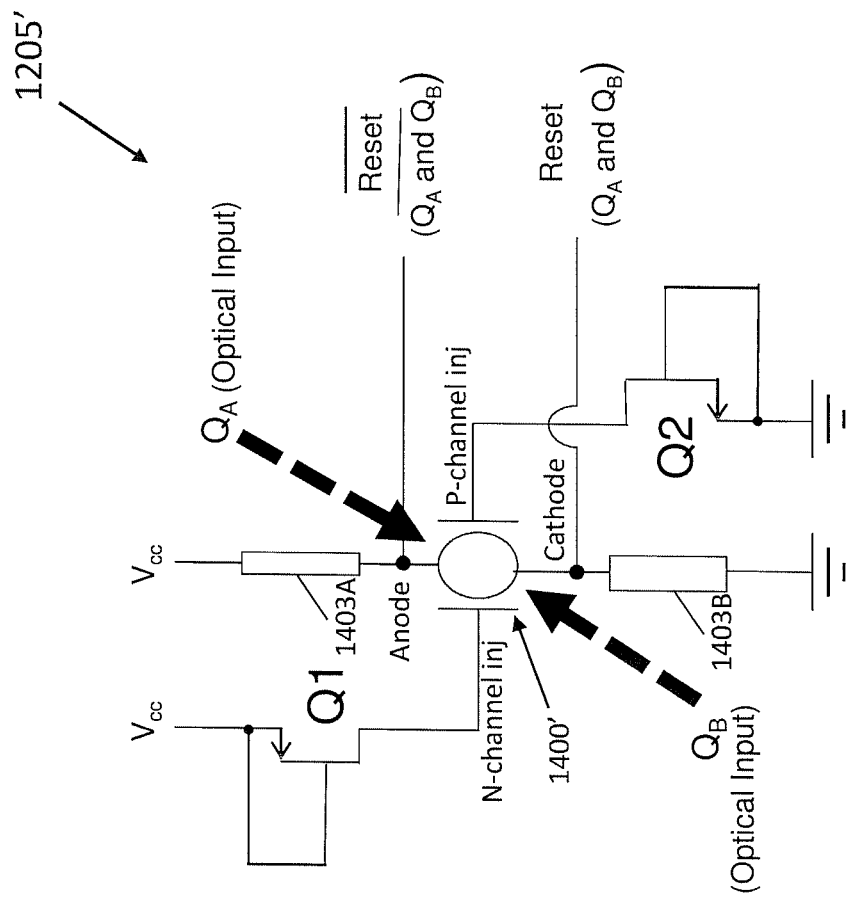
FIG. 14B is a schematic circuit diagram of an exemplary embodiment of an optical AND gate, which is configured for use as the AND gate of FIG. 12A.

FIG. 14B illustrates an embodiment of an AND gate 1205' with optical inputs suitable for use in the circuit of FIG. 12. The AND gate 1205' is basic digital logic gate produces a digital electrical output signal (in this example, the electrical Reset signal) that is the logical conjunction of two digital optical inputs (in this example, the digital optical signals $Q_A$ and $Q_B$) according to the table of FIG. 12D. The AND gate 1205' includes a four terminal vertical thyristor (N region-P region-N region-P region) 1400' with a split load. A first load element 1403A is coupled between the positive voltage supply ($V_{cc}$) and the anode terminal of the thyristor 1400'. A second load element 1403B is coupled between the cathode terminal of the thyristor 1400' and the negative voltage supply (ground). The thyristor 1400' also has a p-channel injector terminal and an n-channel injector terminal.

A p-channel HFET transistor Q1 is coupled between the positive voltage supply ($V_{cc}$) and the n-channel injector terminal of the thyristor 1400'. The source terminal and gate terminal of the p-channel HFET transistor Q1 are connected to the positive voltage supply ($V_{cc}$). The drain terminal of the p-channel HFET transistor Q1 is coupled to the n-channel injector terminal of the thyristor 1400'. An n-channel HFET transistor Q2 is coupled between the negative voltage supply (ground) and the p-channel injector terminal of the thyristor 1400'. The source terminal and gate terminal of the re-channel HFET transistor Q2 are connected to the negative voltage supply (ground). The drain terminal of the n-channel HFET transistor Q2 is coupled to the p-channel injector terminal of the thyristor 1400'.

Waveguides (not shown) supply both the digital optical inputs $Q_A$ and $Q_B$ to the waveguide region of the thyristor 1400'. In this configuration, the digital optical inputs $Q_A$ and $Q_B$ are absorbed by the thyristor 1400' in order to introduce majority charge carriers into the thyristor 1400'. When both the digital optical inputs $Q_A$ and $Q_B$ are in the ON state, such absorbed charge is sufficient to operate the thyristor 1400' in its ON state where it conducts current vertically between anode terminal and the cathode terminal of the thyristor 1400'. The p-channel HFET transistor Q1 and the n-channel HFET transistor Q2 operate as a turn-off transistors for the thyristor 1400' when either one (but not both) of the digital optical inputs $Q_A$ and $Q_B$ are in the ON state such that the thyristor 1400 operates in its OFF state where there is minimal current conduction vertically between the anode and the cathode terminal of the thyristor 1400'. In the ON state of the thyristor 1400', the current that conducts vertically between anode terminal and the cathode terminal of the thyristor 1400' generates the digital $\overline{\text{Reset}}$ output at the anode terminal of the thyristor 1400' and the complementary Reset output (of opposite polarity) at the cathode terminal of the thyristor 1400'. The bias configuration of the p-channel HFET transistor Q1 and the n-channel HFET transistor Q2 also operates the thyristor 1400' in its OFF state when both the digital optical signals $Q_A$ and $Q_B$ are in the OFF state. The ON and OFF states of the thyristor 1400' generates the digital $\overline{\text{Reset}}$ output at the anode terminal of the thyristor 1400' and the complementary Reset output (of opposite polarity) at the cathode terminal of the thyristor 1400'. In this configuration, the binary levels of the digital Reset output for the ON and OFF states of the thyristor 1400' corresponds to the logical conjunction (the Boolean AND function) of two digital electrical inputs $Q_A$ and $Q_B$ according to the table of FIG. 12D.

Optical Charge Pump

Figure 15A:
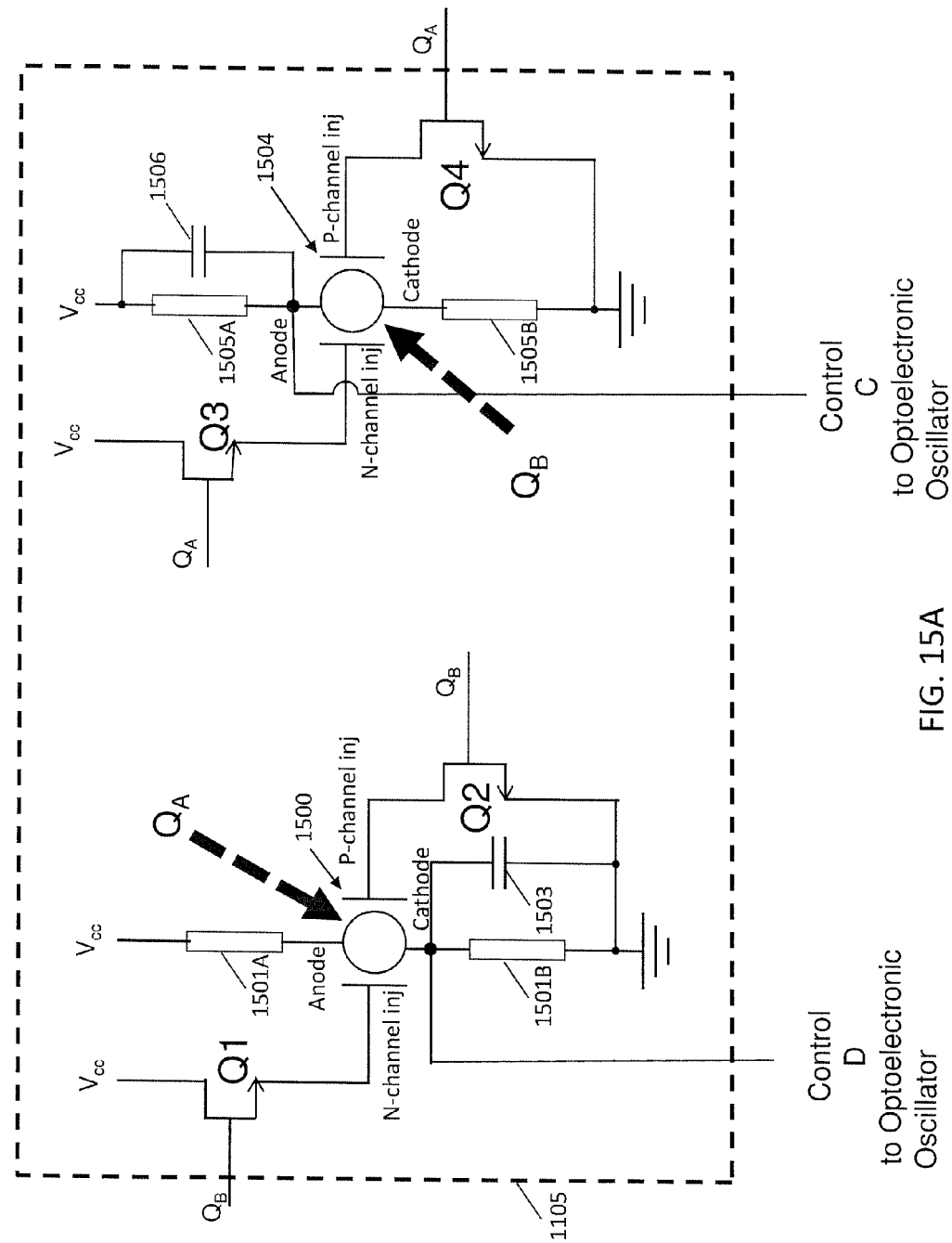
FIG. 15A is a schematic diagram of an exemplary embodiment of optical charge pump and loop filter circuit suitable for use in the optical phase lock loop (clock recovery circuit) of FIG. 11.

FIG. 15A illustrates an embodiment of an optical charge pump and filter circuit 1105 for use in the circuit of FIG. 11. The optical charge pump and filter circuit 1105 operates as a switched current source and loop filter where positive and negative current pulses are injected into two corresponding loop filter stages, where one loop filter stage outputs an electrical control output (control D signal) that is used to introduce a positive change in frequency to the optical clock signal 1109A and the corresponding electrical clock signal 1109B generated by the optoelectronic oscillator 1101, and where the other loop filter stage outputs an electrical control output (control C signal) that is used to introduce a negative change in frequency to the optical clock signal 1109A and the corresponding electrical clock signal 1109B generated by the optoelectronic oscillator 1101.

The optical charge pump and filter circuit 1105 includes two four terminal vertical thyristor (N region-P region-N region-P region) 1500 and 1504 each with a split load. For the thyristor 1500, a first load element 1501A is coupled between the positive voltage supply ($V_{cc}$) and the anode terminal of the thyristor 1500. A second load element 1501B and a capacitor 1503 are coupled in parallel between the cathode terminal of the thyristor 1500 and the negative voltage supply (ground). The parallel arrangement of the second load element 1501B and the capacitor 1503 coupled between the cathode terminal of the thyristor 1500 and the negative voltage supply (ground) functions as a loop filter stage that outputs an electrical control output (control D signal) that is used to introduce a positive change in frequency to the optical clock signal 1109A and the corresponding electrical clock signal 1109B generated by the optoelectronic oscillator 1101. The thyristor 1500 also has a p-channel injector terminal and an n-channel injector terminal. An n-channel HFET transistor Q1 is coupled between the positive voltage supply ($V_{cc}$) and the n-channel injector terminal of the thyristor 1500. The drain terminal of the n-channel HFET transistor Q1 is connected to the positive voltage supply ($V_{cc}$). The source terminal of the n-channel HFET transistor Q1 is coupled to the re-channel injector terminal of the thyristor 1500. An n-channel HFET transistor Q2 is coupled between the negative voltage supply (ground) and the p-channel injector terminal of the thyristor 1500. The source terminal of the n-channel HFET transistor Q2 is connected to the negative voltage supply (ground). The drain terminal of the n-channel HFET transistor Q2 is coupled to the p-channel injector terminal of the thyristor 1500. A waveguide (not shown) supplies the digital optical input $Q_A$ as input to the waveguide region of the thyristor 1500. The digital electrical input $Q_B$ is supplied as input to the gate terminals of the n-channel HFET transistors Q1 and Q2.

For the thyristor 1504, a first load element 1505A and a capacitor 1506 are coupled in parallel between the positive voltage supply ($V_{cc}$) and the anode terminal of the thyristor 1504. The parallel arrangement of the first load element 1505A and the capacitor 1506 coupled between the positive voltage supply and the anode terminal of the thyristor 1504 functions as a loop filter stage that outputs an electrical control output (control C signal) that is used to introduce a negative change in frequency to the optical clock signal 1109A and the corresponding electrical clock signal 1109B generated by the optoelectronic oscillator 1101. A second load element 1505B is coupled between the cathode terminal of the thyristor 1504 and the negative voltage supply (ground). The thyristor 1504 also has a p-channel injector terminal and an n-channel injector terminal. An n-channel HFET transistor Q3 is coupled between the positive voltage supply ($V_{cc}$) and the n-channel injector terminal of the thyristor 1504. The drain terminal of the re-channel HFET transistor Q3 is connected to the positive voltage supply ($V_{cc}$). The source terminal of the n-channel HFET transistor Q3 is coupled to the n-channel injector terminal of the thyristor 1504. An n-channel HFET transistor Q4 is coupled between the negative voltage supply (ground) and the p-channel injector terminal of the thyristor 1504. The source terminal of the n-channel HFET transistor Q4 is connected to the negative voltage supply (ground). The drain terminal of the n-channel HFET transistor Q4 is coupled to the p-channel injector terminal of the thyristor 1504. A waveguide (not shown) supplies the digital optical signal $Q_B$ as input to the waveguide region of the thyristor 1504. The digital electrical input $Q_A$ is supplied as input to the gate terminals of the n-channel HFET transistors Q3 and Q4.

In this configuration, the ON level of the digital optical signal $Q_A$ input (and the corresponding high level of the digital electrical signal $Q_A$ input) represents the phase difference between the recovered digital optical signal 1111 and the clock signal 1109A (where the recovered digital optical signal 1111 is ON and the clock signal 1109A is OFF). Similarly, the ON level of the digital optical signal $Q_B$ input (and the corresponding high level of the digital electrical signal $Q_B$ input) represents the phase difference between the clock signal 1109A and the recovered digital optical signal 1111 (where the clock signal 1109A is ON and the recovered digital optical signal 1111 is OFF).

Figure 15B:
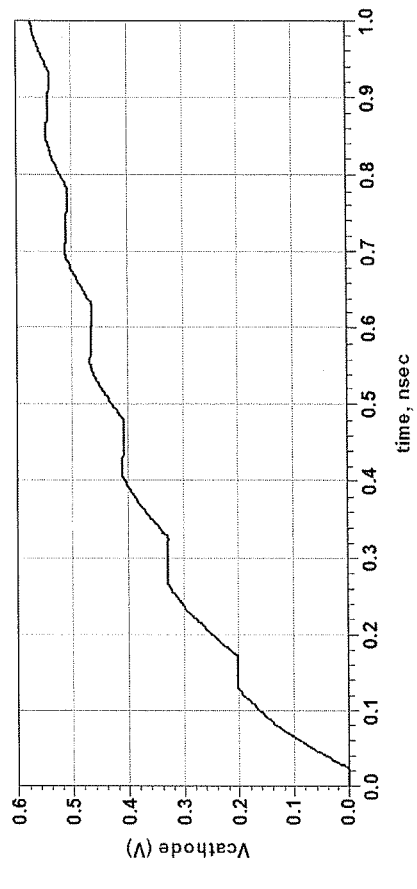
FIG. 15B is a graph illustrating an example of a control signal D generated by the optical charge pump and loop filter circuit of FIG. 15A.

The thyristor 1500 absorbs the digital optical signal $Q_A$ to introduce majority charge carriers in the thyristor 1500. The digital electrical signal $Q_B$ supplied as input to the gate terminal of the n-channel HFET transistor Q1 selectively activates (or deactivates) the drain-source current path of the n-channel HFET transistor Q1. When the digital electrical signal $Q_B$ is high, the drain-source current path of the n-channel HFET transistor Q1 is activated to drain electrons from the n-channel injector of the thyristor 1500. When the digital electrical signal $Q_B$ is low, the drain-source current path of the n-channel HFET transistor Q1 is deactivated such that there is minimal conduction from the n-channel injector of the thyristor 1500. Similarly, the digital electrical signal $Q_B$ supplied as input to the gate terminal of the n-channel HFET transistor Q2 selectively activates (or deactivates) the drain-source current path of the n-channel HFET transistor Q2. When the digital electrical input $Q_B$ is high, the drain-source current path of the re-channel HFET transistor Q2 is activated to drain holes from the p-channel injector of the thyristor 1500. When the digital electrical signal $Q_B$ is low, the drain-source current path of the n-channel HFET transistor Q2 is deactivated such that there is minimal conduction from the p-channel injector of the thyristor 1500. Thus, with the digital electrical signal $Q_B$ being high, the n-channel HFET transistors Q1 and Q2 are activated to drain majority carriers from the thyristor 1500 and counteract the introduction of majority carriers into the thyristor as a result of absorption of the digital optical signal $Q_A$. In this configuration, the thyristor 1500 switches ON to provide positive current that flows to the RC load provided by the parallel load 1501B and capacitor 1503 only when the digital optical signal $Q_A$ is ON and the digital electrical signal $Q_B$ is low (i.e., the corresponding digital optical signal $Q_B$ is OFF). With the thyristor 1500 in the ON state, the voltage potential of the cathode terminal of the thyristor 1500 increases and the RC load provided by the parallel load 1501B and capacitor 1503 operates as a filter stage that integrates such increases in the voltage potential of the cathode terminal over time. The result of such integration is an increasing voltage signal at the cathode terminal whose change over time tracks the phase offset of the digital optical signal $Q_A$ relative to the digital optical signal $Q_B$ over time. An example of the increasing voltage signal generated at the cathode terminal of the thyristor 1500 is shown in FIG. 15B. The cathode terminal voltage signal of the thyristor 1500 is used as a Control D signal that is output and supplied to the optoelectronic oscillator 1101 in order to introduce a positive change in frequency to the optical clock signal 1109A and the corresponding electrical clock signal 1109B generated by the optoelectronic oscillator 1101.

Figure 15C:
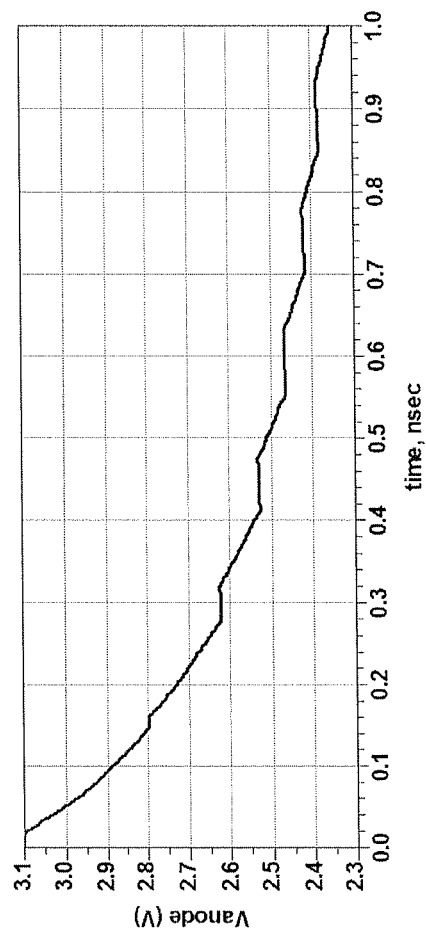
FIG. 15C is a graph illustrating an example of a control signal C generated by the optical charge pump and loop filter circuit of FIG. 15A.

The thyristor 1504 absorbs the digital optical signal $Q_B$ to introduce majority charge carriers in the thyristor 1504. The digital electrical signal $Q_A$ supplied as input to the gate terminal of the n-channel HFET transistor Q3 selectively activates (or deactivates) the drain-source current path of the n-channel HFET transistor Q3. When the digital electrical signal $Q_A$ is high, the drain-source current path of the n-channel HFET transistor Q3 is activated to drain electrons from the n-channel injector of the thyristor 1504. When the digital electrical signal $Q_A$ is low, the drain-source current path of the n-channel HFET transistor Q3 is deactivated such that there is minimal conduction from the n-channel injector of the thyristor 1504. Similarly, the digital electrical signal $Q_A$ supplied as input to the gate terminal of the n-channel HFET transistor Q4 selectively activates (or deactivates) the drain-source current path of the n-channel HFET transistor Q4. When the digital electrical signal $Q_A$ is high, the drain-source current path of the re-channel HFET transistor Q4 is activated to drain holes from the p-channel injector of the thyristor 1504. When the digital electrical signal $Q_A$ is low, the drain-source current path of the n-channel HFET transistor Q4 is deactivated such that there is minimal conduction from the p-channel injector of the thyristor 1504. Thus, with the digital electrical signal $Q_A$ being high, the n-channel HFET transistors Q3 and Q4 are activated to drain majority carriers from the thyristor 1504 and counteract the introduction of majority carriers into the thyristor as a result of absorption of the digital optical signal $Q_B$. In this configuration, the thyristor 1504 switches ON to provide negative current that flows out of the RC load provided by the parallel load 1505A and capacitor 1506 only when the digital optical signal $Q_B$ is ON and the digital electrical signal $Q_A$ is low (i.e., the corresponding digital optical signal $Q_A$ is OFF). With the thyristor 1504 in the ON state, the voltage potential of the anode terminal of the thyristor 1504 decreases and the RC load provided by the parallel load 1505A and capacitor 1506 operates as a filter stage that integrates such decreases in the voltage potential of the anode terminal over time. The result of such integration is a decreasing voltage signal at the anode terminal whose change over time tracks the phase offset of the digital optical signal $Q_B$ relative to the digital optical signal $Q_A$ over time. An example of the decreasing voltage signal generated at the anode terminal of the thyristor 1504 is shown in FIG. 15C. The anode terminal voltage signal of the thyristor 1504 is used as a Control C signal that is output and supplied to the optoelectronic oscillator 1101 in order to introduce a negative change to the frequency of the optical clock signal 1109A and the corresponding electrical clock signal 1109B generated by the optoelectronic oscillator 1101.

In this configuration, the control signals C and D dynamically adjust the frequency and phase of the optical clock signal 1109A and the corresponding electrical clock signal 1109B generated by the optoelectronic oscillator 1101 such that it matches the frequency and phase of the symbol clock embedded in the recovered optical signal when it achieved the phase/frequency locked condition. This phase/frequency locked condition is achieved when the C and D control signals become constant (independent of time). This locked condition is not shown in FIGS. 15B and 15C.

Optoelectronic Oscillator

Figure 16:
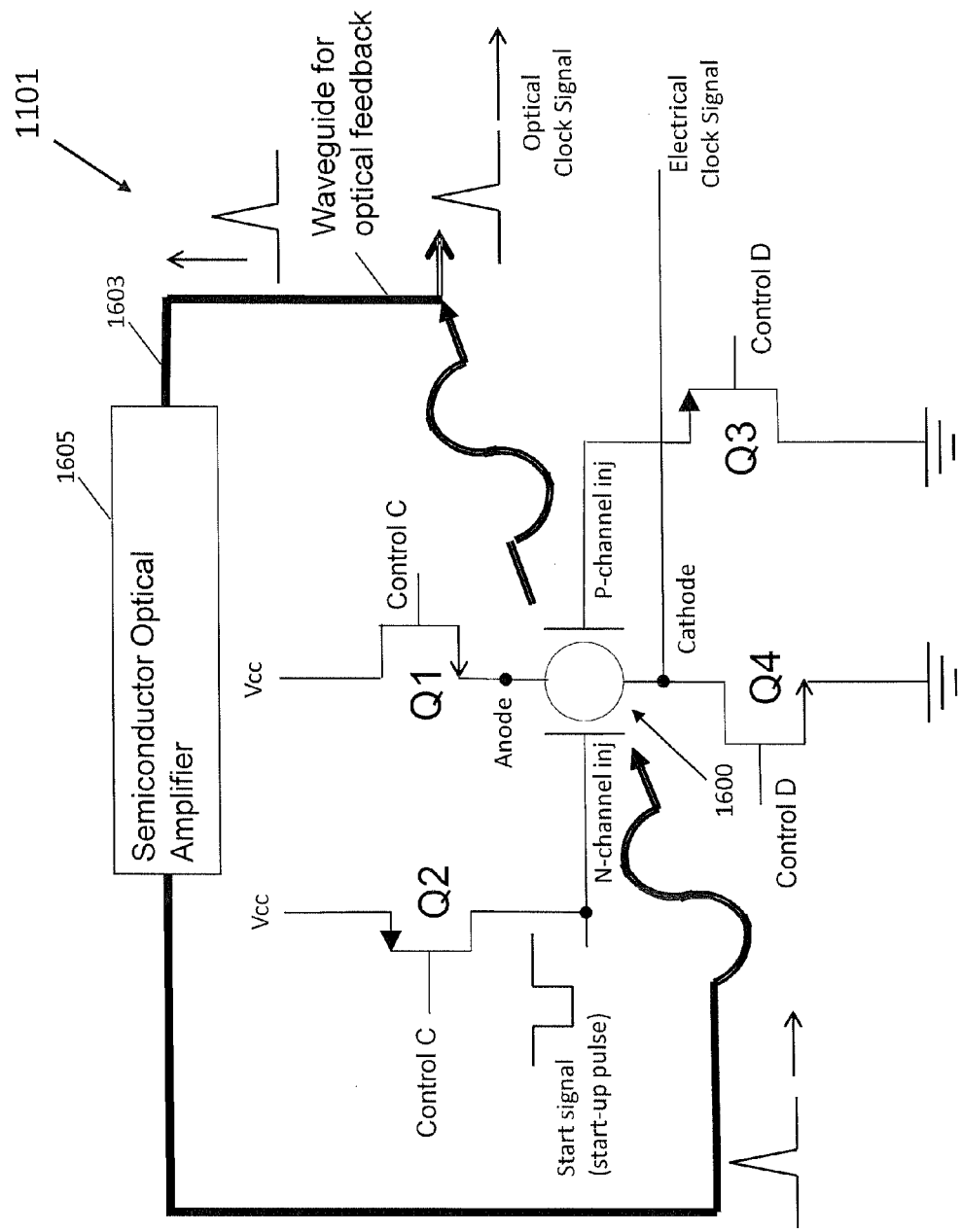
FIG. 16 is a schematic diagram of an exemplary embodiment of optoelectronic oscillator suitable for use in the optical phase lock loop (clock recovery circuit) of FIG. 11.

FIG. 16 shows an embodiment of an optoelectronic oscillator 1101 suitable for use in the circuit of FIG. 11. The optoelectronic oscillator 1101 produces an oscillating optical output signal and corresponding oscillating electrical output signal (i.e., an optical clock signal 1109A and the corresponding electrical clock signal 1109B in the example herein) whose oscillation frequency is controlled by two electrical input signals. One electrical input signal (i.e., the Control C signal in the example herein) introduces a negative change to the oscillation frequency of the oscillating optical output signal (and corresponding oscillating electrical output signal). The other electrical input signal (i.e., the Control D signal in the example herein) introduces a positive change to the oscillation frequency of the oscillating optical output signal (and corresponding oscillating electrical output signal).

The optoelectronic oscillator 1101 includes a four terminal vertical thyristor (N region-P region-N region-P region) 1600 with a p-channel injector terminal and an n-channel injector terminal. An n-channel HFET transistor Q1 is coupled between the positive voltage supply ($V_{cc}$) and the anode terminal of the thyristor 1600. A p-channel HFET transistor Q2 is coupled between the positive voltage supply ($V_{cc}$) and the n-channel injector terminal of the thyristor 1500. The source terminal of p-channel HFET transistor Q2 is connected to the positive voltage supply ($V_{cc}$). The drain terminal of the p-channel HFET transistor Q2 is coupled to the n-channel injector terminal. A p-channel HFET transistor Q3 is coupled between the negative voltage supply (ground) and the p-channel injector terminal of the thyristor 1600. The drain terminal of the p-channel HFET transistor Q3 is connected to the negative voltage supply (ground). The source terminal of the p-channel HFET transistor Q3 is coupled to the p-channel injector terminal of the thyristor 1600. An n-channel HFET transistor Q4 is coupled between the cathode terminal of the thyristor 1500 and the negative voltage supply (ground).

A feedback waveguide 1603 is coupled to the waveguide region of the thyristor 1600. The waveguide region of the thyristor 1600 acts as an optical pulse regenerator that emits an output optical pulse in response to a detected input optical pulse. An electrical output pulse corresponding the output optical pulse is generated at the cathode terminal of the thyristor 1600. The feedback waveguide structure 1603 splits the output optical pulse into two parts. One part is output from the feedback waveguide structure 1603 to form a train of optical pulses that defines the output optical clock signal. The other part is guided by the feedback waveguide 1603 such that it returns back to the thyristor 1600 as an input optical pulse to produce another output optical pulse. Such optical pulse regeneration can be initiated by an electrical start-up pulse signal that is supplied to the n-channel injector of the thyristor as shown. The corresponding electrical pulse train generated at the cathode terminal of the thyristor 1600 is output as the electrical clock signal. A semiconductor optical amplifier 1605 can be integral to the feedback waveguide 1603 and configured to amplify the optical pulse signal guided by the feedback waveguide. Such amplification can compensate for losses in splitting off the optical clock signal from the circuit.

The pulse width of the output optical pulse (and corresponding output electrical pulse) is given by:

$$t_{pulse} = t_{intrinsic} + t_{trigger}. \quad (5)$$

The parameter $t_{intrinsic}$ is the intrinsic time delay of the device, which is based upon fabrication and growth parameters of the device (and is typically on the order of 1 to 4 picoseconds). The parameter $t_{trigger}$ is related to the effective area of the thyristor 1600, threshold charge density, and the charging current as follows:

$$A * \sigma_{trigger} = Q_{trigger} = I_{trigger} * t_{trigger}. \quad (6)$$

The parameter A is the effective area of thyristor 1600. The parameter $\sigma_{trigger}$ is the threshold charge density. The parameter $Q_{trigger}$ is the threshold charge. The parameter $I_{trigger}$ is the charging or trigger current.

The trigger current $I_{trigger}$ relates to the optically induced photocurrent and the bias current as follows:

$$I_{trigger} = I_{input} - I_{BiasN} - I_{BiasP}. \quad (7)$$

The parameter $I_{input}$ is the optically induced photocurrent produced by absorption of the input optical pulse. $I_{BiasN}$ is the electron current drawn from the n-channel injector of the thyristor 1600. $I_{BiasP}$ is the hole current drawn from the p-channel injector of the thyristor 1600.

The optically induced photocurrent $I_{input}$ is given by:

$$I_{input} = \eta_i * P_{input}. \quad (8)$$

The parameter $\eta_i$ represents the quantum efficiency of the thyristor 1600. The parameter $P_{input}$ is the power of input optical pulse.

Solving equation (6) for the parameter $t_{trigger}$ using equations (7) and (8) for the parameter $I_{trigger}$ yields:

$$t_{trigger} = Q_{trigger}/I_{trigger}; \text{ and} \quad (9)$$

$$t_{trigger} = A * \sigma_{trigger}$$

- - - .

$$(\eta_i * P_{input}) - I_{BiasN} - I_{BiasP} \quad (10)$$

From inspection of equations (10), (9) and (5), if the optical power of input optical pulse is held constant ($P_{input}$ is constant), an increase in the bias current $I_{BiasN}$ leads to a decrease in $I_{trigger}$, an increase in $t_{trigger}$, and an increase in $t_{pulse}$. The increase in $t_{pulse}$ decreases the frequency of the output optical pulse train emitted from the thyristor 1600 that forms the optical clock signal and the matching frequency of the corresponding output electrical pulse train generated at the cathode terminal of the thyristor 1600 that forms the electrical clock signal. In contrast, a decrease in the bias current $I_{BiasP}$ leads to an increase in $I_{trigger}$, a decrease in $t_{trigger}$, and a decrease in $t_{pulse}$. The decrease in $t_{pulse}$ increases the frequency of the output optical pulse train emitted from the thyristor 1600 that forms the optical clock signal and the matching frequency of the corresponding output electrical pulse train generated at the cathode terminal of the thyristor 1600 that forms the electrical clock signal.

Moreover, from the inspection of equations (10), (9) and (5), if the bias currents $I_{BiasN}$ and $I_{BiasP}$ are held constant, a decrease in the optical power of the input optical pulse (decrease in $P_{input}$) leads to a decrease in $I_{trigger}$, an increase in $t_{trigger}$, and an increase in $t_{pulse}$. The increase in $t_{pulse}$ decreases the frequency of the output optical pulse train emitted from the thyristor 1600 that forms the optical clock signal and the matching frequency of the corresponding output electrical pulse train generated at the cathode terminal of the thyristor 1600 that forms the electrical clock signal. In contrast, an increase in the optical power of the input optical pulse (increase in $P_{input}$) leads to an increase in $I_{trigger}$, a decrease in $t_{trigger}$, and a decrease in $t_{pulse}$. The decrease in $t_{pulse}$ increases the frequency of the output optical pulse train emitted from the thyristor 1600 that forms the optical clock signal and the matching frequency of the corresponding output electrical pulse train generated at the cathode terminal of the thyristor 1600 that forms the electrical clock signal.

These relationships are exploited to control the frequency of the output optical pulse train emitted from the thyristor 1600 that forms the optical clock signal and the corresponding output electrical pulse train generated at the cathode terminal of the thyristor 1600 that forms the electrical clock signal.

Specifically, the C control signal (which can be generated by the optical charge pump 1105 as described in the example above) is supplied as input to the gate terminals of the HFET transistors Q1 and Q2, and the D control signal (which can be generated by the optical charge pump 1105 as described in the example above) is supplied as input to the gate terminals of the HFET transistors Q3 and Q4. The C control signal as supplied to the gate terminal of the n-channel HFET transistor Q1 controls the variable source-drain resistance of the transistor Q1. A decrease in the C control signal increases the source-drain resistance of the transistor Q1 and thus decreases the ON state voltage drop across the thyristor 1600, thereby decreasing the power level of the output optical pulse. This decrease in power level results in a decrease in the optical power of the input optical pulse (decrease in $P_{input}$) that is returned to the thyristor 1600. The C control signal as supplied to the gate terminal of the p-channel HFET transistor Q2 controls the variable source-drain resistance of the transistor Q2. A decrease in the C control signal decreases the source-drain resistance of the transistor Q2 and thus increases the bias current $I_{BiasN}$. Thus, a decrease in the C control signal results in a decrease in the optical power of the input optical pulse (decrease in $P_{input}$) as well as an increase in the bias current $I_{BiasN}$. Both of these conditions decrease the frequency of the output optical pulse train emitted from the thyristor 1600 that forms the optical clock signal and the matching frequency of the corresponding output electrical pulse train generated at the cathode terminal of the thyristor 1600 that forms the electrical clock signal.

The D control signal as supplied to the gate terminal of the n-channel HFET transistor Q4 controls the variable source-drain resistance of the transistor Q4. An increase in the D control signal lowers the source-drain resistance of the transistor Q4 and thus increases the ON state voltage drop across the thyristor 1600, thereby increasing the power level of the output optical pulse. This increase in power level results in an increase in the optical power of the input optical pulse (increase in $P_{input}$) that is returned to the thyristor 1600. The D control signal as supplied to the gate terminal of the p-channel HFET transistor Q3 controls the variable source-drain resistance of the transistor Q3. An increase in the D control signal increases the source-drain resistance of the transistor Q3 and thus decreases the bias current $I_{BiasP}$. Thus, an increase in the D control signal results in an increase in the optical power of the input optical pulse (increase in $P_{input}$) as well as a decrease in the bias current $I_{BiasP}$. Both of these conditions increase the frequency of the output optical pulse train emitted from the thyristor 1600 that forms the optical clock signal and the matching frequency of the corresponding output electrical pulse train generated at the cathode terminal of the thyristor 1600 that forms the electrical clock signal.

In this configuration, the frequency and phase of the optical clock signal and the corresponding electrical clock signal are adjusted dynamically by decreases in the control signal C and increases in the control signal D.

POET Building Blocks

The electronic circuit components (such as the HFET transistors and electrical thyristors) as well as the optoelectronic circuit components (such as the optical hybrid couplers and optical thyristors) of the circuits as described herein can be implemented in one or more integrated circuits based on technology (referred to by the Applicant as "Planar Optoelectronic Technology" or "POET"). POET provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; International Patent Application No. PCT/US12/51265, filed on Aug. 17, 2012; U.S. patent application Ser. No. 13/921,311, filed on Jun. 19, 2013; and U.S. patent application Ser. No. 14/222,841, filed on Mar. 24, 2014; all of which are hereby incorporated by reference in their entireties.

With these structures, a fabrication sequence can be used to make the devices on a common substrate. In other words, n type and p type contacts, critical etches, etc. can be used to realize all of these devices simultaneously on a common substrate. The essential features of this device structure include 1) an n-type modulation doped quantum well interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure. The active device structures can be realized with group III-V materials. Such group III-V materials can include gallium (Ga) and arsenic (As) (for gallium arsenide layer structures) as well as aluminum (Al) and indium (In), and thus can include GaAs, AlGaAs, and InGaAs semiconductor alloys. Alternatively, such group III-V materials can include gallium (Ga) and nitrogen (N) (for gallium nitride layer structures) as well as aluminum (Al) and indium (In), and thus can include GaN, AlGaN, and InGaN semiconductor alloys.

POET can be used to construct a variety of optoelectronic devices. POET can also be used to construct a variety of high performance transistor devices, such as complementary n-channel and p-channel HFET unipolar transistor devices as well as n-type and p-type HBT bipolar transistor devices.

Turning now to FIG. 17, the device structure of the present application includes an optional bottom dielectric distributed Bragg reflector (DBR) mirror 1703 formed on substrate 1701. The bottom DBR mirror 1703 can be formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda$/4) optical thickness, the reflections from each of the boundaries will be added in phase to produce a large amount of reflected light (e.g., a large reflection coefficient) at the particular center wavelength $\lambda_C$. Deposited upon the bottom DBR mirror 1703 or upon the substrate 1701 for the case where the bottom DBR mirror 1703 is omitted) is the active device structure suitable for realizing complementary heterostructure field-effect transistor (HFET) devices. The first of these complementary HFET devices is a p-channel HFET formed from a p-type modulation doped quantum well (QW) structure 1711 with an n-type gate region (i.e., n-type ohmic contact layer 1705 and n-type layer(s) 1707) below the p-type modulation doped QW structure 1711. An undoped spacer layer 1709 is disposed between the p-type modulation doped quantum well (QW) structure 1711 and the underlying n-type layer(s) 1707. One or more spacer layers 1713 are disposed above the p-type modulation doped QW structure 1711. The second of these complementary HFET devices is an n-channel HFET formed by an n-type modulation doped QW structure 1715 with a p-type gate region (i.e., p-type layer(s) 1719 and p-type ohmic contact 1721) disposed above the n-type modulation doped QW structure 1715. An undoped spacer layer 1717 is disposed between the n-type modulation doped QW structure 1715 and the overlying p-type layer(s) 1719. The layers encompassing the spacer layer 1713 and the n-type modulation doped QW structure 1715 forms the collector region of the p-channel HFET. Similarly, the layers encompassing the spacer layer 1713 and the p-type modulation doped QW structure 1711 forms the collector region of the n-channel HFET. Such collector regions are analogous to the substrate region of a MOSFET device as is well known. Therefore, a non-inverted n-channel HFET device can be stacked upon an inverted p-channel HFET device as part of the active device structure.

The active device layer structure begins with n-type ohmic contact layer(s) 1705 which enables the formation of ohmic contacts thereto. Deposited on layer 1705 are one or more n-type layers 1707 and an undoped spacer layer 1709 which serve electrically as part of the gate of the p-channel HFET device and optically as a part of the lower waveguide cladding of the active device structure. Deposited on layer 17089 is the p-type modulation doped QW structure 1711 that defines a p-type charge sheet offset from one or more QWs (which may be formed from strained or unstrained heterojunction materials) by an undoped spacer layer. The p-type charge sheet is formed first below the undoped spacer and the one or more QWs of the p-type modulation doped QW structure 1711. All of the layers grown thus far form the p-channel HFET device with the gate ohmic contact on the bottom. Deposited on the p-type modulation doped QW structure 1711 is one or more spacer layers 1713.

Deposited on the spacer layer(s) 1713 is the n-type modulation doped QW structure 1715. The n-type modulation doped QW structure 1715 defines an n-type charge sheet offset from one or more QWs by an undoped spacer layer. The n-type charge sheet is formed last above the undoped spacer and the one or more QWs of the n-type modulation doped QW structure 1715.

Deposited on the n-type modulation doped QW structure 1715 is an undoped spacer layer 1717 and one or more p-type layers 1719 which can serve electrically as part of the gate of the n-channel HFET and optically as part of the upper waveguide cladding of the device. The p-type layers 1719 can include two sheets of planar doping of highly doped p-material separated by a lightly doped layer of p-material. These p-type layers are offset from the n-type modulation doped quantum well structure 1715 by the undoped spacer layer 1717. In this configuration, the top charge sheet achieves low gate contact resistance and the bottom charge sheet defines the capacitance of the n-channel HFET with respect to the n-type modulation doped QW structure 1715. Deposited on p-type layer(s) 1719 is one or more p-type ohmic contact layer(s) 1721, which enables the formation of ohmic contacts thereto.

For the n-channel HFET device, a gate terminal electrode of the n-channel HFET device interfaces to the top p-type ohmic contact layer(s) 1721. A source terminal electrode and a drain terminal electrode of the n-channel HFET device are operably coupled to opposite sides of a QW channel region realized in the n-type modulation doped QW structure 1715. One or more collector terminal electrodes can be operably coupled to the p-type modulation doped QW structure 1711.

For the p-channel HFET device, a gate terminal electrode of the p-channel HFET device interfaces to the bottom n-type ohmic contact layer 1705. A source terminal electrode and a drain terminal electrode are operably coupled to opposite sides of a QW channel region realized in the p-type modulation doped QW structure 1711. The layer structure of the p-channel HFET device can be patterned and etched down to form a mesa at spacer layer 1713 with a collector (or back-gate) electrode formed on such mesa.

It may be beneficial that the depth of the back-gate mesa be uniform for the p-channel HFET devices formed on the substrate. Attempting to achieve this uniform depth by timed etching is difficult due to etch non-uniformity and thermal variations. A solution can be found by introducing an extremely thin layer (e.g. 10A) of AlAs during the epitaxial growth at the level of the back-gate mesa of the p-channel HFET devices. This AlAs layer can act as an etch stop layer during etching in order to provide a uniform depth for the back-gate mesas of the p-channel HFET devices formed on the substrate. In one embodiment, a dry etch can be performed to above and within 600 A of the thin AlAs layer. Then a wet etch (preferably employing citric acid and $H_2O_2$ can be performed. This etch process stops naturally at the AlAs layer (i.e., the AlAs of 10 A is extremely resistant to this etching process). Thus a planar surface is established just at the back gate level which has the accuracy of the MBE growth.

Both the n-channel HFET device and the p-channel HFET device are field effect transistors where current flows as a two-dimensional gas through the QW channel region with contacts on either side of the channel region. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET device or a two-dimensional hole gas for the p-channel HFET) as a function of gate voltage relative to source voltage.

For the n-channel HFET device, the QW channel conductance is turned on by biasing the gate terminal electrode and the source terminal electrode at voltages where the P/N junction of the gate and source regions is forward biased with minimal gate conduction and an inversion layer of electron gas is created in the QW channel of the n-type modulation doped quantum well structure 1715 between the source terminal electrode and the drain terminal electrode. In this configuration, the source terminal electrode is the terminal electrode from which the electron carriers enter the QW channel of the n-type modulation doped quantum well structure 1715, the drain terminal electrode is the terminal electrode where the electron carriers leave the device, and the gate terminal electrode is the control terminal for the device.

The p-channel HFET device operates in a similar manner to the n-channel HFET device with the current direction and voltage polarities reversed with respect to those of the n-channel HFET device. For the p-channel HFET device, the QW channel conductance is turned on by biasing the gate terminal electrode and the source terminal electrode at a voltage where the P/N junction of the source and gate regions is forward-biased with minimal gate conduction and an inversion layer of hole gas is created in the QW channel of the p-type modulation doped quantum well structure 1711 between the source terminal electrode and the drain terminal electrode. In this configuration, the source terminal electrode is the terminal from which the hole carriers enter the QW channel of the p-type modulation doped quantum well structure 1711, the drain terminal electrode is the terminal where the hole carriers leave the device, and the gate terminal electrode is the control terminal for the device.

The device structure of the present application can also be configured to realize bipolar inversion channel field-effect transistors (BICFETs) with either an n-type modulation doped quantum well inversion channel base region (n-channel base BICFET) or a p-type modulation doped quantum well inversion channel base region (p-channel base BICFET).

For the n-channel base BICFET device, an emitter terminal electrode of the n-channel base BICFET device interfaces to the top p-type ohmic contact layer(s) 1721 of the active device structure. A base terminal electrode of the n-channel base BICFET device is operably coupled to the QW channel region realized in the n-type modulation doped QW structure 1715. A collector terminal electrode of the n-channel base BICFET device is operably coupled to the p-type modulation doped QW structure 1711. The n-channel base BICFET device is a bipolar junction type transistor which can be operated in an active mode by applying a forward bias to the PN junction of the emitter and base regions while applying a reverse bias to the PN junction of the base and collector regions, which causes holes to be injected from the emitter terminal electrode to the collector terminal electrode. Because the holes are positive carriers, their injection contributes to current flowing out of the collector terminal electrode as well as current flowing into the emitter terminal electrode. The bias conditions also cause electrons to be injected from the base to the emitter, which contributes to current flowing out of the base terminal electrode as well as the current flowing into the emitter terminal electrode.

The p-channel base BICFET device is similar in construction to the p-channel HFET device with the following adaptations. An emitter terminal electrode of the p-channel base BICFET device, which is analogous to the gate terminal electrode of the p-channel HFET device, interfaces to the bottom n-type ohmic contact layer(s) 1721 of the active device structure. A base terminal electrode of the p-channel base BICFET device, which is analogous to the source or drain electrode of the p-channel HFET device, is operably coupled to the QW channel region realized in the p-type modulation doped QW structure 1711. A collector terminal electrode of the p-channel base BICFET device, which is analogous to the collector terminal electrode of the p-channel HFET device, is operably coupled to the spacer layer 1713. The p-channel base BICFET device is a bipolar junction type transistor which can be operated in an active mode by applying a forward bias to the PN junction of the emitter and base regions while applying a reverse bias to the PN junction of the base and collector regions, which causes electrons to be injected from the emitter terminal electrode to the collector terminal electrode. Because the electrons are negative carriers, their injection contributes to current flowing into the collector terminal electrode as well as current flowing out of the emitter terminal electrode. The bias conditions also cause holes to be injected from the base to the emitter, which contributes to current flowing into the base terminal electrode as well as the current flowing out of the emitter terminal electrode.

The active device structure of the present application can also be configured to realize a variety of electrical and optoelectronic thyristor devices having a vertical P-N-P-N thyristor structure. The upper p-type region (i.e., the first P) of the vertical P-N-P-N thyristor structure is formed by the p-type layers 1719, 1721 of the active device structure. The upper n-type region (i.e., the first N) of the vertical P-N-P-N thyristor structure is formed from the n-type modulation doped QW structure 1715 of the active device structure. The lower p-type region (i.e., the second P) of the vertical P-N-P-N thyristor structure is formed from the p-type modulation doped QW structure 1711 of the active device structure. The lower n-type region (i.e., the second N) of the vertical P-N-P-N thyristor structure is formed by the bottom n-type layers 1705, 1707 of the active device structure.

180-Degree Optical Hybrid Coupler

Figure 18A:
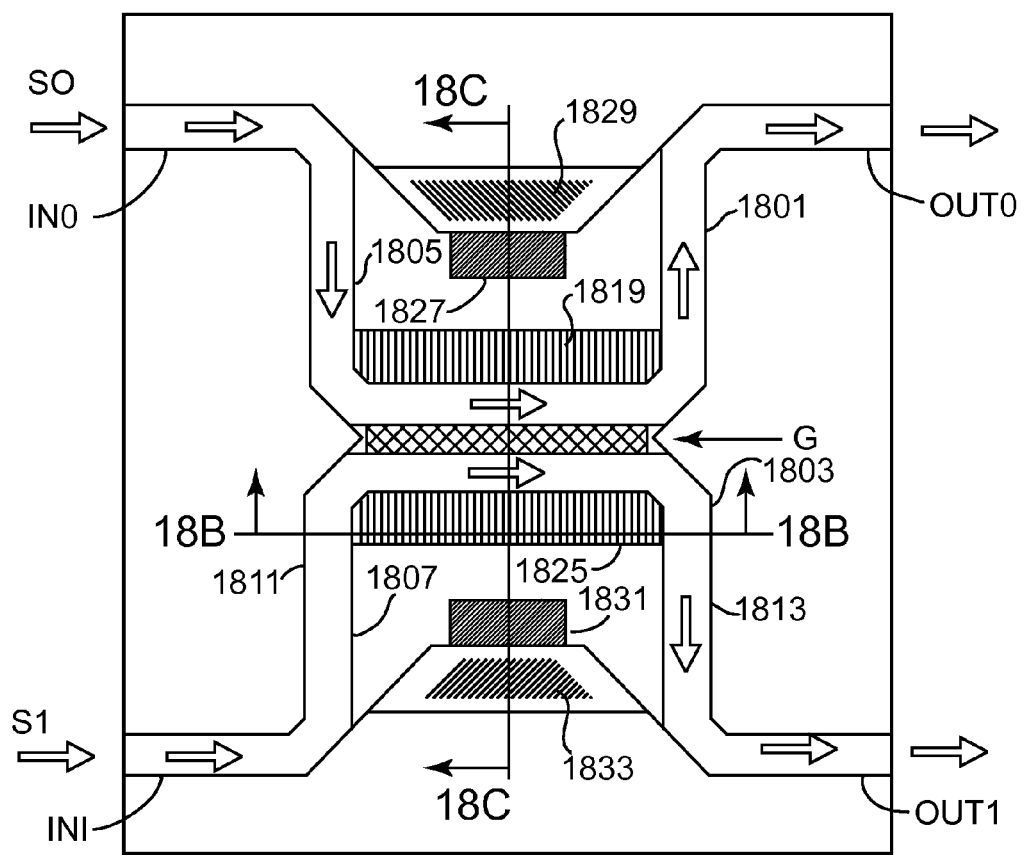
FIGS. 18A-18C are schematic illustrations of an exemplary embodiment of an optical hybrid coupler that can be made utilizing the layer structure of FIG. 17.
Figure 18B:
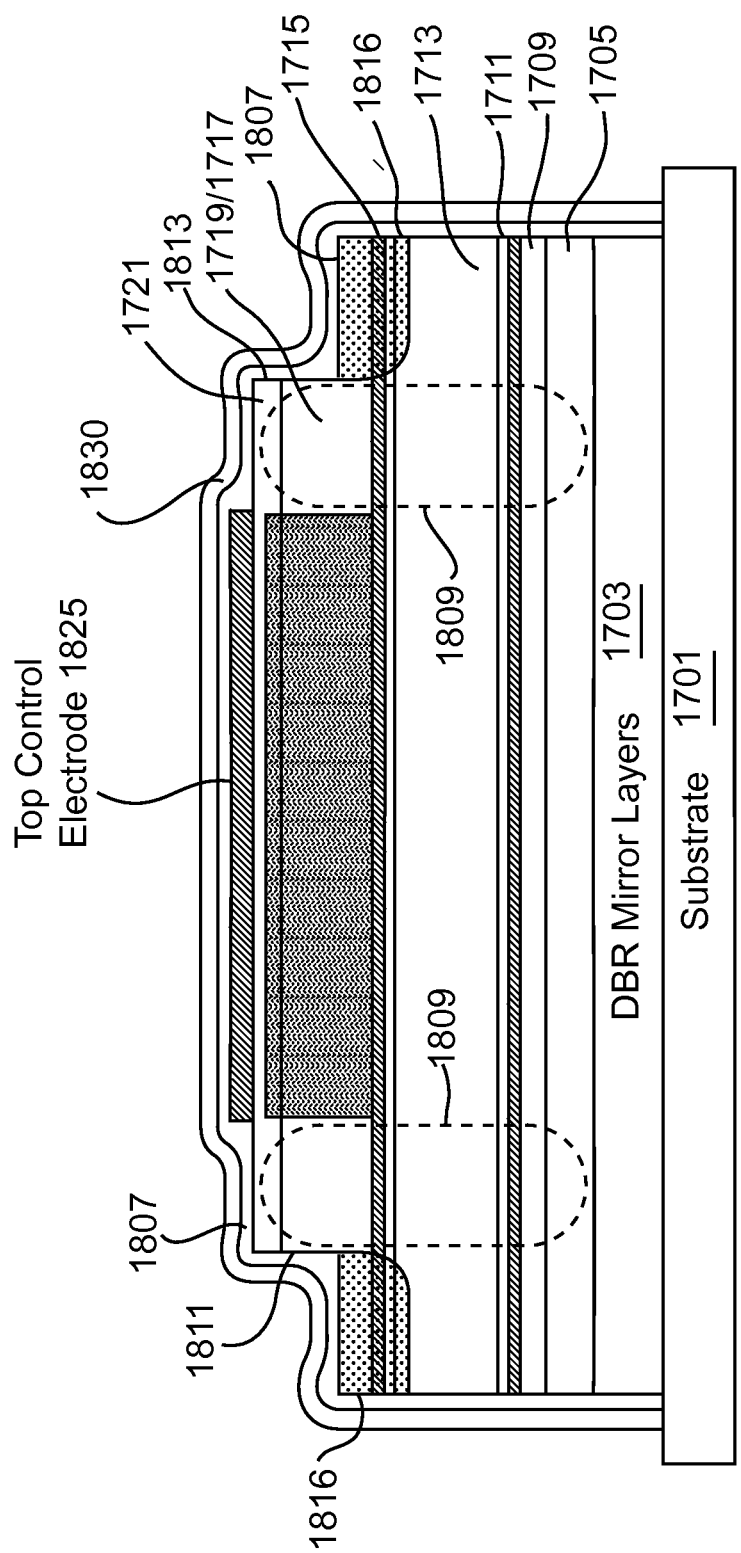
Figure 18C:
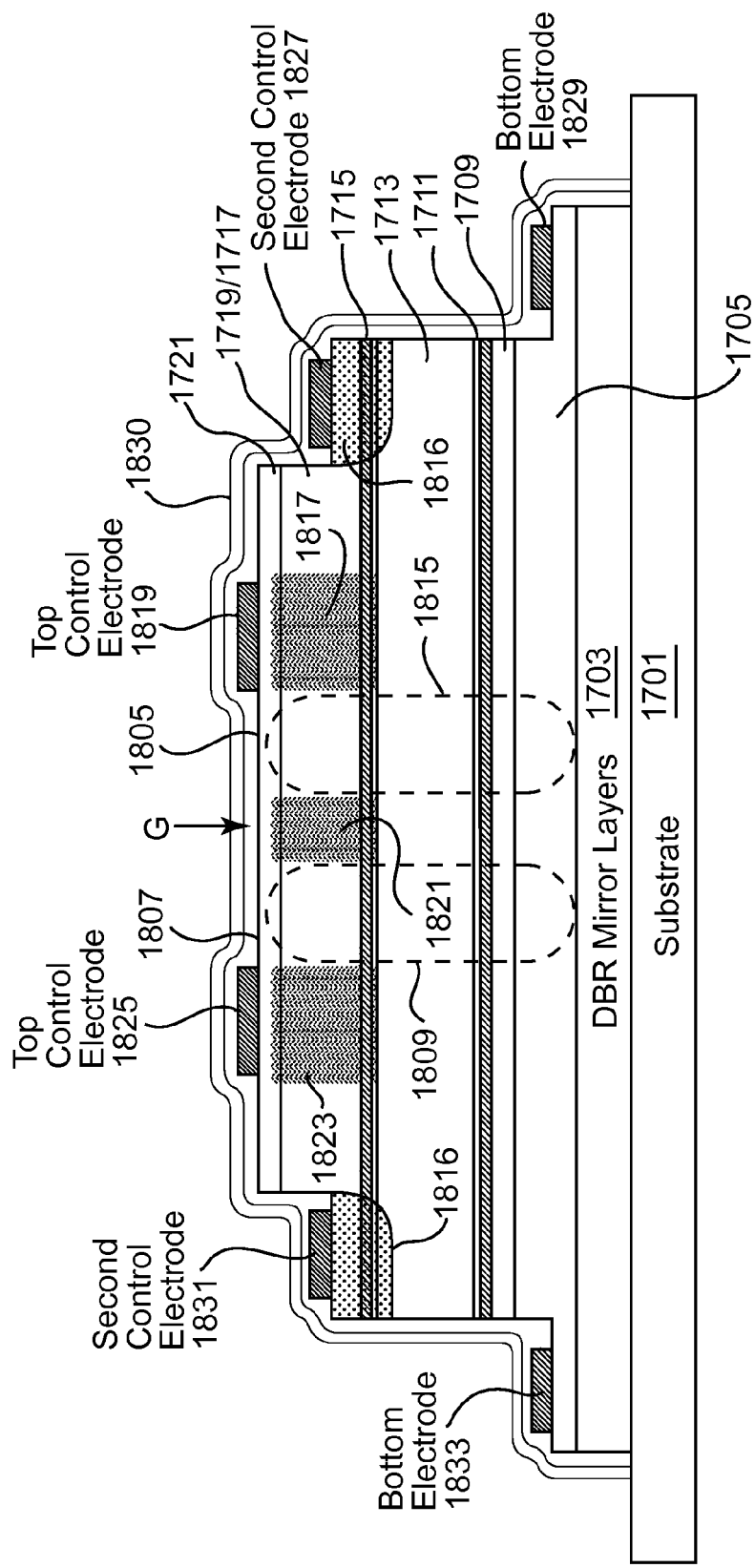

FIGS. 18A-18C illustrate a configuration of a 180-degree optical hybrid coupler that can be made utilizing the layer structure of FIG. 17, which includes two zig-zag active waveguide structures 1801, 1803 integrated on the substrate 1701 and optically coupled to one another by evanescent-wave coupling over a gap region G. The zig-zag waveguide structure 1801 is defined by a rib waveguide 1805 that forms a zig-zag path. Similarly, the zig-zag waveguide structure 1803 is defined by a rib waveguide 1807 that forms a zig-zag path. The optical mode that travels through each respective rib waveguide is strongly confined within the respective rib waveguide by internal reflection at the reflective interfaces of the rib waveguide. Specifically, cladding for guiding the optical mode 1809 in the rib waveguide 1807 is provided by the top DBR mirror 1830 and the bottom DBR mirror 1703 as best shown in the cross-section of FIG. 18B. Lateral confinement of the optical mode 1809 in the waveguide 1807 is provided by refractive index changes at the sidewalls 1811, 1813 that define the outer boundary of the waveguide 18007 (FIGS. 18A and 18B), at n-type ion implants 1816 adjacent the top rib sidewalls 1811, 1813 (FIG. 18B), at the corner sidewalls, and at the interface of the top mirror 1830 that covers the waveguide 1807. Similar structure is used guiding the optical mode 1815 in the rib waveguide 1805.

In the coupling region, the waveguides 1805 and 1807 include straight sections that extend parallel to one another and closely-spaced from one another by the gap region G. In the straight section of the waveguide 1805, vertical confinement of the optical modes 1815, 1809 in the waveguides 1805, 1807 can be aided by the top mirror 1830 formed to cover the top and sidewalls of the waveguides 1805, 1807 as shown. Lateral confinement of the optical mode 1815 is provided by i) a refractive index change at the periphery of the implant region 1817 under the metal of the top control electrode 1819 as shown in FIG. 18C, and ii) a refractive index change at the periphery of the implant region 1821 in the coupling region (gap G) as evident from FIG. 18C. In the straight section of the waveguide 1807, lateral confinement of the optical mode 1809 is provided by i) a refractive index change at the periphery of the implant region 1823 under the metal of the top control electrode 1825 as shown in FIG. 18C, and ii) a refractive index change at the periphery of the implant region 1821 in the coupling region (gap G) as evident from FIG. 18C.

The width (W) of the waveguides 1805, 1807 can be less than 2 µm, and possibly 1 µm or less. The width of the gap region G (i.e., the spacing between the waveguides 1805, 1807) can be less than 2 µm, and possibly on the order of 1 µm or less.

The zig-zag active waveguide structure 1801 includes the top control terminal electrode 1819 that is electrically coupled to the top p-type ohmic contact layer 1107, a second control terminal electrode 1827 that is electrically coupled to the n-type modulation doped QW structure 1715 via an n-type ion implant 1816, and a bottom electrode 1829 that is electrically coupled to the bottom n-type contact layer 1705 as best shown in FIG. 18C.

The zig-zag active waveguide structure 1803 includes a top control terminal electrode 1825 that is electrically coupled to the top p-type ohmic contact layer 1107, a second control terminal electrode 1831 that is electrically coupled to the n-type modulation doped QW structure 1715 via an n-type ion implant 1816, and a bottom electrode 1833 that is electrically coupled to the bottom n-type contact layer 1705 as best shown in FIG. 18C. Note that the implant regions 1817, 1821, 1823 can locally shift the band gap in the underlying n-type modulation doped quantum well structure 1715. This bandgap shift can prohibit charge transfer in the QWs of the n-type modulation doped QW structure 1715 across the gap region G between the adjacent waveguides 1805, 1807. For the waveguide 1805, voltage signals applied to the top control electrode 1819 can overcome this effect to allow charge to enter (or exit) from the QWs of the n-type modulation doped QW structure 1715 via the corresponding second control electrode 1827 as desired. For the waveguide 1807, voltage signals applied to the top control electrode 1525 can overcome this effect to allow charge to enter (or exit) from the QWs of the n-type modulation doped QW structure 1715 via the corresponding second control electrode 1831 as desired. It is also contemplated that additional process steps, such as etching away the top p+ contact layers 1721 and possibly additional layers thereunder in the gap region G between the adjacent waveguides 1805 and 1807 can be performed in order to prevent any charge transfer across the gap region G between the adjacent waveguides 1805 and 1807.

The 180-degree hybrid coupler of FIGS. 18A to 18C includes two input waveguides (In0/In1) and two output waveguides (Out0/Out1). The input waveguide In0 is defined by one end of the waveguide 1805. The output waveguide Out0 is defined by the other end of the zig-zag waveguide 1805. The input waveguide In1 is defined by one end of the waveguide 1807. The output waveguide Out0 is defined by the other end of the zig-zag waveguide 1807. The two input waveguides In0, In1 receive two separate input optical signals S0 and S1 as shown. The length of the coupling region of the two waveguides 1805 and 1807 (i.e., the straight sections that extend parallel to one another and closely-spaced from one another by the gap region G) is configured such that the evanescent coupling over the coupling region of the two waveguides 1805 and 1807 mixes the two input optical signals S0 and S1 to produce two output signals that propagate out from the Out0 and Out1 waveguides where the power of the two input optical signals S0, S1 is split evenly (50:50 split for each input signal) in each one of two output signals.

The power transfer ratio between the two input waveguides (In0/In1) may be written as a function of $\Delta\beta$, which is the propagation constant difference due to the phase mismatch introduced by the charge difference in the two waveguides. The equation is given as:

$$T = \left(\frac{\pi}{2}\right)^2 \mathrm{sinc}^2\left\{\frac{1}{2}\left[1 + \left(\frac{\Delta\beta L_o}{\pi}\right)^2\right]^{1/2}\right\} \quad (11)$$

where $L_o = \pi/2\zeta$ is the fixed coupling length, and $\zeta$ is the coupling coefficient.

For $\Delta\beta=0$, 100% power is transferred in $L_o$, and for $\Delta\beta L_o = \sqrt{3}\pi$ there is no power transferred. For a 50:50 split where the power of the two input optical signals S0, S1 is split evenly in each one of two output signals, the values of $\Delta\beta$ would be used for a fixed $L_o$ according to Eqn. (11).

The structures of FIGS. 18A-18C can also be adapted to provide the specific phase modulators as described above—$\pi/4$ for FIGS. 7A and 9A, and $3\pi/8$ for FIG. 9A. The phase modulator is the simplest of devices. A straight waveguide is injected along one or both sides with charge to produce $\Delta\beta$ which corresponds to the desired phase change upon propagating a distance $L_o$, which is selected according to Eqn. (11) above.

NHFET Phototransistor

Figure 19A:
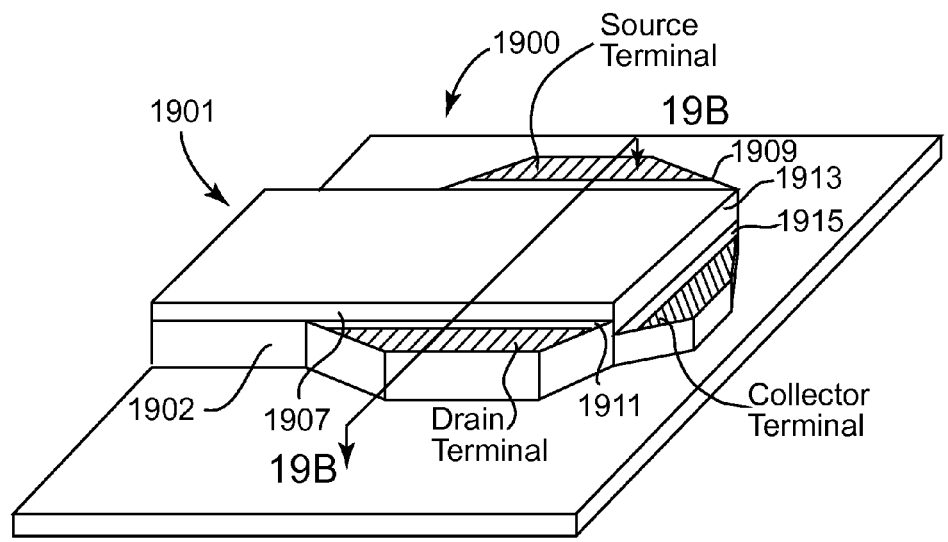
FIGS. 19A and 19B are schematic illustrations of an exemplary embodiment of an n-channel HFET phototransistor device that can be made utilizing the layer structure of FIG. 17.
Figure 19B:
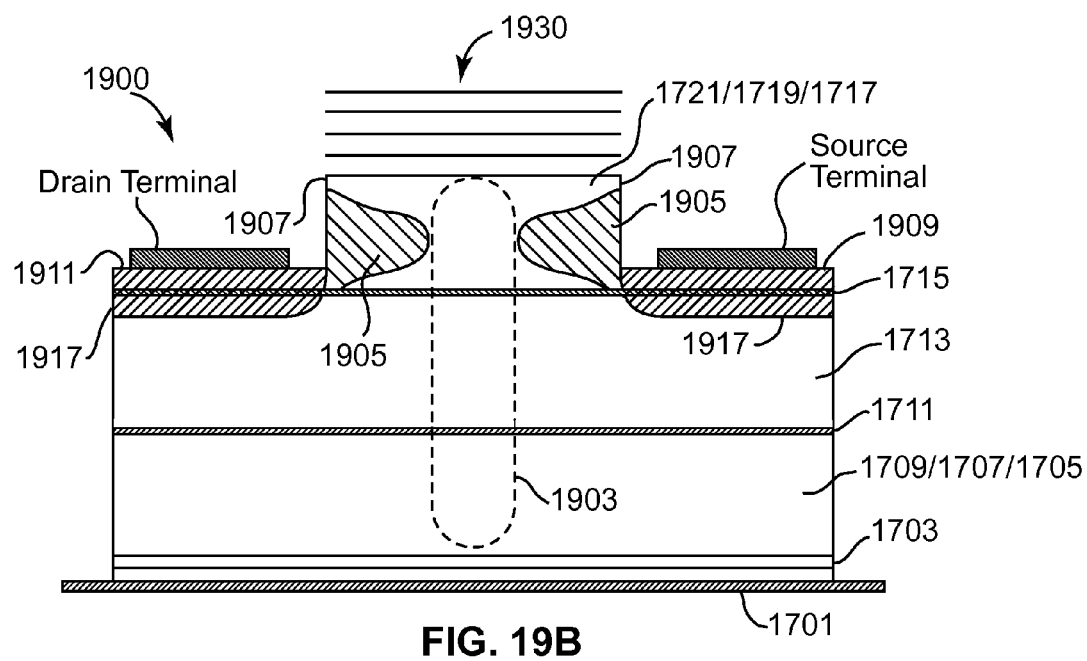

FIGS. 19A and 19B show an exemplary embodiment of an n-channel HFET (NHFET) phototransistor device 1900. A straight passive rib waveguide section 1901 operates to passively guide light (optical mode 1903 of FIG. 19B) into the active waveguide region of the n-channel HFET phototransistor device 1900. The straight passive rib waveguide section 1901 can employ a top DBR mirror (labeled as 1930 in FIG. 19B), which can be realized by pairs of semiconductor or dielectric materials with different refractive indices) that operates as cladding to provide guiding of the optical mode 1903 between the top DBR mirror and the bottom DBR mirror 1703 formed on the substrate 1701. The lateral confinement of the optical mode 1903 within the passive rib waveguide section 1901 can be provided by the index change associated with vertical sidewalls 1902 of the passive rib waveguide section 1901 and possibly n-type ion implants in the top layers 1721, 1719, 1717 (labeled as 1905 in FIG. 19B). The n-type implants of the passive rib waveguide section 1901 can introduce impurity free vacancy disordering into the adjacent waveguide core region when subjected to rapid thermal annealing. The bandgap of the disordered waveguide core region is increased locally to substantially reduce absorption and associated optical loss. The lateral confinement of the optical mode 1903 can also be supported by covering the sidewalls 1902 with the top DBR mirror. The top DBR mirror structure can also extend in a continuous manner to form cladding over the active waveguide region of the n-channel HFET phototransistor device 1900 as is evident from the cross-section of FIG. 19B. In this configuration, the top DBR mirror structure 1930 operates as cladding for the optical mode 1903 received by the active waveguide region of the n-channel HFET phototransistor device 1900.

The active waveguide region of the n-channel HFET phototransistor device 1900 is defined by a rib waveguide formed in the top layers 1721, 1719, 1717 that is aligned (both vertically and laterally) with the passive rib waveguide section 1901 as evident from FIG. 19A. The lateral confinement of the optical mode 1903 within the active waveguide region of the n-channel HFET phototransistor device 1900 can be provided by the index change associated with vertical sidewalls 1907 of the rib formed in the top layers 1721, 1719, 1717 and possibly n-type ion implants 1905 in the top p-type layers 1721, 1719, 1717 as shown in FIG. 19B. The n-type implants 1905 can introduce impurity free vacancy disordering into the adjacent waveguide core region when subjected to rapid thermal annealing. The bandgap of the disordered waveguide core region is increased locally to substantially reduce absorption and associated optical loss. The lateral confinement of the optical mode 1903 can also be supported by covering the sidewalls 1907 with the top DBR mirror 1230.

A source terminal electrode and a drain terminal electrode are operably coupled to opposite sides of an elongate QW channel(s) realized in the n-type modulation doped QW structure 1715 of the active waveguide region of the n-channel HFET phototransistor device 1900. A collector terminal electrode can be coupled to the p-type modulation doped QW structure 1711 of the active waveguide region of n-channel HFET phototransistor device 1900.

Specifically, the layer structure of the n-channel HFET phototransistor device 1900 is patterned and etched to form the rib of the active waveguide region that extends to opposed elongate intermediate mesas 1909, 1911 in the spacer layer 1717 above the n-type modulation doped QW structure 1715. The layer structure is also patterned and etched to form a vertical sidewall 1913 that defines the end of the active waveguide region of the n-channel HFET phototransistor device 1900 opposite the passive rib waveguide section 1901. The vertical sidewall 1913 extends down to an elongate intermediate mesa 1915 in the spacer layer 1713 above the p-type modulation doped QW structure 1711.

N-type donor ions can be implanted through the mesas 1909, 1911 to form n-type ion implant regions 1917 that create the self-aligned n-type contacts to the n-type modulation doped quantum well structure 1715 that forms the QW channel(s) of the active waveguide region of the n-channel HFET phototransistor device 1900. P-type donor ions can be implanted through the mesa 1915 to form a p-type ion implant region that creates a self-aligned p-type contact to the p-type modulation doped quantum well structure 1711 of the active waveguide region of the n-channel HFET phototransistor device 1900. Deposition of a rapid thermal anneal (RTA) oxide and subsequent RTA operations can be carried out to activate the implant regions.

The metal that defines the Source and Drain terminal electrodes is deposited and patterned on the mesas 1909 and 1911 in contact with the n-type ion implant regions 1917 in order to contact the n-type modulation doped quantum well structure 1715 that forms the QW channel(s) of the active waveguide region of the re-channel HFET phototransistor device 1900. The metal that defines the Collector terminal electrode, is deposited and patterned on the mesa 1915 in contact with the p-type ion implant region in order to contact the p-type modulation doped quantum well structure of the active waveguide region of the n-channel HFET phototransistor device 1900. The resultant structure can be heated to treat the metals of the source, drain and collector electrodes as desired.

The n-channel HFET phototransistor device 1900 is a field effect transistor where current flows as a two-dimensional gas through the QW channel region of the n-type modulation doped quantum well structure 1715 of the active waveguide region with the Source and Drain terminals on either side of the QW channel region. The basic transistor action is the modulation of the QW channel conductance by an inversion layer (i.e., a two-dimensional electron gas) that is produced by the absorption of the optical mode 1903 propagating within the active waveguide region of the n-channel HFET phototransistor device 1900. Specifically, the QW channel conductance is controlled by the absorption of the optical mode 1903 propagating within the active waveguide region of the n-channel HFET phototransistor device 1900, which produces an inversion layer of electron gas in the QW channel of the n-type modulation doped quantum well structure 1715 between the Source terminal electrode and the Drain terminal electrode. In this configuration, the Source terminal electrode is the terminal electrode from which the electron carriers enter the QW channel of the n-type modulation doped quantum well structure 1715, and the Drain terminal electrode is the terminal electrode where the electron carriers leave the device.

PHFET Phototransistor

Figure 20A:
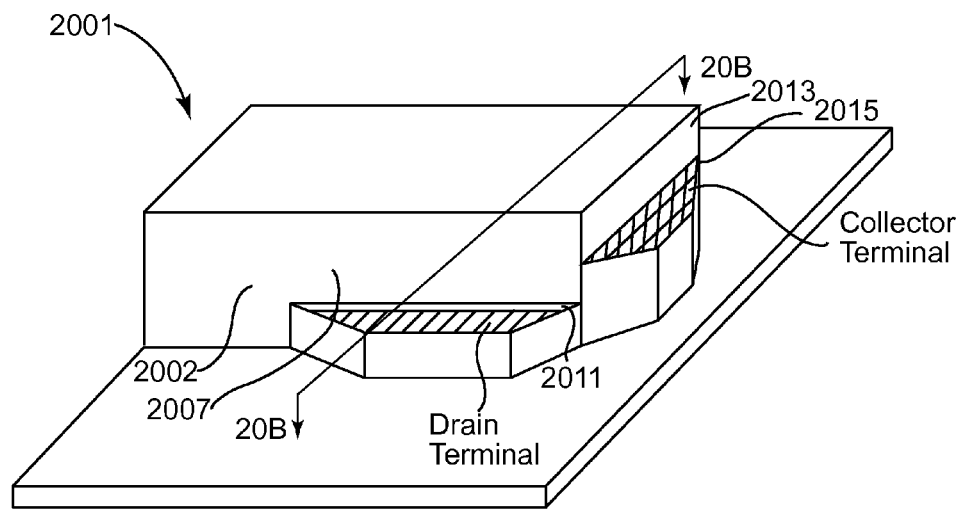
FIGS. 20A and 20B are schematic illustrations of an exemplary embodiment of a p-channel HFET phototransistor device that can be made utilizing the layer structure of FIG. 17.
Figure 20B:
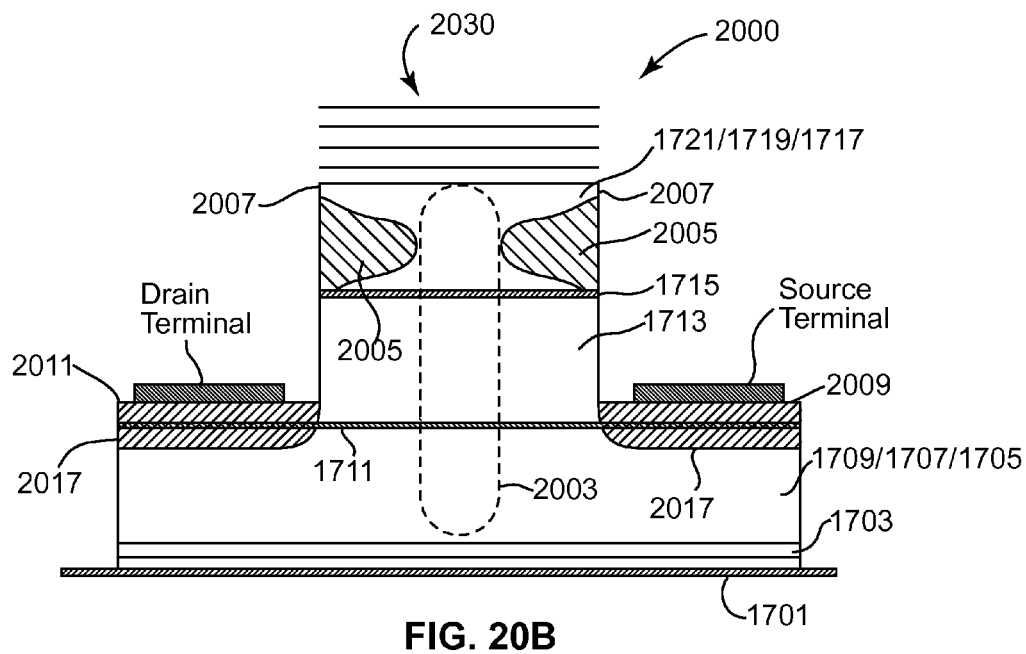

FIGS. 20A and 20B show an exemplary embodiment of a p-channel HFET (PHFET) phototransistor device 2000. A straight passive rib waveguide section 2001 operates to passively guide light (optical mode 2003 of FIG. 20B) into the active waveguide region of the p-channel HFET phototransistor device 2000. The straight passive rib waveguide section 2001 can employ a top DBR mirror (labeled as 2030 in FIG. 20B), which can be realized by pairs of semiconductor or dielectric materials with different refractive indices) that operates as cladding to provide guiding of the optical mode 2003 between the top DBR mirror and the bottom DBR mirror 1703 formed on the substrate 1701. The lateral confinement of the optical mode 2003 within the passive rib waveguide section 2001 can be provided by the index change associated with vertical sidewalls 2002 of the passive rib waveguide section 2001 and possibly n-type ion implants in the top layers 1721, 1719, 1717 (labeled as 2005 in FIG. 19B). The n-type implants of the passive rib waveguide section 2001 can introduce impurity free vacancy disordering into the adjacent waveguide core region when subjected to rapid thermal annealing. The bandgap of the disordered waveguide core region is increased locally to substantially reduce absorption and associated optical loss. The lateral confinement of the optical mode 2003 can also be supported by covering the sidewalls 2002 with the top DBR mirror. The top DBR mirror structure can also extend in a continuous manner to form cladding over the active waveguide region of the p-channel HFET phototransistor device 2000 as is evident from the cross-section of FIG. 20B. In this configuration, the top DBR mirror structure 2030 operates as cladding for the optical mode 2003 received by the active waveguide region of the p-channel HFET phototransistor device 2000.

The active waveguide region of the p-channel HFET phototransistor device 2000 is defined by a rib waveguide formed in layers 1721, 1719, 1717, 1715, and 1713 that is aligned (both vertically and laterally) with the passive rib waveguide section 2001 as evident from FIG. 20A. The lateral confinement of the optical mode 2003 within the active waveguide region of the p-channel HFET phototransistor device 2000 can be provided by the index change associated with vertical sidewalls 2007 of the rib formed in the layers 1721, 1719, 1717, 1715, and 1713 and possibly n-type ion implants 2005 in the top p-type layers 1721, 1719, 1717 as shown in FIG. 20B. The n-type implants 2005 can introduce impurity free vacancy disordering into the adjacent waveguide core region when subjected to rapid thermal annealing. The bandgap of the disordered waveguide core region is increased locally to substantially reduce absorption and associated optical loss. The lateral confinement of the optical mode 2003 can also be supported by covering the sidewalls 2007 with the top DBR mirror 2030.

A source terminal electrode and a drain terminal electrode are operably coupled to opposite sides of an elongate QW channel(s) realized in the p-type modulation doped QW structure 171 of the active waveguide region of the p-channel HFET phototransistor device 2000. A collector terminal electrode can be coupled to the n-type modulation doped QW structure 1715 of the active waveguide region of p-channel HFET phototransistor device 2000.

Specifically, the layer structure of the p-channel HFET phototransistor device 2000 is patterned and etched to form the rib of the active waveguide region that extends to opposed elongate intermediate mesas 2009, 2011 in the spacer layer 1713 above the p-type modulation doped QW structure 1711. The layer structure is also patterned and etched to form a vertical sidewall 2013 that defines the end of the active waveguide region of the p-channel HFET phototransistor device 2000 opposite the passive rib waveguide section 2001. The vertical sidewall 2013 extends down to an elongate intermediate mesa 2015 in the spacer layer 1717 above the n-type modulation doped QW structure 1715.

P-type donor ions can be implanted through the mesas 2009, 2011 to form p-type ion implant regions 2017 that create the self-aligned p-type contacts to the p-type modulation doped quantum well structure 1711 that forms the QW channel(s) of the active waveguide region of the p-channel HFET phototransistor device 2000. N-type donor ions can be implanted through the mesa 2015 to form an n-type ion implant region that creates a self-aligned n-type contact to the n-type modulation doped quantum well structure 1715 of the active waveguide region of the p-channel HFET phototransistor device 2000. Deposition of a rapid thermal anneal (RTA) oxide and subsequent RTA operations can be carried out to activate the implant regions.

The metal that defines the Source and Drain terminal electrodes is deposited and patterned on the mesas 2009 and 2011 in contact with the p-type ion implant regions 2017 in order to contact the p-type modulation doped quantum well structure 1711 that forms the QW channel(s) of the active waveguide region of the p-channel HFET phototransistor device 2000. The metal that defines the Collector terminal electrode, is deposited and patterned on the mesa 2015 in contact with the n-type ion implant region in order to contact the n-type modulation doped quantum well structure of the active waveguide region of the p-channel HFET phototransistor device 2000. The resultant structure can be heated to treat the metals of the source, drain and collector electrodes as desired.

The p-channel HFET phototransistor device 2000 is a field effect transistor where current flows as a two-dimensional gas through the QW channel region of the p-type modulation doped quantum well structure 1711 of the active waveguide region with the Source and Drain terminals on either side of the QW channel region. The basic transistor action is the modulation of the QW channel conductance by an inversion layer (i.e., a two-dimensional hole gas) that is produced by the absorption of the optical mode 2003 propagating within the active waveguide region of the p-channel HFET phototransistor device 2000. Specifically, the QW channel conductance is controlled by the absorption of the optical mode 2003 propagating within the active waveguide region of the p-channel HFET phototransistor device 2000, which produces an inversion layer of hole gas in the QW channel of the p-type modulation doped quantum well structure 1711 between the Source terminal electrode and the Drain terminal electrode. In this configuration, the Source terminal electrode is the terminal from which the hole carriers enter the QW channel of the p-type modulation doped quantum well structure 1711, and the drain terminal electrode is the terminal where the hole carriers leave the device.

Note that the n-channel and p-channel HFET phototransistors will have similar optical responses since the absorption characteristics are similar and the transmission of both holes and electrons is required in both. In the n-channel HFET phototransistor, the optical mode will be guided by both sets of quantum wells; whereas, in the p-channel n-channel HFET phototransistor, the top quantum well will be removed so only the bottom quantum well will provide guidance of the optical mode. One difference is the polarity of voltage required for operation. The n-channel HFET phototransistor operates with a positive drain-source voltage so that the Source terminal electrode of the n-channel HFET phototransistor may be grounded and the light increases the channel current flowing from a positive circuit node to ground. In contrast, the p-channel HFET phototransistor operates with a negative drain-source voltage so that the Source terminal electrode of the p-channel HFET phototransistor may be electrically coupled to a positive supply voltage and the absorbed light increases the current flowing from the fixed positive rail voltage to a less positive circuit node. Because of this difference in reference voltages, the n-channel and p-channel HFET phototransistors are ideal for steering photocurrent either into or out of an intermediate circuit node which operates at voltages between the positive and negative supply voltages (such as the re-channel injector terminal or p-channel injector terminal of a thyristor as described herein). This is the configuration of the coherent balanced receiver.

The n-channel and p-channel HFET phototransistors have advantages over a simple diode detector. More specifically, a diode detector produces photocurrent characterized by low current (high resistance) and high capacitance. Therefore, a transimpedance amplifier is necessary to amplify the output of the diode detector in order to increase the bandwidth. However, the n-channel and p-channel HFET phototransistors have an internal transconductance ($g_m$=dV/dI) and hence produces voltage output directly without the need for a transimpedance amplifier.

Thyristor-Based Optoelectronic Oscillator

Figure 21A:
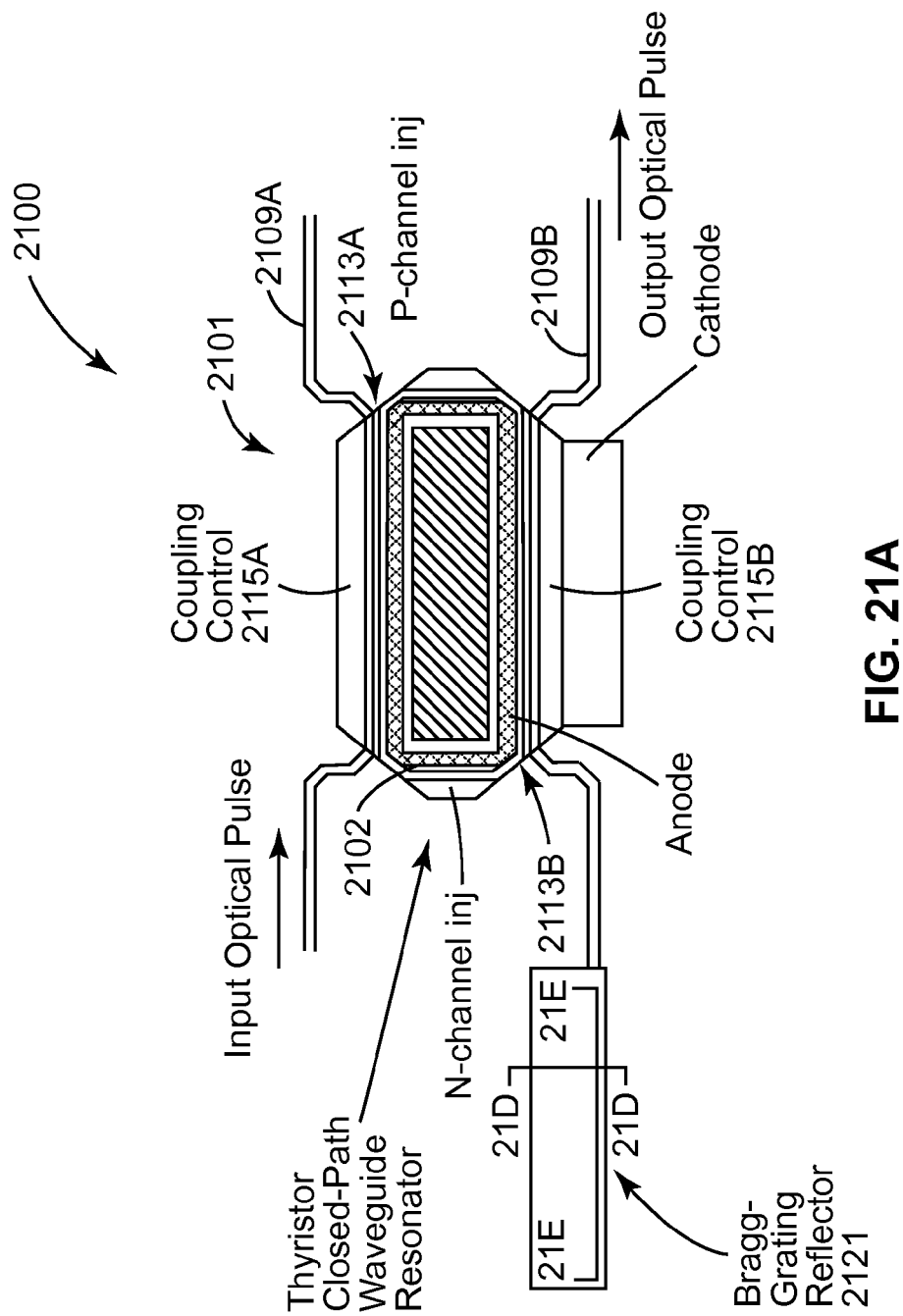
FIGS. 21A-21F are schematic illustrations of an exemplary embodiment of an optical thyristor and associated optoelectronic circuit elements that can be made utilizing the layer structure of FIG. 17 and configured for use as an optoelectronic oscillator.
Figure 21B:
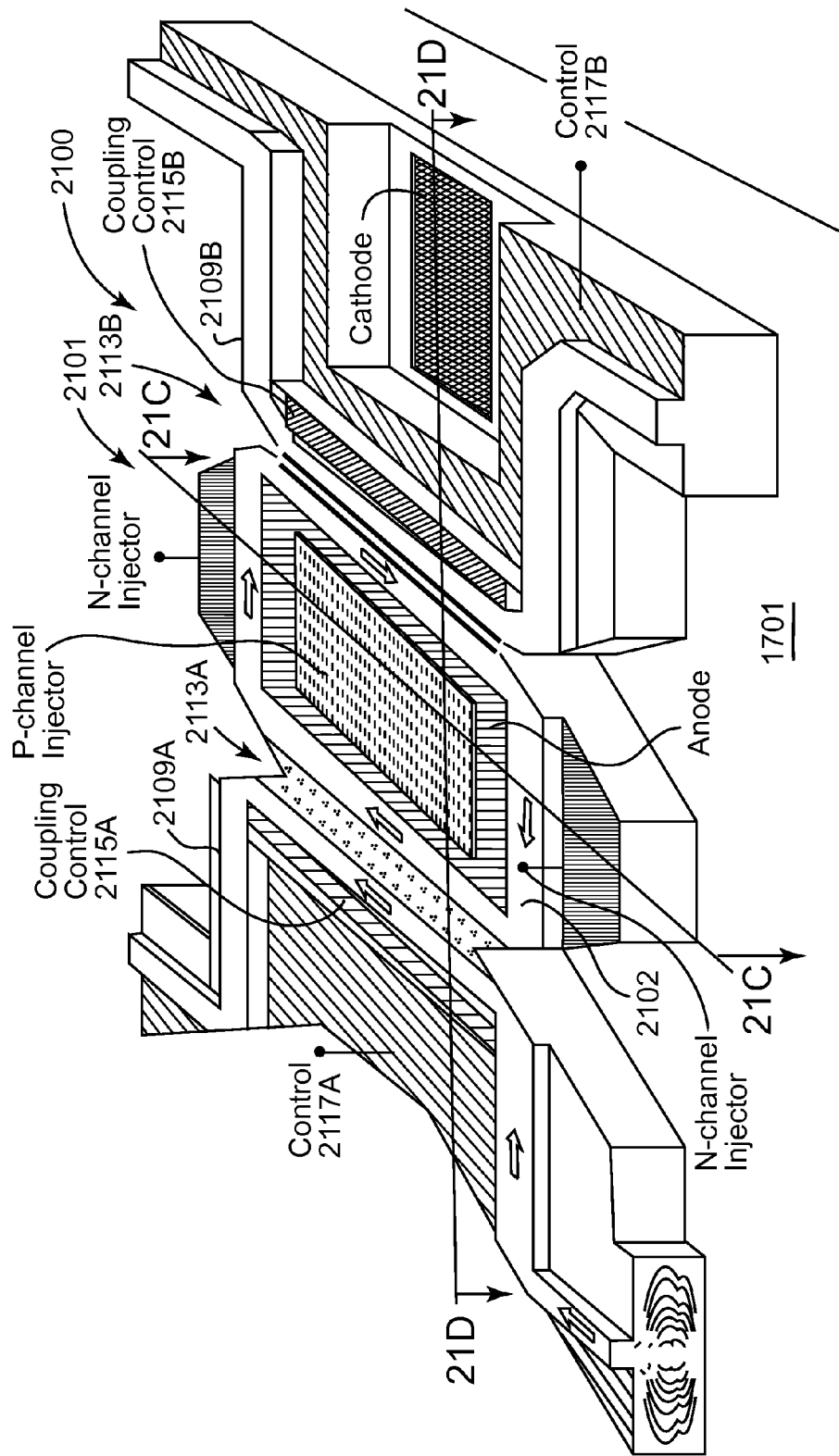

FIGS. 21A-21D show an embodiment of an optical thyristor 2100 formed from the epitaxial device structure of FIG. 17 that can be configured for use as the optoelectronic oscillator. The optical thyristor 2100 includes a thyristor closed-path waveguide resonator 2101 spaced from a section of a first zig-zag waveguide structure 2109A by a gap region 2113A as shown in FIGS. 21A and 21B. The first zig-zag waveguide structure 2109A is optically coupled to the resonator 2101 by evanescent-wave coupling over the gap region 2113A. The optical thyristor 2100 can also include an optional second zig-zag waveguide structure 2109B that is spaced from the thyristor closed-path waveguide resonator 2101 by a gap region 2113B. The second zig-zag waveguide structure 2109B is optically coupled to the resonator 2101 by evanescent-wave coupling over the gap region 2113B.

The resonator 2101 defines a resonant cavity waveguide 2102 that follows a closed path that is generally rectangular in shape. The optical path length of the resonant cavity waveguide 2102 is tuned to the particular wavelength of the optical mode signal that is to propagate in the resonant cavity waveguide 2102. Specifically, the length of the rectangular closed path of the resonant cavity waveguide 2102 is given as $2(L_1+L_2)$ and the $L_1$ and $L_2$ parameters are selected to conform to the following:

$$2(L_1 + L_2) = \frac{2\pi m \lambda_c}{n_{eff}} \quad (12)$$

where $L_1$ and $L_2$ are the effective lengths of the opposed sides of the active resonant cavity waveguide 2102;

m is an integer greater than zero;

$\lambda_C$ is the center wavelength of the optical mode that is to propagate in the resonant cavity waveguide 2102; and $n_{eff}$ is the effective refractive index of the resonant cavity waveguide 2102.

The width (W) of the resonant cavity waveguide 2102 can be less than 2 µm, and possibly 1 µm or less. The width of the gap region 2113A (i.e., the spacing between the resonant cavity waveguide 2102 and the zig-zag waveguide 2109A) can be less than 2 µm, and possibly on the order of 1 µm or less. The width of the gap region 2113B (i.e., the spacing between the resonant cavity waveguide 2102 and the zig-zag waveguide 2109B) can be less than 2 µm, and possibly on the order of 1 µm or less.

The optical mode circulates around the resonant cavity waveguide 2102 and is strongly confined within the resonant cavity waveguide 2102 by internal reflection at the reflective interfaces of the resonant cavity waveguide 2102. The zig-zag waveguide 2109A defines a passive rib waveguide that forms a zig-zag path. The optical mode is strongly confined within the zig-zag waveguide 2109A by internal reflection at the reflective interfaces of the zig-zag waveguide 2109A. The zig-zag waveguide 2109B defines a passive rib waveguide that forms a zig-zag path. The optical mode is strongly confined within the zig-zag waveguide 2109B by internal reflection at the reflective interfaces of the zig-zag waveguide 2109B.

The resonant cavity waveguide 2102 can be logically partitioned in four sections that are coupled to one another by corners as shown in FIG. 21A. The four sections include a straight section that extends parallel to and is closely-spaced from a straight section of the first zig-zag waveguide 2109A by the gap region 313A. This straight section is configured to provide evanescent coupling to (or from) the straight section of the zig-zag waveguide 2109A for the optical mode signal that circulates in the resonant cavity waveguide 2102. The opposed straight section is configured to provide evanescent coupling to (or from) the straight section of the zig-zag waveguide 2109B for the optical mode signal that circulates in the resonant cavity waveguide 2102. All four sections of the resonant cavity waveguide 2102 are configured as active portions that contribute to the detection (and possibly generation) of the optical mode signal that circulates in the resonant cavity waveguide 2102. Such active portions can be configured with mesas, contact implants and metallization for operation as a switching optical thyristor.

In this configuration, the mesas, contact implants and metallization provide electrical contact to the top p-type ohmic contact layer 1721 for the anode terminal electrode (or parts thereof) of the optical thyristor as well as electrical contact to the n-type modulation doped QW structure 1715 for an n-channel injector terminal electrode or parts thereof of the optical thyristor as well as electrical contact to the p-type modulation doped QW structure 1171 for a p-channel injector terminal electrode or parts thereof of the optical thyristor as well as electrical contact to the bottom n-type contact layer 1705 for a cathode terminal electrode or parts thereof of the optical thyristor.

The zig-zag waveguide 2109A that extends along the gap region 2113A can be configured with mesas, contact implants and metallization for electrical contact to top p-type ohmic contact layer 1721 for a first coupling control terminal electrode 2115A as well as electrical contact to the n-type modulation doped QW structure 1715 for a second control electrode 2117A that are used to control the coupling coefficient of the evanescent-wave coupling between the resonant cavity waveguide 2102 and the zig-zag waveguide 2109A. Bias circuitry (not shown) can be configured to control the coupling coefficient of the evanescent-wave coupling. Specifically, the coupling coefficient of the evanescent-wave coupling between two waveguides can be changed (i.e., modulated) by controlling the amount of charge (electrons) that fills the QW(s) of the n-type modulation doped QW structure 1715 for the straight section of the resonant cavity waveguide 2102 that extends along the gap region 2113A, which dictates the shifting of the absorption edge and index of refraction of the QW(s) of the n-type modulation doped QW structure 1715 for this straight section of the resonant cavity waveguide 2102. The bias circuitry can be realized by suitable transistor circuitry that can be integrally formed on the substrate of the integrated circuit.

The zig-zag waveguide 2109B that extends along the gap region 2113B can be configured with mesas, contact implants and metallization for electrical contact to top p-type ohmic contact layer 1721 for a first coupling control terminal electrode 2115B as well as electrical contact to the n-type modulation doped QW structure 1715 for a second control electrode 2117B (not shown in FIG. 21A) that are used to control the coupling coefficient of the evanescent-wave coupling between the resonant cavity waveguide 2102 and the zig-zag waveguide 2109B. Bias circuitry (not shown) can be configured to control the coupling coefficient of the evanescent-wave coupling. Specifically, the coupling coefficient of the evanescent-wave coupling between two waveguides can be changed (i.e., modulated) by controlling the amount of charge (electrons) that fills the QW(s) of the n-type modulation doped QW structure 1715 for the straight section of the resonant cavity waveguide 2102 that extends along the gap region 2113B, which dictates the shifting of the absorption edge and index of refraction of the QW(s) of the n-type modulation doped QW structure 1715 for this straight section of the resonant cavity waveguide 2102. The bias circuitry can be realized by suitable transistor circuitry that can be integrally formed on the substrate of the integrated circuit.

Figure 21C:
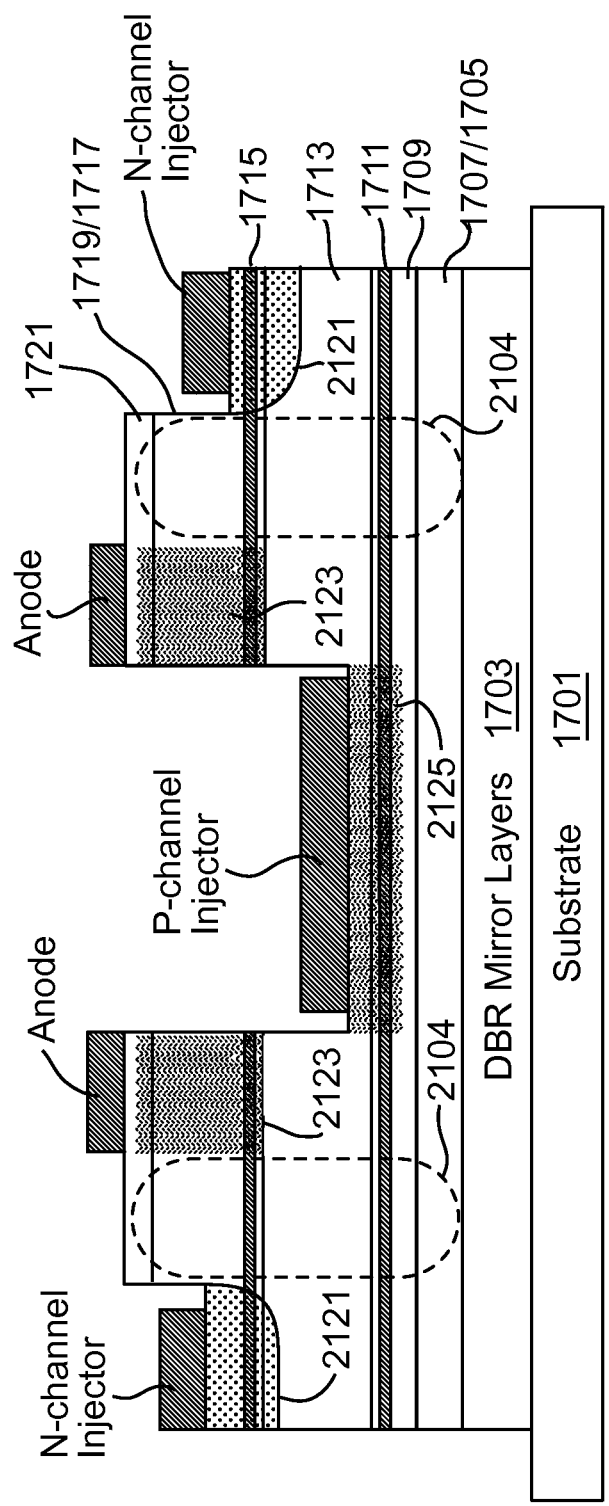

As shown in FIG. 21C, the optical mode signal 2104 that circulates around the waveguide 2102 is strongly confined within the waveguide 2102 by internal reflection at the reflective interfaces of the waveguide 2102. Specifically, cladding for guiding the optical mode 2104 in the waveguide 2102 can be provided by a top DBR mirror structure (not shown) and the bottom DBR mirror 1703. Lateral confinement of the optical mode 2104 in the waveguide 2102 can be provided by: i) a refractive index change at the sidewalls that define the outer boundary of the waveguide 2102, ii) a refractive index change at the periphery of n-type contact implant regions 2121 under the n-channel injector electrode parts located adjacent the sidewalls of the rib waveguide 2012, iii) a refractive index change at the periphery of the central implant region 2123 located under the top anode electrode, and v) a refractive index change at the interface of the top DBR mirror that covers the sidewalls of the waveguide. The p-channel injector is located in a central well that is surrounded by the anode terminal. The well is defined by a mesa in the spacer layer 1713 disposed above the p-type modulation doped QW structure 1711. P-type donor ions can be implanted through this mesas to form a p-type ion implant region 2125 that creates a self-aligned p-type contact to the p-type modulation doped quantum well structure 1711 of the active waveguide 2102.

Figure 21D:
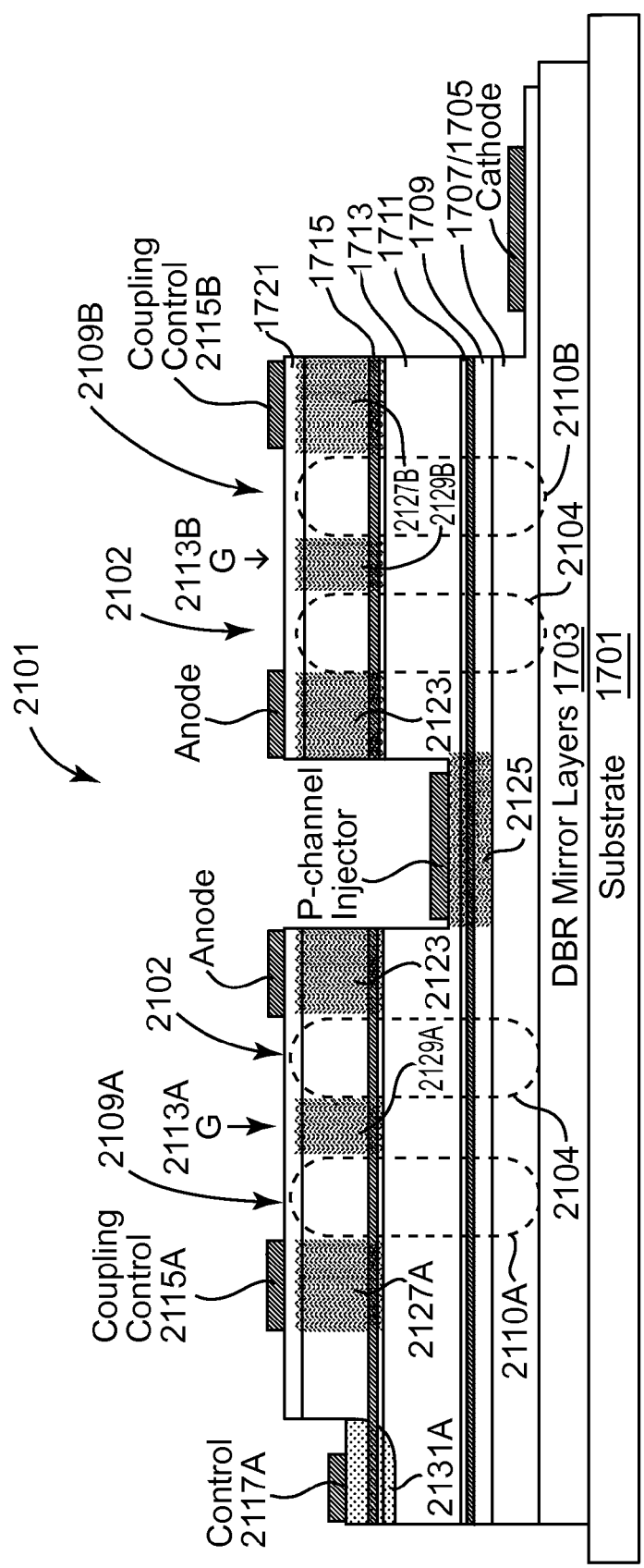

As shown in FIG. 21D, the optical mode 2110A that propagates through the zig-zag waveguide 2109A is strongly confined within the zig-waveguide 2109A by internal reflection at the reflective interfaces of the waveguide 2109A. Specifically, cladding for guiding the optical mode 2110A in the waveguide 2109A can be provided by the top DBR mirror structure (not shown) and the bottom DBR mirror 1703. Lateral confinement of the optical mode 2110A in the waveguide 2109A can be provided by i) a refractive index change at the sidewalls that define the outer boundary of the waveguide 2109A, ii) a refractive index change at n-type ion implant region 2131A that is disposed adjacent the top rib sidewalls of the waveguide 2109A (not shown), and iii) a refractive index change at the interface of the top mirror that covers the sidewalls of the waveguide 2109A. In the coupling region, the waveguide 2109A includes a section that extends parallel to and is closely-spaced from a straight section of the microresonator waveguide 2102 by the gap region 2113A. In this section of the waveguide 2109A, lateral confinement of the optical mode 2110A is provided by a refractive index change at the periphery of the implant region 2127A under the metal of the coupling control electrode 2115A as shown, and a refractive index change at the periphery of the implant region 2129A in the coupling region (gap 2113A) as evident from FIG. 18D. In the coupling section of the microresonator waveguide 2102, lateral confinement of the optical mode 2104 is further provided by a refractive index change at the periphery of the implant region 2129A in the coupling region (gap G—2113A) as evident from FIG. 18D. An n-type implant 2131A is disposed under the control electrode 2117A for contact to the n-type modulation-doped quantum well structure 1715 of the zig-zag waveguide 2109A.

As shown in FIG. 21D, the optical mode 2110B that propagates through the zig-zag waveguide 2109B is strongly confined within the zig-waveguide 2109B by internal reflection at the reflective interfaces of the waveguide 2109B. Specifically, cladding for guiding the optical mode 2110B in the waveguide 2109B can be provided by the top DBR mirror structure (not shown) and the bottom DBR mirror 1703. Lateral confinement of the optical mode 2110N in the waveguide 2109B can be provided by i) a refractive index change at the sidewalls that define the outer boundary of the waveguide 2109B, ii) a refractive index change at n-type ion implant region 2131B that is disposed adjacent the top rib sidewalls of the waveguide 2109A (not shown), and iii) a refractive index change at the interface of the top mirror that covers the sidewalls of the waveguide 2109A. In the coupling region, the waveguide 2109B includes a section that extends parallel to and is closely-spaced from a straight section of the microresonator waveguide 2102 by the gap region 2113B. In this section of the waveguide 2109B, lateral confinement of the optical mode 2110B is provided by a refractive index change at the periphery of the implant region 2127B under the metal of the coupling control electrode 2115B as shown, and a refractive index change at the periphery of the implant region 2129B in the coupling region (gap 2113B) as evident from FIG. 18D. In the coupling section of the microresonator waveguide 2102, lateral confinement of the optical mode 2104 is further provided by a refractive index change at the periphery of the implant region 2129B in the coupling region (gap G—2113B) as evident from FIG. 18D. An n-type implant 2131B is disposed under the control electrode 2117B for contact to the n-type modulation-doped quantum well structure 1715 of the zig-zag waveguide 2109B. The cathode terminal of the thyristor closed-path waveguide resonator 2101 is formed outside the resonator on a mesa located in the bottom n-type contact layer 1705 as shown.

For configuration as an optoelectronic oscillator, the thyristor closed-path waveguide resonator 2101 can be configured for digital optical-to-electrical conversion where the optical signal propagating in the waveguide 2102 generates photocurrent by absorption which adds electrons to the n-type modulation doped QW structure 1715 and holes to the p-type modulation doped QW structure 1711 such that the thyristor device switches ON and conducts current through the device between the anode terminal electrode and the cathode terminal electrode. Such optoelectronic operations provide the function of detection, current-to-voltage conversion (typically provided by a transimpedance amplifier), level shifting to obtain a ground reference and a decision circuit (typically realized by a comparator). Moreover, the thyristor closed-path waveguide resonator 2101 has an advantage that it will only absorb at the resonator frequency and thus can be adapted to support different wavelengths for wavelength division multiplexing applications. Moreover, the ON state current that flows between the anode terminal electrode and the cathode terminal electrode of the thyristor resonator is configured above the threshold for lasing $I_{TH}$, such that photon emission will occur within the device structure. In principle, the resonator produces light that propagates in both the clockwise and counterclockwise sense along the optical path of the resonant cavity waveguide 2102. Moreover, the evanescent coupling across the gap region 2113A between the resonant cavity waveguide 2102 and the zig-zag waveguide 1209A operates on both clockwise and counterclockwise light propagation within the resonant cavity waveguide 2102. Similarly, the evanescent coupling across the gap region 2113B between the resonant cavity waveguide 2102 and the zig-zag waveguide 1209B operates on both clockwise and counterclockwise light propagation within the resonant cavity waveguide 2102.

In this configuration, the input optical pulse can be supplied to one end of the zig-zag waveguide 2019A as shown in FIG. 21A such that it propagates through the straight section of the zig-zag waveguide 2019A adjacent the gap region 2113A, where it couples into the waveguide 2102 by evanescent coupling for propagation within the waveguide 2102 as shown by the arrows of FIG. 21B. The input pulse signal that propagates within the waveguide 2102 is then subject to digital optical-to-electrical conversion and pulse regeneration by the thyristor switch action as described herein.

Figure 21E:
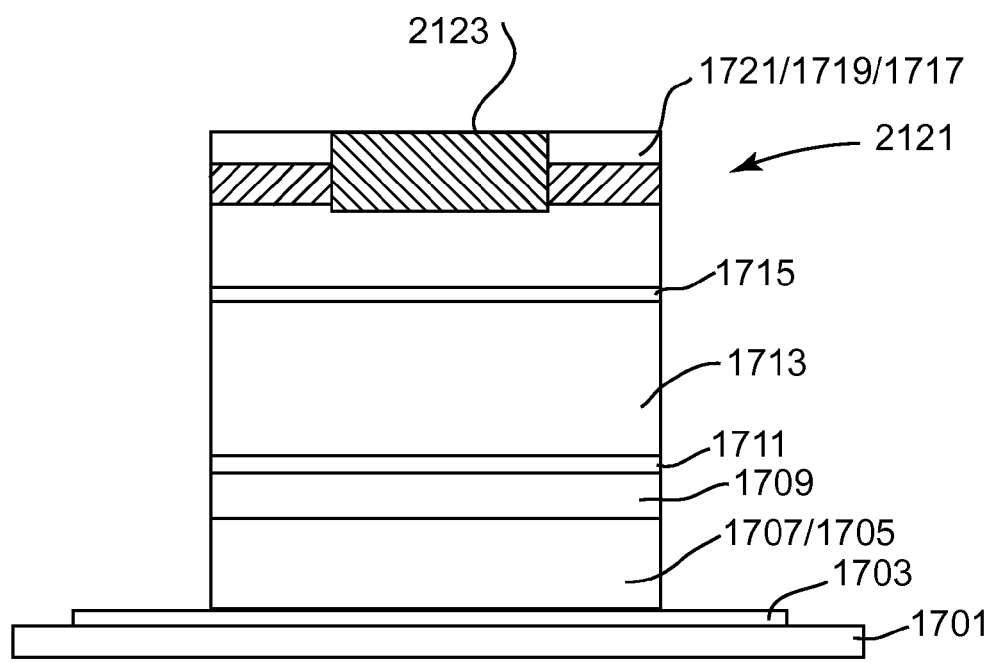
Figure 21F:
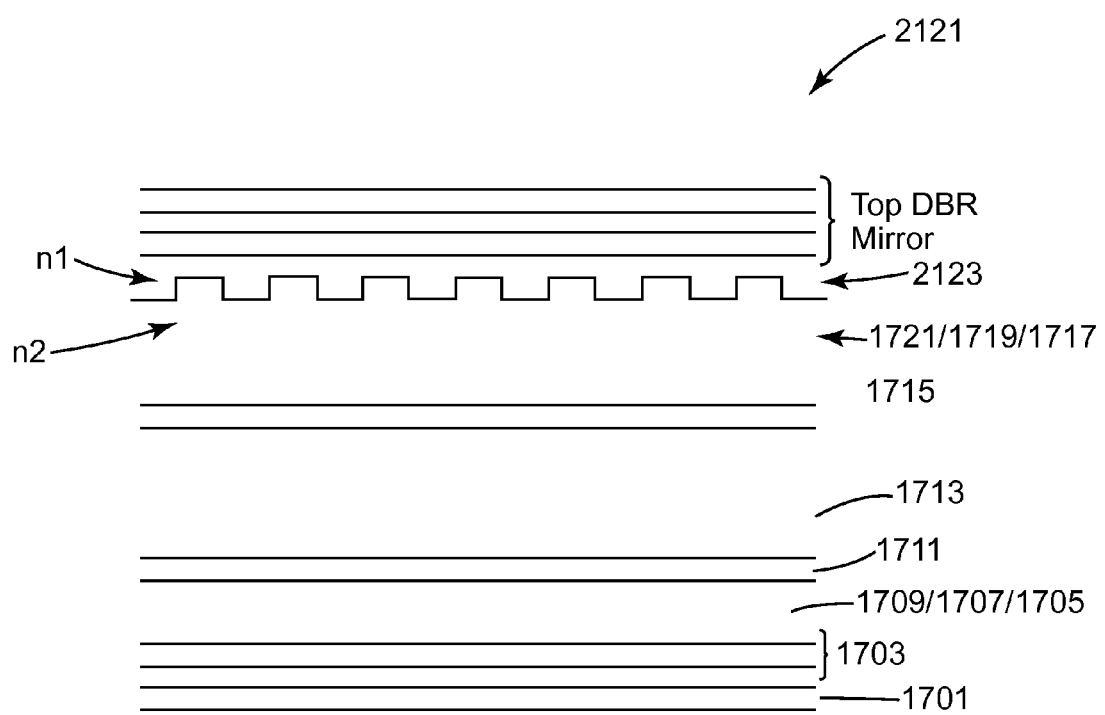

A bragg-grating reflector 2121 is optically coupled to the zig-zag waveguide structure 210B9 opposite its output end as shown in FIG. 21A. The bragg-grating reflector 212 is a linear active waveguide device formed as a light reflector that builds upon the multiple directions of light propagation in the resonant cavity waveguide 2102 of the resonator as well as the multiple directions of evanescent coupling provided between the zig-zag waveguide 2109B and the resonant cavity waveguide 2102 of the resonator. The bragg-grating reflector 2121 has Bragg grating 2123 (such as a first-order or third-order Bragg grating) defined throughout the length of the active waveguide device. The Bragg grating 2123 can be defined by etching into the top layers (such as layers 1721, 1719, 1717 of layer structure of FIG. 17) as best shown in FIGS. 21E and 21F. The Bragg grating 2123 operates to reflect any optical modes propagating in the zig-zag waveguide 2109B in the direction of the reflector 2121 where the wavelength of such optical modes coincides with the Bragg frequency of the Bragg grating 2123. All optical modes at other wavelengths will be passed through the tuning reflector 2121 or be absorbed. The Bragg grating 2123 can be configured such that the Bragg frequency of the Bragg grating 2123 closely matches the desired output wavelength for the resonator.

The pulse regeneration that results from the thyristor switching action of the resonator produces optical mode(s) that propagate clockwise within the resonant cavity waveguide 2102 of the resonant, which are coupled into the zig-zag waveguide 2109B to produce optical mode(s) that propagate in the zig-zag waveguide 2109B to the reflector 321. The incident optical mode(s) at wavelengths that coincide with the Bragg frequency of the Bragg grating 2123 of the reflector 2121 are reflected back and propagate in the reverse direction within the zig-zag waveguide 2109B where the mode is coupled into the resonator to produce optical mode(s) that propagates counter-clockwise in the resonant cavity waveguide 2102 of the resonator and generate more stimulated emission. This operation is repeated many times such that the wavelength of dominant optical mode that propagates in the resonant cavity waveguide 2102 of the resonator corresponds to the Bragg frequency of the Bragg grating 2123. Such dominant optical mode propagating counter-clockwise in the resonant cavity waveguide 2102 of the resonator is coupled to the zig-zag waveguide 2109B to produce the regenerated output optical pulse signal (which propagates in the direction away from the tuning reflector 2121 as shown in FIG. 21A). In this manner, optical modes that coincide with the Bragg frequency of the Bragg grating 2123 of the reflector 2121 make double passes through the resonant cavity waveguide 2102 of the resonator for improved stimulated emission. This operation is repeated such that the wavelength of the dominant or primary optical mode that propagates in the resonant cavity waveguide 2102 of the resonator corresponds to the Bragg frequency of the Bragg grating 2123. With this operation, the dominant or primary optical mode that propagates in the resonant cavity waveguide 2102 of the resonator is output from the zig-zag waveguide 2109B, while optical modes that do not coincide with the Bragg frequency of the Bragg grating 2123 are removed from the output pulse signal by the operation of the reflector 2121.

The Bragg grating 2123 functions as a narrow-band filter where the Bragg frequency of grating 2123 dictates the wavelength of the dominant or primary optical mode that propagates in the resonant cavity waveguide 2102 of the resonator. Such narrow-band filtering is useful for larger closed-loop resonators where the natural mode resonances are closely spaced from one another and thus do not provide a narrow wavelength band for the optical mode that propagates in the closed-loop resonator. It is also contemplated that the Bragg frequency of the Bragg grating 2123 can be electrically-controlled (or tuned) by controlled injection of charge that modifies the index of the region n2 of the Bragg grating 323 as described in U.S. patent application Ser. No. 14/222,841, filed on Mar. 24, 2014, commonly assigned to assignees of the present invention and herein incorporated by reference in its entirety.

It is also contemplated that the optical thyristor 2100 of FIGS. 21A-21C can readily be configured as an optical thyristor for other circuit functions described herein. In one example, the optical thyristor 2100 of FIGS. 21A-21C can be configured as part of the optical phase detector of FIGS. 3A, 10E, 10H, and 10I where the output optical signal that results from the switching action of the optical thyristor is output from output end of waveguide 2109B. In another example, the optical thyristor 2100 of FIGS. 21A-21C can be configured as part of the optical XOR gate of FIG. 8A where the output optical signal C that results from the switching action of the optical thyristor is output from output end of waveguide 2109B. In yet another example, the optical thyristor 2100 of FIGS. 21A-21C can be configured as part of the optical flip-flops of FIGS. 13A and 13B where the input optical signal ($D_A$ or $D_B$) are supplied to the one end of waveguide 2109A (similar to the input optical pulse in FIG. 21A), and the output optical signal ($Q_A$ or $Q_B$) that results from the switching action of the optical thyristor is output from output end of waveguide 2109B. In yet another example, the optical thyristor 2100 of FIGS. 21A-21C can be configured as part of the optical-input AND gate of FIG. 14A where the input optical signal $Q_A$ is supplied to the one end of waveguide 2109A (similar to the input optical pulse in FIG. 21A), and the input optical signal $Q_B$ is supplied to the other end of waveguide 2109A. In still another example, the optical thyristor 2100 of FIGS. 21A-21C can be configured as part of the optical charge pump of FIG. 15A where the input optical signal ($Q_A$ or $Q_B$) is supplied to the one end of waveguide 2109A (similar to the input optical pulse in FIG. 21A).

Polarization Diversity Systems

It is also common for PSK and QAM modulation schemes to be combined with polarization diversity where the modulated carrier wave signal employs light with orthogonal polarizations. In such systems, the coherent optical receiver designs as described herein can be replicated downstream of optical elements that split the received optical signal into multiple legs corresponding to the orthogonal polarizations and then processes each leg to isolate the optical signal of the corresponding polarization state for detection.

Wavelength Division Multiplexing (WDM) Systems

It is also common for PSK and QAM modulation schemes to be combined with wavelength division multiplexing where the modulated carrier wave signals can be defined by specific wavelengths of light. In such systems, the coherent optical receiver designs as described herein can be replicated downstream of optical elements that split the received optical signal into multiple legs corresponding to the specific light wavelengths and then processes each leg to isolate the optical signal of the corresponding wavelength for detection.

There have been described and illustrated herein several embodiments of a coherent optical receiver and parts thereof that can be used for a wide variety of communications and data processing applications. While particular embodiments of the invention have been described, it is not intended that the invention be limited thereto, as it is intended that the invention be as broad in scope as the art will allow and that the specification be read likewise. It will therefore be appreciated by those skilled in the art that yet other modifications could be made to the provided invention without deviating from its spirit and scope as claimed.

What is claimed is:

1. An optical AND gate comprising:
an optical thyristor defined by an epitaxial layer structure that includes a bottom n-type cathode region, an intermediate p-type region formed above the bottom n-type cathode region, an intermediate n-type region formed above the intermediate p-type region, and a top p-type anode region formed above the intermediate n-type region, wherein the optical thyristor includes an anode terminal electrically coupled to the top p-type anode region, an n-type injector terminal electrically coupled to the intermediate n-type region, a p-type injector terminal electrically coupled to the intermediate p-type region, and a cathode terminal electrically coupled to the bottom n-type cathode region, wherein the optical thyristor is configured to receive first and second digital optical signal inputs; and
a control circuitry operably coupled to the optical thyristor, the control circuitry comprising:
a p-channel HFET transistor having gate and source terminals connected to a positive voltage supply and a drain terminal connected to the n-type injector terminal; and
an n-channel HFET transistor having gate and source terminals connected to ground, and a drain terminal connected to the p-type injector terminal, wherein the control circuitry is configured to control switching operation of the optical thyristor in response to ON/OFF states of the first and second digital optical signal inputs such that the optical thyristor produces a digital output signal that represents an AND function of the first and second digital optical signal inputs.

2. The optical AND gate of claim 1, wherein the optical thyristor produces a digital electrical signal that represents the AND function of the first and second digital optical signal inputs.

3. The optical AND gate of claim 1, wherein the optical thyristor produces a digital optical signal that represents the AND function of the first and second digital optical signal inputs.

4. The optical AND gate of claim 3, wherein the intermediate n-type and intermediate p-type regions include an n-type modulation doped quantum well (QW) structure and a p-type modulation doped QW structure, respectively.

5. The optical AND gate of claim 4, wherein the n-channel HFET transistor includes an n-type QW channel formed by the n-type modulation doped QW structure.

6. The optical AND gate of claim 3, wherein the epitaxial layer structure comprises group III-V materials.

7. An AND gate comprising:
a thyristor defined by an epitaxial layer structure that includes a bottom n-type cathode region, an intermediate p-type region formed above the bottom n-type cathode region, an intermediate n-type region formed above the intermediate p-type region, and a top p-type anode region formed above the intermediate n-type region, wherein the thyristor includes an anode terminal electrically coupled to the top p-type anode region, an n-type injector terminal electrically coupled to the intermediate n-type region, a p-type injector terminal electrically coupled to the intermediate p-type region, and a cathode terminal electrically coupled to the bottom n-type cathode region; and
a control circuitry operably coupled to the thyristor, that receives first and second digital electrical signal inputs, the control circuitry comprising:
a first p-channel HFET transistor having a source terminal connected to a positive voltage supply, a gate terminal that receives the first digital electrical signal input, and a drain terminal connected to the n-type injector terminal;
a first n-channel HFET transistor having a source terminal connected to ground, a gate terminal that receives the first digital electrical signal input, and a drain terminal connected to the n-type injector terminal;
a second n-channel HFET transistor having a drain terminal connected to the positive voltage supply, a gate terminal that receives the second digital electrical signal input, and a source terminal connected to the p-type injector terminal; and
a second p-channel HFET transistor having a drain terminal connected to ground, a gate terminal that receives the second digital electrical signal input, and a source terminal connected to the p-type injector terminal, wherein the control circuitry is configured to control switching operation of the thyristor in response to levels of the first and second digital electrical signal inputs such that the thyristor produces a digital output signal that represents an AND function of the first and second digital electrical signal inputs.

8. The AND gate of claim 7, wherein the thyristor produces a digital electrical signal that represents the AND function of the first and second digital electrical signal inputs.

9. The AND gate of claim 7, wherein the thyristor produces a digital optical signal that represents the AND function of the first and second digital electrical signal inputs.

10. The AND gate of claim 7, wherein the intermediate n-type and intermediate p-type regions include an n-type modulation doped quantum well (QW) structure and a p-type modulation doped QW structure, respectively.

11. The AND gate of claim 10, wherein at least one of the first and second n-channel HFET transistors includes an n-type QW channel formed by the n-type modulation doped QW structure.

12. The AND gate of claim 7, wherein the epitaxial layer structure comprises group III-V materials.

* * * * *